United States Patent
Jo et al.

(10) Patent No.: US 12,077,646 B2
(45) Date of Patent: Sep. 3, 2024

(54) COATING SUBSTRATE BY POLYMERIZATION OF AMINE COMPOUND AND APPARATUS HAVING POLYMER COATED SUBSTRATE

(71) Applicant: Quantum MicroMaterials, Inc., Bellevue, WA (US)

(72) Inventors: Sung-Chan Jo, Seoul (KR); Kyonghoon Lee, Redmond, WA (US); John S. Althaus, Saline, MI (US); Hyung Jin Park, Goyang-si (KR)

(73) Assignee: Quantum MicroMaterials, Inc., Bellevue, WA (US)

( * ) Notice: Subject to any disclaimer, the term of this patent is extended or adjusted under 35 U.S.C. 154(b) by 0 days.

(21) Appl. No.: 17/380,931

(22) Filed: Jul. 20, 2021

(65) Prior Publication Data

US 2022/0145030 A1    May 12, 2022

Related U.S. Application Data

(63) Continuation-in-part of application No. PCT/KR2021/000805, filed on Jan. 20, 2021, and a
(Continued)

(30) Foreign Application Priority Data

Jan. 21, 2020 (KR) .................. 10-2020-0008102
Jan. 21, 2020 (KR) .................. 10-2020-0008103
(Continued)

(51) Int. Cl.
C08J 7/06     (2006.01)
C23C 16/02    (2006.01)
C23C 16/56    (2006.01)

(52) U.S. Cl.
CPC .............. C08J 7/06 (2013.01); C23C 16/02 (2013.01); C23C 16/56 (2013.01); *C08J 2379/00* (2013.01)

(58) Field of Classification Search
None
See application file for complete search history.

(56) References Cited

U.S. PATENT DOCUMENTS 5,543,493 A    8/1996  Park et al.
6,228,942 B1   5/2001  Michot et al.
(Continued)

FOREIGN PATENT DOCUMENTS

CN    105111478 A     12/2015
EP    0844028    *   5/1998
(Continued)

OTHER PUBLICATIONS

Abed et al. "Poly(4-Vinylpyridine) and Poly(4-Vinylpyridine Poly-3-Oxideethylene) as Corrosion Inhibitors for Cu60—Zn40 in 0.5M HNO3", Anti-Corrosion Methods and Materials (2001), 48(5), pp. 304-308.
(Continued)

*Primary Examiner* — Mandy C Louie
(74) *Attorney, Agent, or Firm* — K&L Gates LLP

(57) ABSTRACT

This application features a method of forming a polymer layer on the surface of a substrate using a self-initiating monomer. A polymer layer is formed by polymerization of a monomer on a metal layer to fill or cover defects of the metal layer. The metal layer the polymer layer may be used as an airtight material.

20 Claims, 8 Drawing Sheets

Related U.S. Application Data continuation-in-part of application No. PCT/KR2021/000804, filed on Jan. 20, 2021, and a continuation-in-part of application No. PCT/KR2021/000800, filed on Jan. 20, 2021, and a continuation-in-part of application No. PCT/KR2021/000798, filed on Jan. 20, 2021.

(30) Foreign Application Priority Data

| Date | Country | Number |
|---|---|---|
| Jan. 21, 2020 | (KR) | 10-2020-0008109 |
| Jan. 21, 2020 | (KR) | 10-2020-0008115 |
| May 6, 2021 | (KR) | 10-2021-0058555 |
| May 6, 2021 | (KR) | 10-2021-0058556 |

(56) References Cited

U.S. PATENT DOCUMENTS

| | | |
|---|---|---|
| 2008/0033106 A1 | 2/2008 | Koroskenyi et al. |
| 2016/0053055 A1* | 2/2016 | Hung ............ B32B 15/20 428/458 |

FOREIGN PATENT DOCUMENTS

| | | | |
|---|---|---|---|
| EP | 1122334 A1 | 1/2001 | |
| EP | 3450487 A1 | 3/2019 | |
| JP | 2683111 B2 | 11/1997 | |
| JP | 2700688 B2 | 1/1998 | |
| JP | 2000-126680 A | 5/2000 | |
| JP | 2002172734 * | 6/2002 | |
| JP | 2002172734 A | 6/2002 | |
| JP | 2004009599 * | 1/2004 | |
| JP | 2004009599 A | 1/2004 | |
| KR | 10-0191796 B1 | 6/1999 | |
| KR | 10-2002-0051401 A | 6/2002 | |
| KR | 100438320 B1 | 7/2004 | |
| KR | 10-2006-0091028 A | 8/2006 | |
| KR | 10-2006-0113910 A | 11/2006 | |
| KR | 10-2007-0030780 A | 3/2007 | |
| KR | 10-1831613 B1 | 2/2018 | |
| TW | 201326255 * | 7/2013 | |
| TW | 201326255 A | 7/2013 | |
| WO | WO-02/04552 A1 | 1/2002 | |
| WO | WO-2005-064993 A1 | 7/2005 | |
| WO | WO-2007091550 A1 * | 8/2007 | ............. B32B 15/08 |
| WO | 2018182525 A1 | 10/2018 | |
| WO | WO-2022157533 A1 | 7/2022 | |

OTHER PUBLICATIONS

Akkaş Kavakli et al., "Radiation Induced Emulsion Graft Polymerization of 4-Vinylpyridine onto PE/PP Nonwoven Fabric for As(V) Adsorption", Radiation Physics and Chemistry (2016), vol. 127, pp. 13-20.

Akkaş Kavakli et al., "Radiation-Induced Graft Polymerization of Glycidyl Methacrylate onto PE/PP Nonwoven Fabric and its Modification Toward Enhanced Amidoximation", Journal of Applied Polymer Science (2007), vol. 105, pp. 1551-1558.

Daniloska et al., "UV Light Induced Surface Modification of HDPE Films with Bioactive Compounds", Applied Surface Science (2010), 256(7), pp. 2276-2283.

Guo et al., "Surface Modification of Graphene Oxide by Pyridine Derivatives for Copper(II) Adsorption from Aqueous Solutions", Journal of Industrial and Engineering Chemistry (2017), vol. 53, pp. 325-332.

Lin et al., "DNA Attachment and Hybridization at the Silicon (100) Surface", Langmuir (2002), 18(3), pp. 788-796.

Onyon, P.F., "The Polymerization of 4-Vinyl Pyridine", Transactions of the Faraday Society (1955), vol. 51, pp. 400-412.

Raczkowska et al., "Temperature-Responsive Properties of Poly(4-Vinylpyridine) Coatings: Influence of Temperature on the Wettability, Morphology, and Protein Adsorption", RSC Advances (2016), 6(90), pp. 87469-87477.

Sun et al., "Surface Modification of Silicon Wafer by Grafting Zwitterionic Polymers to Improve its Antifouling Property", Applied Surface Science (2017), vol. 419, pp. 642-649.

Xia et al., "Atom Transfer Radical Polymerization of 4-Vinylpyridine", Macromolecules (1999), 32(10), pp. 3531-3533.

Yang et al., "Electroless Deposition of Copper on Polyimide Films Modified by Surface Graft Copolymerization with Nitrogen-Containing Vinyl Monomers", Colloid and Polymer Science (2001), 279(8), pp. 745-753.

Yu et al., "Electroless Plating of Copper via a Sn-Free Process on Dielectric SiLK Surface Modified by UV-Induced Graft Copolymerization with 4-Vinylpyridine and 1-Vinylimidazole", Journal of the Electrochemical Society (2002), 149(10), pp. C521-C528.

Written Opinion of corresponding PCT Application No. PCT/KR2021/000798 (Apr. 22, 2021).

Written Opinion of corresponding PCT Application No. PCT/KR2021/000800 (Apr. 22, 2021).

Written Opinion of corresponding PCT Application No. PCT/KR2021/000804 (Apr. 22, 2021).

Written Opinion of corresponding PCT Application No. PCT/KR2021/000805 (Apr. 22, 2021).

International Search Report of PCT/KR2021/000798—3 pages (Apr. 22, 2021).

International Search Report of PCT/KR2021/000800—34 pages (Apr. 22, 2021).

International Search Report of PCT/KR2021/000804—34 pages (Apr. 22, 2021).

International Search Report of PCT/KR2021/000805—35 pages (Apr. 22, 2021).

Dollinger, F. et al. Lamninated aluminum thin-films as low-cost opaque moisture ultra-bmriers for flexible organic electronic devices. Organic Electronics. 2017, vol. 46, pp. 242-246.

International Search Report dated Dec. 17, 2021 in International Patent Application No. PCT/IB2021/000475.

Luo et al., Flexible PET substrate coated with V2O5 film with porous network prepared by EPLSD method, Applied Surface Science, vol. 538, 2021.

Transparent Plastics Market by Type (Rigid, Flexible), Polymer Type (PET, PVC, PP, PS, PC, PMMA), Application (Packaging, Building & Construction, Electrical & Electronics, Automotive, Consumer Goods), and Region—Global Forecase to 2022, Markets and Markets, 2018, https://www.marketsandmarkets.com/Market-Reports/transparent-plastics-market-57341363.html.

Oh et al., Importance of pore size and Lewis acidity of Pt/Al2O3 for mitigating mass transfer limitation and catalyst fouling in triglyceride deoxygenation, Chemical Engineering Journal (2022), vol. 439.

Bjerke et al., Understanding wear and interaction between CVD α-$Al_2O_3$ coated tools, steel, and non-metallic inclusions in machining, Surface and Coatings Technology, vol. 450, 2022.

Bouzbib, M., Pogonyi, A., Kolonits, T. et al. Sol-gel alumina coating on quartz substrate for environmental protection. J Sol-Gel Sci Technol (2020) vol. 93, pp. 262-272.

Aitola et al., Encapsulation of commercial and emerging solar cells with focus on perovskite solar cells, Solar Energy (2022), vol. 237, pp. 264-283.

Peike et al. Overview of PV module encapsulation materials, Photovoltaics International (2013), vol. 19, pp. 85-92 https://www.researchgate.net/publication/256374925.

Shauna, #SunseapShares: The Anatomy of a Solar Panel, May 3, 2022, apac.edpr.com, https://apac.edpr.com/sg/blog/2022/sunseap-shares-the-anatomy-of-a-solar-panel.html.

Lewis, Material challenge for flexible organic devices, Materialstoday (2006), vol. 9, No. 4.

Bokov et al., Nanomaterial by Sol-Gel Method: Synthesis and Application, Advances in Materials Science and Engineering (2021), vol. 2021, 21 pages.

* cited by examiner

COATING SUBSTRATE BY POLYMERIZATION OF AMINE COMPOUND AND APPARATUS HAVING POLYMER COATED SUBSTRATE

BACKGROUND

Technical Field

The present invention relates to a technology of forming a polymer layer on a substrate by a polymerization reaction.

Background Art

Surface modification technology transforming the surface properties of substrates is needed in various application technology fields. However, chemical treatments to modify substrate surfaces are often limited by the properties of substrates. For example, in order to modify the surface by a nucleophilic reaction, the substrate need to contain plenty of nucleophilic reactive groups. Likewise, to modify the surface by an electrophilic reaction, the substrate need to contain plenty of electrophilic reactive groups. Otherwise, additional processes are necessary to introduce nucleophilic or electrophilic functional groups into the substrate, resulting in cost increase. Technologies capable of transforming surfaces of substrates with minimal process sophistication and cost increase are much needed in various fields.

SUMMARY

Various aspects of the invention are listed below in terms of embodiments.

Embodiment 1 provides a metal laminate device, which comprises comprising:
- a plastic film comprising at least one layer of a plastic material;
- a metal layer formed over the plastic film;
- a polymer layer formed on the metal layer, as a result of polymerization reactions on the metal layer rather than a result of coating of a pre-polymerized polymer composition on the metal layer;
- wherein the polymer layer comprises polymers derived from at least one monomer selected from the group consisting of compounds represented by any one of Chemical Formulae 1, 2, 3, 4, 5, 6, 7, 8, 9, 10 and 11 and Compound Nos. 204-248 listed below,
- wherein the polymer layer does not comprise a binder for attaching the polymer layer to the metal layer, wherein many of the polymers in the polymer layer are chemically bonded to the metal layer so that the polymer layer attaches to the metal layer in the absence of such a binder.

| Compound No. | Compound |
| --- | --- |
| 204 | 1,3-diaminobenzene |
| 205 | 1,4-diaminobenzene |
| 206 | 4-(prop-2-en-1-yl)-4H-1,2,4-triazol-3-amine |
| 207 | 5-amino-3-chloro-4-(prop-2-en-1-yl)-4H-1,2,4-triazole |
| 208 | 5-amino-3-hydroxy-4-(prop-2-en-1-yl)-4H-1,2,4-triazole |
| 209 | 5-amino-4-(prop-2-en-1-yl)-4H-1,2,4-triazole-3-carbonitrile |
| 210 | 5-amino-4-(prop-2-en-1-yl)-4H-1,2,4-triazole-3-thiol |
| 211 | 4-(prop-2-en-1-yl)-4H-1,2,4-triazol-3,5-diamine |
| 212 | 5-amino-4-(prop-2-en-1-yl)-4H-1,2,4-triazole-3-carbaldehyde |
| 213 | 5-amino-4-(prop-2-en-1-yl)-4H-1,2,4-triazole-3-carboxylic acid |
| 214 | 3-amido-5-amino-4-(prop-2-en-1-yl)-4H-1,2,4-triazole |
| 215 | 5-amino-3-methoxo-4-(prop-2-en-1-yl)-4H-1,2,4-triazole |
| 216 | 5-amino-3-methoxy-4-(prop-2-en-1-yl)-4H-1,2,4-triazole |
| 217 | 5-amino-3-nitro-4-(prop-2-en-1-yl)-4H-1,2,4-triazole |
| 218 | 7-iodopyrazolo[1,5-a]pyrazin-4-amine |
| 219 | 3-(3-iodo-1-methyl-1H-pyrazol-5-yl)pyrazin-2-amine |
| 220 | 5-(4-iodo-1H-pyrazol-1-yl)-1,3-thiazol-2-amine |
| 221 | 4-iodo-5-(pyridazin-3-yl)-1,2-oxazol-3-amine |
| 222 | 7-iodo-[1,2]oxazolo[4,5-b]pyridin-3-amine |
| 223 | 5-(5-iodo-1-methyl-1H-pyrazol-4-yl)-1,2-oxazol-3-amine |
| 224 | 9-aminospiro[4.5]dec-8-en-7-one |
| 225 | 2H,3H,4H,5H,6H,7H-furo[2,3-b]pyridin-3-one |
| 226 | 5-(aminomethyl)-3-chlorofuran |
| 227 | 5-(aminomethyl)-3-hydroxofuran |
| 228 | 5-(aminomethyl)-3-cyanofuran |
| 229 | 5-(aminomethyl)-3-sulfhydrofuran |
| 230 | 5-(aminomethyl)-3-aminofuran |
| 231 | 5-(aminomethyl)-3-formylfuran |
| 232 | 5-(aminomethyl)-3-carboxofuran |
| 233 | 5-(aminomethyl)-3-amidofuran |
| 234 | 5-(aminomethyl)-3-methoxofuran |
| 235 | 5-(aminomethyl)-3-methoxyfuran |
| 236 | 5-(aminomethyl)-3-nitrofuran |
| 237 | 1[4-(prop-2-en-1-yl)furan-2-yl]methanamine |
| 238 | 1[3-chloro-4-(prop-2-en-1-yl)furan-2-yl]methanamine |
| 239 | 1[3-hydroxo-4-(prop-2-en-1-yl)furan-2-yl]methanamine |
| 240 | 1[3-cyano-4-(prop-2-en-1-yl)furan-2-yl]methanamine |
| 241 | 1[3-sulfhydro-4-(prop-2-en-1-yl)furan-2-yl]methanamine |
| 242 | 1[3-amino-4-(prop-2-en-1-yl)furan-2-yl]methanamine |
| 243 | 1[3-formyl-4-(prop-2-en-1-yl)furan-2-yl]methanamine |
| 244 | 1[3-carboxo-4-(prop-2-en-1-yl)furan-2-yl]methanamine |
| 245 | 1[3-amido-4-(prop-2-en-1-yl)furan-2-yl]methanamine |
| 246 | 1[3-methoxo-4-(prop-2-en-1-yl)furan-2-yl]methanamine |
| 247 | 1[3-methoxy-4-(prop-2-en-1-yl)furan-2-yl]methanamine |
| 248 | 1[3-nitro-4-(prop-2-en-1-yl)furan-2-yl]methanamine |

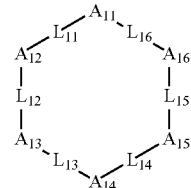

Chemical Formula 1

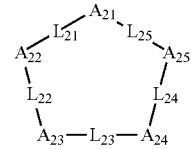

Chemical Formula 2

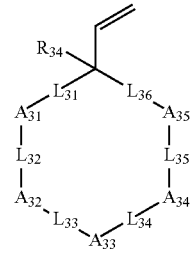

Chemical Formula 3

Chemical Formula 4

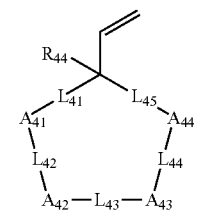

Chemical Formula 5

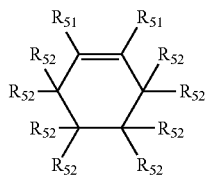

Chemical Formula 6

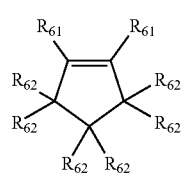

Chemical Formula 7

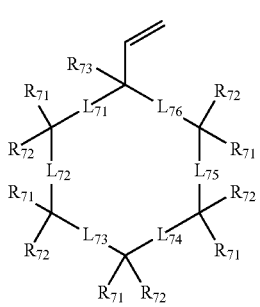

Chemical Formula 8

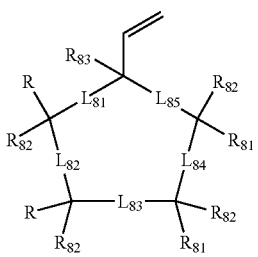

Chemical Formula 9

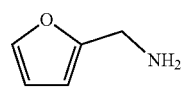

Chemical Formula 10

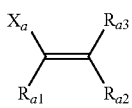

Chemical Formula 11

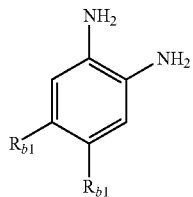

| Chemical Formula 1, | each of $L_{11}$ to $L_{16}$ is independently either a single bond or a double bond, at least one of $L_{11}$ to $L_{16}$ is a double bond, each of $A_{11}$ to $A_{16}$ is independently selected from the group consisting of —$C(R_{11}R_{12})$—, —$N(R_{13})$—, —O— and —S—, at least of one of $A_1$ to $A_6$ is selected from the group consisting of —$N(R_{13})$—, —O— and —S—, at least of one of $A_{11}$ to $A_{16}$ is $C(R_{11}R_{12})$, each of $R_{11}$ and $R_{12}$ is independently selected from the group consisting of H, $NH_2$, =NH, $C_1$-$C_6$ alkyl, $C_1$-$C_6$ alkoxy, halo-, CN, carboxyl, formyl, OH and SH, or forms a carbonyl or thiocarbonyl group with an adjacent carbon, $R_{13}$ is H or $NH_2$, with the proviso that (a) any of $L_{11}$-$L_{16}$ adjacent a double bond are single bonds, and any of $A_{11}$-$A_{16}$ connected by a double bond are not — —O— or —S—, (b) if any one of $A_{11}$-$A_{16}$ connected by a double bond is —$C(R_{11}R_{12})$— or —$N(R_{13})$, $R_{12}$ and $R_{13}$ are omitted, (c) at least one of $R_{11}$, $R_{12}$ and $R_{13}$ is $NH_2$, |
|---|---|
| Chemical Formula 2 | each of $L_{21}$ to $L_{25}$ is independently either a single bond or a double bond, at least one of $L_{21}$ to $L_{25}$ is a double bond, each of $A_{21}$ to $A_{25}$ is independently selected from the group consisting of —$C(R_{21}R_{22})$—, —$N(R_{23})$—, —O— and —S—, at least of one of $A_{21}$ to $A_{25}$ is selected from the group consisting of —$N(R_{23})$—, —O— and —S—, at least of one of $A_{21}$ to $A_{25}$ is $C(R_{21}R_{22})$, each of $R_{21}$ and $R_{22}$ is independently selected from the group consisting of H, $NH_2$, =NH, $C_1$-$C_6$ alkyl, $C_1$-$C_6$ alkoxy, halo-, CN, carboxyl, formyl, OH and SH, or forms a carbonyl or thiocarbonyl group with an adjacent carbon, $R_{23}$ is H or $NH_2$, with the proviso that (a) any of $L_{21}$-$L_{25}$ adjacent a double bond are single bonds, and any of $A_{21}$-$A_{25}$ connected by a double bond are not — —O— or —S—, (b) if any one of $A_{21}$-$A_{25}$ connected by a double bond is —$C(R_{21}R_{22})$— or —$N(R_{23})$, $R_{22}$ and $R_{23}$ are omitted; (c) at least one of $R_{21}$, $R_{22}$ and $R_{23}$ is $NH_2$ |

| | |
|---|---|
| Chemical Formula 3 | each of $L_{31}$ to $L_{36}$ is independently either a single bond or a double bond,<br>each of $A_{31}$ to $A_{35}$ is selected from the group consisting of $-C(R_{31}R_{32})-$, $-N(R_{33})-$, $-O-$ and $-S-$,<br>at least of one of $A_{31}$ to $A_{35}$ is selected from the group consisting of $-N(R_{33})-$, $-O-$ and $-S-$,<br>at least of one of $A_{31}$ to $A_{35}$ is $C(R_{31}R_{32})$,<br>each of $R_{31}$ and $R_{32}$ is independently selected from the group consisting of H, $NH_2$, $=NH$, $C_1$-$C_6$ alkyl, $C_1$-$C_6$ alkoxy, halo-, CN, carboxyl, formyl, OH and SH, or forms a carbonyl or thiocarbonyl group with an adjacent carbon,<br>$R_{33}$ is H or $NH_2$,<br>$R_{34}$ is H,<br>with the proviso that<br>(a) any of $L_{31}$ to $L_{36}$ adjacent a double bond are single bonds, and any of $A_{31}$ to $A_{35}$ connected by a double bond are not $-O-$ or $-S-$,<br>(b) if any one of $A_{31}$ to $A_{35}$ connected by a double bond is $-C(R_{31}R_{32})-$ or $-N(R_{33})$, $R_{32}$ and $R_{33}$ are omitted;<br>(c) if $L_{31}$ or $L_{36}$ is a double bond, $R_{34}$ is omitted |
| Chemical Formula 4 | each of $L_{41}$ to $L_{45}$ is independently either a single bond or a double bond,<br>each of $A_{41}$ to $A_{44}$ is selected from the group consisting of $-C(R_{41}R_{42})-$, $-N(R_{43})-$, $-O-$ and $-S-$,<br>at least of one of $A_{41}$ to $A_{44}$ is selected from the group consisting of $-N(R_{43})-$, $-O-$ and $-S-$,<br>at least of one of $A_{41}$ to $A_{44}$ is $C(R_{41}R_{42})$,<br>each of $R_{41}$ and $R_{42}$ is independently selected from the group consisting of H, $NH_2$, $=NH$, $C_1$-$C_6$ alkyl, $C_1$-$C_6$ alkoxy, halo-, CN, carboxyl, formyl, OH and SH, or forms a carbonyl or thiocarbonyl group with an adjacent carbon,<br>$R_{43}$ is H or $NH_2$,<br>$R_{44}$ is H,<br>with the proviso that<br>(a) any of $L_{41}$ to $L_{45}$ adjacent a double bond are single bonds, and any of $A_{41}$ to $A_{44}$ connected by a double bond are not $-O-$ or $-S-$,<br>(b) if any one of $A_{41}$ to $A_{44}$ connected by a double bond is $-C(R_{41}R_{42})-$ or $-N(R_{43})$, $R_{42}$ and $R_{43}$ are omitted;<br>(c) if $L_{41}$ or $L_{45}$ is a double bond, $R_{44}$ is omitted |
| Chemical Formula 5 | each $R_{51}$ is independently selected from the group consisting of H, $-NH_2$, halo, $C_1$-$C_6$ alkyl, C1-C6 alkoxy, CN, carboxyl, formyl, OH and SH,<br>each $R_{52}$ is independently selected from the group consisting of H, $-NH_2$, halo, $C_1$-$C_6$ alkyl, $C_1$-$C_6$ alkoxy, CN, carboxyl, formyl, OH, SH and $=NH$ or forms a carbonyl or thiocarbonyl group with an adjacent carbon to which it is connected,<br>with the proviso that<br>(a) at least one of $R_{51}$ and $R_{52}$ is NH2,<br>(b) if $R_{52}$ is $-NH_2$, halo, $C_1$-$C_6$ alkyl, $C_1$-$C_6$ alkoxy, CN, carboxyl, formyl, OH or SH, the other $R_{52}$ connected to the same carbon is H,<br>(c) if $R_{52}$ is $=NH$ or forms a carbonyl or thiocarbonyl group with an adjacent carbon, the other $R_{52}$ connected to the same carbon is omitted |
| Chemical Formula 6 | each $R_{61}$ is independently selected from the group consisting of H, $-NH_2$, halo, $C_1$-$C_6$ alkyl, C1-C6 alkoxy, CN, carboxyl, formyl, OH and SH,<br>each $R_{62}$ is independently selected from the group consisting of H, $-NH_2$, halo, $C_1$-$C_6$ alkyl, $C_1$-$C_6$ alkoxy, CN, carboxyl, formyl, OH, SH and $=NH$ or forms a carbonyl or thiocarbonyl group with an adjacent carbon,<br>with the proviso that<br>(a) at least one of $R_{61}$ and $R_{62}$ is $NH_2$,<br>(b) if $R_{62}$ is $-NH_2$, halo, $C_1$-$C_6$ alkyl, $C_1$-$C_6$ alkoxy, CN, carboxyl, formyl, OH or SH, the other $R_{62}$ connected to the same carbon is H,<br>(c) if $R_{62}$ is $=NH$ or forms a carbonyl or thiocarbonyl group with an adjacent carbon, the other $R_{62}$ connected to the same carbon is omitted, |
| Chemical Formula 7 | each of $L_{71}$ to $L_{76}$ is independently a single or double bond, $L_{71}$ to $L_{76}$ have total 0-2 double bonds,<br>each $R_{71}$ and $R_{72}$ is selected from the group consisting of H, $-NH_2$, $=NH$, $C_1$-$C_6$ alkyl, $C_1$-$C_6$ alkoxy, halo, CN, carboxyl, formyl, OH and SH or forms a carbonyl or thiocarbonyl group with an adjacent carbon,<br>$R_{73}$ is selected from the group consisting of H, $-NH_2$, $C_1$-$C_6$ alkyl, $C_1$-$C_6$ alkoxy, halo, CN, carboxyl, formyl, $-OH$ and $-SH$,<br>with the proviso that<br>(a) any of $L_{71}$-$L_{76}$ adjacent a double bond are single bonds,<br>(b) $R_{72}$ connected to a carbon that forms a double bond among $L_{71}$ to $L_{76}$ is omitted,<br>(c) if $L_{71}$ or $L_{76}$ is a double bond, $R_{72}$ is omitted,<br>(d) if either of $R_{71}$ and $R_{72}$ is $=NH$ or forms a carbonyl or thiocarbonyl group with an adjacent carbon, then the other of $R_{71}$ and $R_{72}$ is omitted,<br>(e) at least one of $R_{71}$ to $R_{73}$ is $-NH_2$, |
| Chemical Formula 8 | each of $L_{81}$ to $L_{85}$ is independently a single or double bond, $L_{81}$ to $L_{85}$ have total 0 or 1 double bond,<br>each of $R_{81}$ and $R_{82}$ is independently selected from the group consisting of H, $-NH_2$, $=NH$, $C_1$-$C_6$ alkyl, $C_1$-$C_6$ alkoxy, halo, CN, carboxyl, formyl, OH and SH or forms a carbonyl or thiocarbonyl group with an adjacent carbon, |

-continued

| | |
|---|---|
| | $R_{83}$ is selected from the group consisting of H, —$NH_2$, $C_1$-$C_6$ alkyl, $C_1$-$C_6$ alkoxy, halo, CN, carboxyl, formyl, —OH and —SH, with the proviso that (a) any of $L_{81}$-$L_{85}$ adjacent a double bond are single bonds, (b) $R_{82}$ connected to a carbon that forms a double bond among $L_{81}$ to $L_{85}$ is omitted, (c) if $L_{81}$ or $L_{85}$ is a double bond, $R_{83}$ is omitted, (d) if either of $R_{81}$ and $R_{82}$ is =NH or forms a carbonyl or thiocarbonyl group with an adjacent carbon, then the other of $R_{81}$ and $R_{82}$ is omitted, (e) at least one of $R_{81}$ to $R_{83}$ is —$NH_2$, |
| Chemical Formula 10 | $X_a$ is —$NH_2$, —N=CH—OH, or —N=O, Ra1 is hydrogen, $C_1$-$C_6$ lkyl, or —CN, Ra2 and Ra3 is independently selected from the group consisting of hydrogen, $C_1$-$C_6$ alkyl, —CN, —OH, —$NH_2$, —NH—OH, —C(O)$R_{a4}$, and —C(O)O$R_{a5}$ ($R_{a4}$ and $R_{a5}$ is hydrogen or $C_1$-$C_6$ alkyl), |
| Chemical Formula 11 | $R_{b1}$ is selected from the group consisting of H, $NH_2$, and NH— acyl. |

Embodiment 2 provides a method of making a metal laminate device. The method comprises:
providing an intermediate device comprising a plastic film and a metal layer formed over the plastic film; and
causing a polymerization reaction to take place on the metal layer of the intermediate device to form a polymer layer, wherein the metal laminate device comprising the plastic film, the metal layer formed over the plastic film, and the polymer layer formed on the metal layer, wherein the polymerization reaction involves a polymerization reaction composition comprising at least one monomer selected from the group consisting of compounds represented by any one of Chemical Formulae 1, 2, 3, 4, 5, 6, 7, 8, 9, 10 and 11 and Compound Nos. 204-248 defined in Embodiment 1,
wherein the polymerization reaction composition does not comprise a binder such that the polymer layer formed from the polymerization reaction does not comprise a binder.

Embodiment 3 provides the method according to Embodiment 2, wherein the polymerization reaction composition comprises none of a surfactant, a polymerization initiator and a polymerization inhibitor.

Embodiment 4 provides the method according to Embodiment 2, wherein providing the intermediate device comprises:
providing the plastic film and the metal layer;
laminating the plastic film and the metal layer with an adhesive material applied between the plastic film and the metal layer to provide the adhesive layer interposed between the plastic film and the metal layer.

Embodiment 5 provides the method according to Embodiment 2, wherein providing the intermediate device comprises:
providing the plastic film; and
conducting a vapor deposition of a metal to form the metal layer on the plastic film.

Embodiment 6 provides the method according to Embodiment 2, wherein providing the intermediate device further comprises subjecting a surface of the plastic film to a plasma treatment before conducting the vapor deposition, wherein the vapor deposition of the metal is performed on the surface of the plastic film.

Embodiment 7 provides the method according to Embodiment 2, wherein causing the polymerization reaction comprises causing the metal layer of the intermediate device to contact the polymerization reaction composition.

Embodiment 8 provides a flexible laminate device, which comprises:
a plurality of metal laminate devices comprising a first metal laminate device and a second metal laminate device; and
an adhesive layer interposed between the first and second metal laminate devices and integrating the first and second metal laminate devices, wherein each of the first and second metal laminate devices comprises:
a plastic film comprising at least one layer of a plastic material;
a metal layer formed over the plastic film;
a polymer layer formed on the metal layer, as a result of polymerization reactions on the metal layer rather than a result of coating of a pre-polymerized polymer composition on the metal layer;
wherein the polymer layer comprises polymers derived from at least one monomer selected from the group consisting of compounds represented by any one of Chemical Formulae 1, 2, 3, 4, 5, 6, 7, 8, 9, 10 and 11 and Compound Nos. 204-248 defined in Embodiment 1,
wherein the polymer layer does not comprise a binder for attaching the polymer layer to the metal layer, wherein many of the polymers in the polymer layer are chemically bonded to the metal layer so that the polymer layer attaches to the metal layer in the absence of such a binder.

Embodiment 9 provides a method of making a flexible laminate device. The method comprising:
providing a first metal laminate device and a second metal laminate device, each of which comprises:
a plastic film comprising at least one layer of a plastic material;
a metal layer formed over the plastic film;
a polymer layer formed on the metal layer, as a result of polymerization reactions on the metal layer rather than a result of coating of a pre-polymerized polymer composition on the metal layer;
wherein the polymer layer comprises polymers derived from at least one monomer selected from the group consisting of compounds represented by any one of Chemical Formulae 1, 2, 3, 4, 5, 6, 7, 8, 9, 10 and 11 and Compound Nos. 204-248 defined in Embodiment 1,
wherein the polymer layer does not comprise a binder for attaching the polymer layer to the metal layer, wherein many of the polymers in the polymer layer are chemically bonded to the metal layer so that the polymer layer attaches to the metal layer in the absence of such a binder; and laminating the first and second metal laminate devices with an adhesive material applied therebetween to form an adhesive layer interposed between the first and second metal laminate devices for integrating the first and second metal laminate devices.

Embodiment 10 provides an information display device, which comprises:
- a display panel comprising a substrate and a display array, wherein the substrate comprises a front surface and a rear surface, wherein the display array is disposed over the rear surface of the substrate and integrated with the substrate with or without an intervening element between the rear surface and the display array;
- a flexible laminate device placed over the display array and the rear surface of the substrate such that the flexible laminate device and the substrate together enclose the display array therebetween, wherein the laminate device and the substrate are air-tightly connected together such that the display array is air-tightly encapsulated between the substrate and the flexible encapsulation device, wherein the flexible laminate device comprises:
- a plurality of metal laminate devices comprising a first metal laminate device and a second metal laminate device; and
- an adhesive layer interposed between the first and second metal laminate devices and integrating the first and second metal laminate devices, wherein each of the first and second metal laminate devices comprises:
- a plastic film comprising at least one layer of a plastic material;
- a metal layer formed over the plastic film;
- a polymer layer formed on the metal layer, as a result of polymerization reactions on the metal layer rather than a result of coating of a pre-polymerized polymer composition on the metal layer;

wherein the polymer layer comprises polymers derived from at least one monomer selected from the group consisting of compounds represented by any one of Chemical Formulae 1, 2, 3, 4, 5, 6, 7, 8, 9, 10 and 11 and Compound Nos. 204-248 defined in Embodiment 1, wherein the polymer layer does not comprise a binder for attaching the polymer layer to the metal layer, wherein many of the polymers in the polymer layer are chemically bonded to the metal layer so that the polymer layer attaches to the metal layer in the absence of such a binder.

Embodiment 11 provides the information display device according to Embodiment 10, wherein the plurality of metal laminates further comprises a third metal laminate, wherein the adhesive layer is referred to as a first adhesive layer, wherein the device further comprises a second adhesive layer interposed between the second metal laminate and the third metal laminate for integrating the second and third metal laminates.

Embodiment 12 provides the information display device according to Embodiment 10, wherein the display array is air-tightly encapsulated at a water vapor transmission rate between about $1 \times 10^{-8}$ and about $1 \times 10^{-6}$ g/m$^2$/day.

Embodiment 13 provides a method of making an information display device. The method comprising:
- providing a display panel which comprises a substrate and a display array, wherein the substrate comprises a front surface and a rear surface, wherein the display array is disposed over the rear surface of the substrate and integrated with the substrate with or without an intervening element between the rear surface and the display array;
- providing a flexible laminate device comprising a first surface and a second surface facing away from the first surface;
- placing the flexible laminate device over the display array and the rear surface of the substrate such that the first surface faces the substrate and the second surface faces away from the substrate; and
- air-tightly sealing edges of the flexible laminate device with corresponding portions of the display panel such that the display array is air-tightly encapsulated between the substrate and the flexible laminate device, wherein the flexible laminate device comprises:
- a plurality of metal laminate devices comprising a first metal laminate device and a second metal laminate device; and
- an adhesive layer interposed between the first and second metal laminate devices and integrating the first and second metal laminate devices, wherein each of the first and second metal laminate devices comprises:
- a plastic film comprising at least one layer of a plastic material;
- a metal layer formed over the plastic film;
- a polymer layer formed on the metal layer, as a result of polymerization reactions on the metal layer rather than a result of coating of a pre-polymerized polymer composition on the metal layer;

wherein the polymer layer comprises polymers derived from at least one monomer selected from the group consisting of compounds represented by any one of Chemical Formulae 1, 2, 3, 4, 5, 6, 7, 8, 9, 10 and 11 and Compound Nos. 204-248 defined in Embodiment 1, wherein the polymer layer does not comprise a binder for attaching the polymer layer to the metal layer, wherein many of the polymers in the polymer layer are chemically bonded to the metal layer so that the polymer layer attaches to the metal layer in the absence of such a binder.

Embodiment 14 provides a packaging plastic sheet comprising:
- a plastic film comprising at least one layer of a plastic material;
- a metal layer formed on the plastic film by vapor deposition of a metal;
- a polymer layer formed on the metal layer, as a result of polymerization reactions on the metal layer rather than a result of coating of a pre-polymerized polymer composition on the metal layer;

wherein the polymer layer comprises polymers and oligomers derived from at least one monomer selected from the group consisting of compounds represented by any one of Chemical Formulae 1, 2, 3, 4, 5, 6, 7, 8, 9, 10 and 11 and Compound Nos. 204-248 defined in Embodiment 1, wherein the metal layer comprises a defective space extending through a thickness of the metal layer, wherein the defective space is at least in part filled with at least one of the polymers and oligomers derived from the at least one monomer.

Embodiment 15 provides the packaging plastic sheet according to Embodiment 14, wherein the packaging plastic sheet has a water vapor transmission rate is between about $1 \times 10^{-6}$ and about $1 \times 10^{-4}$ g/m$^2$/day.

Embodiment 16 provides a method of air-tightly packaging an object. The method comprises:
  providing a packaging plastic bag with an opening;
  placing an object inside the packaging plastic bag via the opening; and
  air-tightly sealing the opening to provide an air-tight package enclosing the object,
  wherein the packaging plastic bag comprises:
  a plastic film comprising at least one layer of a plastic material;
  a metal layer formed on the plastic film by vapor deposition of a metal;
  a polymer layer formed on the metal layer, as a result of polymerization reactions on the metal layer rather than a result of coating of a pre-polymerized polymer composition on the metal layer;
  wherein the polymer layer comprises polymers and oligomers derived from at least one monomer selected from the group consisting of compounds represented by any one of Chemical Formulae 1, 2, 3, 4, 5, 6, 7, 8, 9, 10 and 11 and Compound Nos. 204-248 defined in Embodiment 1,
  wherein the metal layer comprises a defective space extending through a thickness of the metal layer, wherein the defective space is at least in part filled with at least one of the polymers and oligomers derived from the at least one monomer.

Embodiment 17 provides the method according to Embodiment 16, wherein the air-tight package has a water vapor transmission rate sheet is between about $1 \times 10^{-6}$ and about $1 \times 10^{-4}$ g/m$^2$/day.

Embodiment 18 provides the method or device according to any one of Embodiments 1-17, wherein the metal layer comprises a metal foil, wherein the metal laminate device further comprises an adhesive layer between the metal layer and the plastic film.

Embodiment 19 provides the method or device according to any one of Embodiments 1-17, wherein the metal layer comprises a metal foil having a thickness in a range between about 5 μm and about 200 μm, wherein the metal laminate device further comprises an adhesive layer between the metal layer and the plastic film.

Embodiment 20 provides the method or device according to any one of Embodiments 1-17, wherein the metal layer comprises a metal deposit formed on the plastic film, wherein no distinct layer is interposed between the metal layer and the plastic film.

Embodiment 21 provides the method or device according to any one of Embodiments 1-17, wherein the metal layer comprises a metal deposit formed on the plastic film and has a thickness in a range between about 1 nm and about 50 nm, wherein no distinct layer is interposed between the metal layer and the plastic film.

Embodiment 22 provides the method or device according to any one of Embodiments 1-17, wherein the polymer layer, as a result of polymerization reactions on the metal layer, comprises at least one selected from the group consisting of oligomers, tetramers, trimers, and dimers derived from the at least one monomer in a substantial amount that a commercially available polymer composition of the polymer having a specific range of polymer molecular weights would not contain.

Embodiment 23 provides the method or device according to any one of Embodiments 1-17, wherein the polymer layer, as a result of polymerization reactions on the metal layer, comprises at least one selected from the group consisting of oligomers, tetramers, trimers, and dimers chemically boned to the metal layer that would not occur when coating a pre-polymerized polymer composition on the metal layer.

Embodiment 24 provides the method or device according to any one of Embodiments 1-17, wherein the metal layer comprises a pinhole extending through a thickness of the metal layer, wherein at least one of an oligomer and a polymer occupies at least part of a space of the pinhole and is chemically bonded to an interior surface of the pinhole that would not occur when coating a pre-polymerized polymer composition on the metal layer.

Embodiment 25 provides the method or device according to any one of Embodiments 1-17, wherein the polymer layer, not as a result of coating of a pre-polymerized polymer composition on the metal layer, does not comprise a polymerization inhibitor that a commercially available polymer composition of a polymer having a specific range of molecular weights would contain to inhibit additional polymerization reactions or cross-linking reactions in the polymer composition.

Embodiment 26 provides the method or device according to any one of Embodiments 1-17, wherein the polymer layer does not comprise a surfactant that would be included in the polymer layer, if the polymer layer is formed by coating of a pre-polymerized polymer, for evenly coating the pre-polymerized polymer on the metal layer.

Embodiment 27 provides the method or device according to any one of Embodiments 1-17, wherein the polymer layer does not comprise a surfactant, a polymerization initiator or a polymerization inhibitor.

Embodiment 28 provides the method or device according to any one of Embodiments 1-17, wherein the polymer layer, as a result of polymerization reactions on the metal layer, comprises at least one selected from the group consisting of oligomers, tetramers, trimers, and dimers derived from the at least one monomer in a substantial amount that a commercially available polymer composition of the polymer having a specific range of polymer molecular weights would not contain, wherein the polymer layer, as a result of polymerization reactions on the metal layer, comprises at least one selected from the group consisting of oligomers, tetramers, trimers, and dimers chemically boned to the metal layer that would not occur when coating a pre-polymerized polymer composition on the metal layer, wherein the metal layer comprises a pinhole extending through a thickness of the metal layer, wherein at least one of an oligomer and a polymer occupies at least part of a space of the pinhole and is chemically bonded to an interior surface of the pinhole that would not occur when coating a pre-polymerized polymer composition on the metal layer, wherein the polymer layer does not comprise a surfactant, a polymerization initiator or a polymerization inhibitor.

Embodiment 29 provides the method or device according to any one of Embodiments 1-17, wherein the metal layer comprises a metal foil, wherein the metal laminate device further comprises an adhesive layer between the metal layer and the plastic film, wherein the polymer layer, as a result of polymerization reactions on the metal layer, comprises at least one selected from the group consisting of oligomers, tetramers, trimers, and dimers derived from the at least one monomer in a substantial amount that a commercially available polymer composition of the polymer having a specific range of polymer molecular weights would not contain, wherein the polymer layer, as a result of polymerization reactions on the metal layer, comprises at least one selected from the group consisting of oligomers, tetramers, trimers, and dimers chemically boned to the metal layer that would not occur when coating a pre-polymerized polymer composition on the metal layer, wherein the metal layer comprises a pinhole extending through a thickness of the metal layer, wherein at least one of an oligomer and a polymer occupies at least part of a space of the pinhole and is chemically bonded to an interior surface of the pinhole that would not occur when coating a pre-polymerized polymer composition on the metal layer, wherein the polymer layer does not comprise a surfactant, a polymerization initiator or a polymerization inhibitor.

Embodiment 30 provides the method or device according to any one of Embodiments 1-17, wherein the metal layer comprises a metal deposit formed on the plastic film, wherein no distinct layer is interposed between the metal layer and the plastic film, wherein the polymer layer, as a result of polymerization reactions on the metal layer, comprises at least one selected from the group consisting of oligomers, tetramers, trimers, and dimers derived from the at least one monomer in a substantial amount that a commercially available polymer composition of the polymer having a specific range of polymer molecular weights would not contain, wherein the polymer layer, as a result of polymerization reactions on the metal layer, comprises at least one selected from the group consisting of oligomers, tetramers, trimers, and dimers chemically boned to the metal layer that would not occur when coating a pre-polymerized polymer composition on the metal layer, wherein the metal layer comprises a pinhole extending through a thickness of the metal layer, wherein at least one of an oligomer and a polymer occupies at least part of a space of the pinhole and is chemically bonded to an interior surface of the pinhole that would not occur when coating a pre-polymerized polymer composition on the metal layer, wherein the polymer layer does not comprise a surfactant, a polymerization initiator or a polymerization inhibitor.

Embodiment 31 provides the method or device according to any one of Embodiments 1-17, wherein the polymer layer is referred to as a first polymer layer, wherein the metal laminate device further comprises a second polymer layer formed underneath the plastic film such that the plastic film is interposed between the second polymer layer and the metal layer, wherein the second polymer layer comprises polymers derived from the at least one monomer as a result of polymerization reactions on the plastic film rather than a result of coating a pre-polymerized polymer composition on the plastic film, wherein the second polymer layer does not comprise a binder for attaching the second polymer layer to the plastic film.

Embodiment 32 provides the method or device according to Embodiment 31, wherein the first polymer layer has a thickness in a range between about 1 µm and about 20 µm.

Embodiment 33 provides the method or device according to Embodiment 31, wherein the first polymer layer, as a result of polymerization reactions on the metal layer, comprises at least one selected from the group consisting of oligomers, tetramers, trimers, and dimers derived from the at least one monomer in a substantial amount that a commercially available polymer composition of the polymer having a specific range of polymer molecular weights would not contain.

Embodiment 34 provides the method or device according to Embodiment 31, wherein the first polymer layer, as a result of polymerization reactions on the metal layer, comprises at least one selected from the group consisting of oligomers, tetramers, trimers, and dimers chemically boned to the metal layer would not occur when coating a pre-polymerized polymer composition on the metal layer.

Embodiment 35 provides the method or device according to Embodiment 31, wherein the metal layer comprises a pinhole extending through a thickness of the metal layer, wherein at least one of an oligomer and a polymer occupies at least part of a space of the pinhole and is chemically bonded to an interior surface of the pinhole that would not occur when coating a pre-polymerized polymer composition on the metal layer.

Embodiment 36 provides the method or device according to Embodiment 31, wherein the first polymer layer, not as a result of coating of a pre-polymerized polymer composition on the metal layer, does not comprise a polymerization inhibitor that a commercially available polymer composition of a polymer having a specific range of molecular weights would contain to inhibit additional polymerization reactions or cross-linking reactions in the polymer composition.

Embodiment 37 provides the method or device according to Embodiment 31, wherein the first polymer layer does not comprise a surfactant that would be included in the polymer layer, if the first polymer layer is formed by coating of a pre-polymerized polymer, for evenly coating the pre-polymerized polymer on the metal layer.

Embodiment 38 provides the method or device according to Embodiment 31, wherein the second polymer layer has a thickness in a range between about 1 µm and about 20 µm.

Embodiment 39 provides the method or device according to Embodiment 31, wherein the second polymer layer, as a result of polymerization reactions on the plastic film, comprises at least one selected from the group consisting of oligomers, tetramers, trimers, and dimers derived from the at least one monomer in a substantial amount that a commercially available polymer composition of the polymer having a specific range of polymer molecular weights would not contain.

Embodiment 40 provides the method or device according to Embodiment 31, wherein the second polymer layer, as a result of polymerization reactions on the plastic film, comprises at least one selected from the group consisting of oligomers, tetramers, trimers, and dimers chemically boned to the plastic film that a commercially available polymer composition of the polymer having a specific range of polymer molecular weights would not contain.

Embodiment 41 provides the method or device according to Embodiment 31, wherein the plastic film comprises an engineering polymer layer with pores, wherein at least one of an oligomer and a polymer stays in at least one of the pores and is chemically bonded to an interior surface of the at least one pore that would not occur when coating a pre-polymerized polymer composition on the plastic film.

Embodiment 42 provides the method or device according to Embodiment 31, wherein many of the polymers of the second polymer layer are chemically bonded to the plastic film so that the second polymer layer attaches to the metal layer in the absence of such a binder.

Embodiment 43 provides the method or device according to Embodiment 31, wherein the second polymer layer, not as a result of coating of a pre-polymerized polymer composition on the plastic film, does not comprise a polymerization inhibitor that a commercially available polymer composition of a polymer having a specific range of molecular weights would contain to inhibit additional polymerization reactions or cross-linking reactions in the polymer composition.

Embodiment 44 provides the method or device according to Embodiment 31, wherein the second polymer layer does not comprise a surfactant that would be included, if the second polymer layer is formed by coating of a pre-polymerized polymer, for evenly coating the pre-polymerized polymer on the plastic layer.

Embodiment 45 provides a separator device for use in a secondary battery. The separator comprises:
- a porous polyolefin layer having a first surface and a second surface;
- a first polymer layer on the first surface formed on the metal layer, as a result of polymerization reactions on the metal layer rather than a result of coating of a pre-polymerized polymer composition on the metal layer; and
- a second polymer layer on the second surface formed on the metal layer, as a result of polymerization reactions on the metal layer rather than a result of coating of a pre-polymerized polymer composition on the metal layer;
- wherein each of the first and second polymer layers comprises polymers derived from at least one monomer selected from the group consisting of Compound Nos. 204-248 listed below and additional compounds represented by any one of Chemical Formulae 1, 2, 3, 4, 5, 6, 7, 8, 9, 10 and 11 defined in Embodiment 1.

| Compound No. | Compound |
| --- | --- |
| 204 | 1,3-diaminobenzene |
| 205 | 1,4-diaminobenzene |
| 206 | 4-(prop-2-en-1-yl)-4H-1,2,4-triazol-3-amine |
| 207 | 5-amino-3-chloro-4-(prop-2-en-1-yl)-4H-1,2,4-triazole |
| 208 | 5-amino-3-hydroxy-4-(prop-2-en-1-yl)-4H-1,2,4-triazole |
| 209 | 5-amino-4-(prop-2-en-1-yl)-4H-1,2,4-triazole-3-carbonitrile |
| 210 | 5-amino-4-(prop-2-en-1-yl)-4H-1,2,4-triazole-3-thiol |
| 211 | 4-(prop-2-en-1-yl)-4H-1,2,4-triazol-3,5-diamine |
| 212 | 5-amino-4-(prop-2-en-1-yl)-4H-1,2,4-triazole-3-carbaldehyde |
| 213 | 5-amino-4-(prop-2-en-1-yl)-4H-1,2,4-triazole-3-carboxylic acid |
| 214 | 3-amido-5-amino-4-(prop-2-en-1-yl)-4H-1,2,4-triazole |
| 215 | 5-amino-3-methoxo-4-(prop-2-en-1-yl)-4H-1,2,4-triazole |
| 216 | 5-amino-3-methoxy-4-(prop-2-en-1-yl)-4H-1,2,4-triazole |
| 217 | 5-amino-3-nitro-4-(prop-2-en-1-yl)-4H-1,2,4-triazole |
| 218 | 7-iodopyrazolo[1,5-a]pyrazin-4-amine |
| 219 | 3-(3-iodo-1-methyl-1H-pyrazol-5-yl)pyrazin-2-amine |
| 220 | 5-(4-iodo-1H-pyrazol-1-yl)-1,3-thiazol-2-amine |
| 221 | 4-iodo-5-(pyridazin-3-yl)-1,2-oxazol-3-amine |
| 222 | 7-iodo-[1,2]oxazolo[4,5-b]pyridin-3-amine |
| 223 | 5-(5-iodo-1-methyl-1H-pyrazol-4-yl)-1,2-oxazol-3-amine |
| 224 | 9-aminospiro[4.5]dec-8-en-7-one |
| 225 | 2H,3H,4H,5H,6H,7H-furo[2,3-b]pyridin-3-one |
| 226 | 5-(aminomethyl)-3-chlorofuran |
| 227 | 5-(aminomethyl)-3-hydroxofuran |
| 228 | 5-(aminomethyl)-3-cyanofuran |
| 229 | 5-(aminomethyl)-3-sulfhydrofuran |
| 230 | 5-(aminomethyl)-3-aminofuran |
| 231 | 5-(aminomethyl)-3-formylfuran |
| 232 | 5-(aminomethyl)-3-carboxofuran |
| 233 | 5-(aminomethyl)-3-amidofuran |
| 234 | 5-(aminomethyl)-3-methoxofuran |
| 235 | 5-(aminomethyl)-3-methoxyfuran |
| 236 | 5-(aminomethyl)-3-nitrofuran |
| 237 | 1-[4-(prop-2-en-1-yl)furan-2-yl]methanamine |
| 238 | 1-[3-chloro-4-(prop-2-en-1-yl)furan-2-yl]methanamine |
| 239 | 1-[3-hydroxo-4-(prop-2-en-1-yl)furan-2-yl]methanamine |
| 240 | 1-[3-cyano-4-(prop-2-en-1-yl)furan-2-yl]methanamine |
| 241 | 1-[3-sulfhydro-4-(prop-2-en-1-yl)furan-2-yl]methanamine |
| 242 | 1-[3-amino-4-(prop-2-en-1-yl)furan-2-yl]methanamine |
| 243 | 1-[3-formyl-4-(prop-2-en-1-yl)furan-2-yl]methanamine |
| 244 | 1-[3-carboxo-4-(prop-2-en-1-yl)furan-2-yl]methanamine |
| 245 | 1-[3-amido-4-(prop-2-en-1-yl)furan-2-yl]methanamine |
| 246 | 1-[3-methoxo-4-(prop-2-en-1-yl)furan-2-yl]methanamine |
| 247 | 1-[3-methoxy-4-(prop-2-en-1-yl)furan-2-yl]methanamine |
| 248 | 1-[3-nitro-4-(prop-2-en-1-yl)furan-2-yl]methanamine |

Embodiment 46 provides a secondary battery device comprising: an anode;
- a cathode;
- a separator electrically placed between the anode and the cathode;
- an electrolyte,
- wherein the separator comprising:
  - a porous polyolefin layer having a first surface and a second surface;
  - a first polymer layer on the first surface formed on the metal layer, as a result of polymerization reactions on the metal layer rather than a result of coating of a pre-polymerized polymer composition on the metal layer; and
  - a second polymer layer on the second surface formed on the metal layer, as a result of polymerization reactions on the metal layer rather than a result of coating of a pre-polymerized polymer composition on the metal layer;
  - wherein neither of the first and second polymer layers comprises a binder for attaching the polymer layer to the metal layer, wherein many of the polymers in the polymer layer are chemically bonded to the metal layer so that the polymer layer attaches to the metal layer in the absence of such a binder,
  - wherein each of the first and second polymer layers comprises polymers derived from at least one monomer selected from the group consisting of Compound Nos. 204-248 of Embodiment 45 and additional and compounds represented by any one of Chemical Formulae 1, 2, 3, 4, 5, 6, 7, 8, 9, 10 and 11 define in Embodiment 1.

Embodiment 47 provides a method of making a separator for use in a secondary battery. The method comprising:
- providing a porous polyolefin layer having a first surface and a second surface;
- causing a polymerization reaction to take place on the porous polyolefin layer to form a first polymer layer on the first surface and a second polymer layer on the second surface,
- wherein the polymerization reaction involves a polymerization reaction composition comprising at least one monomer selected from the group consisting of Compound Nos. 204-248 of Embodiment 45 and additional compounds represented by any one of Chemical Formulae 1, 2, 3, 4, 5, 6, 7, 8, 9, 10 and 11 define in Embodiment 1.

Embodiment 48 provides the device or method according to any one of Embodiments 45-47, wherein the porous polyolefin layer comprises s a polyethylene or polypropylene non-woven fabric layer.

Embodiment 49 provides the device or method according to any one of Embodiments 45-47, wherein the porous polyolefin layer comprises s a polyethylene or polypropylene woven fabric layer.

Embodiment 50 provides the device or method according to any one of Embodiments 45-47, wherein the at least one monomer is selected from the compounds 1-248 listed below.

| Compound No. | Compound |
| --- | --- |
| 1 | 2-aminopyridine |
| 2 | 2,3-diaminopyridine |
| 3 | 2,4-diaminopyridine |

| Compound No. | Compound |
|---|---|
| 4 | 2,5-diaminopyridine |
| 5 | 2,6-diaminopyridine |
| 6 | 3,4-diaminopyridine |
| 7 | 3,5-diaminopyridine |
| 8 | 3,5-diamino-1,4-dihydropyridine |
| 9 | 2,3,4-triaminopyridine |
| 10 | 2,3,5-triaminopyridine |
| 11 | 2,3,6-triaminopyridine |
| 12 | 2,4,6-triaminopyridine |
| 13 | 3,4,5-triaminopyridine |
| 14 | 2,3,4,5-tetraaminopyridine |
| 15 | 2,3,4,6-tetraaminopyridine |
| 16 | 2,3,5,6-tetraaminopyridine |
| 17 | 4,5-diaminopyrimidine |
| 18 | 4,6-diaminopyrimidine |
| 19 | 2,5-diaminopyrimidine |
| 20 | 2,4,5-triaminopyrimidine |
| 21 | 2,4,6-triaminopyrimidine |
| 22 | 4,5,6-triaminopyrimidine |
| 23 | 2,4,5,6-tetraaminopyrimidine |
| 24 | 4-amino-2,3-dihydropyrimidine |
| 25 | 1,5,6-triamino-1,2-dihydropyrimidine |
| 26 | 2,4-diamino-1,6-dihydro-1,3,5-triazine |
| 27 | 1,2-diamino-1,2-dihydropyridine |
| 28 | 3-amino-1,2-dihydropyridine |
| 29 | 2-amino-3-formylpyridine |
| 30 | 2-amino-3-hydroxypyridine |
| 31 | 4-amino-2-oxo-1,2-dihydro-pyrimidine-5-carboxylic acid |
| 32 | tert-butyl 4-amino-2-oxo-5,6-dihydropyridine-1(2H)-carboxylate |
| 33 | 5-Aminopyridine-2-carboxylic acid |
| 34 | 3-amino-4-chloro-2H-pyran-2-one |
| 35 | 3-amino-4-hydroxy-2H-pyran-2-one |
| 36 | 3-amino-4-methoxy-2H-pyran-2-one |
| 37 | 3-aminopyridine-2-carboxamide |
| 38 | 2,5-diamino-1H-imidazole |
| 39 | 1,5-diamino-1H-imidazole |
| 40 | 1,2-diamino-1H-imidazole |
| 41 | 2,5-diamino-1H-pyrrole |
| 42 | 1,2,5-triamino-1H-pyrrole |
| 43 | 1,3-diamino-1H-pyrrole |
| 44 | 5-amino-2H-pyrrole |
| 45 | 4-amino-2H-imidazole |
| 46 | 2-amino-2H-imidazole |
| 47 | 2-amino-4,5-dihydro-1H-pyrrole |
| 48 | 2,5-diamino-2,5-dihydro-1H-pyrrole |
| 49 | 1-amino-2,5-dihydro-1H-pyrrole |
| 50 | 2,3-diamino-1H-pyrrol-1-ol |
| 51 | 4-amino-N-methyl-N-(prop-2-en-1-yl)-1H-pyrrole-2-carboxamide |
| 52 | 4-amino-2-oxo-6-sulfanyl-2H-thiopyran-5-carboxamide |
| 53 | 5-amino-3,4-dihydro-2H-pyrrole-2-carboxylic acid |
| 54 | 5-amino-3-(3-hydroxypropyl)-1H-pyrazole-4-carbonitrile |
| 55 | 5-amino-3-propyl-1H-pyrazole-4-carbonitrile |
| 56 | 3-amino-5-ethyl-1H-pyrazole-4-carbonitrile |
| 57 | 5-amino-3-methyl-1H-pyrazole-4-carbonitrile |
| 58 | 5-aminofuran-2-carboxylic acid |
| 59 | 1-(5-aminothiophen-2-yl)ethan-1-one |
| 60 | 5-aminofuran-2-carbaldehyde |
| 61 | 5-aminothiophene-2-thiol |
| 62 | Methyl 2-aminofuran-3-carboxylate |
| 63 | 2-aminothiophene-3-carbonitrile |
| 64 | 1H-pyrazole-3-amine |
| 65 | 4-chloro-1H-pyrazole-3-amine |
| 66 | 3-amino-1H-pyrazole-4-ol |
| 67 | 5-amino-1H-pyrazole-4-carbonitrile |
| 68 | 5-amino-1H-pyrazole-4-thiol |
| 69 | 1H-pyrazole-4,5-diamine |
| 70 | 5-amino-1H-pyrazole-4-carbaldehyde |
| 71 | 5-amino-1H-pyrazole-4-carboxylic acid |
| 72 | 5-amino-1H-pyrazole-4-carboxamide |
| 73 | 1-(5-amino-1H-pyrazol-4-yl)ethan-1-one |
| 74 | 4-methoxy-1H-pyrazol-5-amine |
| 75 | 4-nitro-1H-pyrazol-5-amine |
| 76 | 1,2-oxazol-3-amine |
| 77 | 4-chloro-1,2-oxazol-3-amine |
| 78 | 4-hydroxy-1,2-oxazol-3-amine |
| 79 | 4-cyano-1,2-oxazol-3-amine |
| 80 | 4-sulfhydro-1,2-oxazol-3-amine |
| 81 | 1,2-oxazol-3,4-diamine |
| 82 | 4-formyl-1,2-oxazol-3-amine |
| 83 | 3-amino-1,2-oxazole-4-carboxylic acid |
| 84 | 4-amido-1,2-oxazol-3-amine |
| 85 | 4-methoxo-1,2-oxazol-3-amine |
| 86 | 4-methoxy-1,2-oxazol-3-amine |
| 87 | 4-nitro-1,2-oxazol-3-amine |
| 88 | 1,3-oxazol-2-amine |
| 89 | 5-chloro-1,3-oxazol-2-amine |
| 90 | 5-hydroxy-1,3-oxazol-2-amine |
| 91 | 5-cyano-1,3-oxazol-2-amine |
| 92 | 5-sulfhydro-1,3-oxazol-2-amine |
| 93 | 1,3-oxazol-2,5-diamine |
| 94 | 2-amino-1,3-oxazol-5-carbaldehyde |
| 95 | 2-amino-1,3-oxazol-5-carboxylic acid |
| 96 | 2-amino-5-methyl-4,5-dihydro-1,3-oxazol-4-one |
| 97 | 5-methoxy-1,3-oxazol-2-amine |
| 98 | 5-nitro-1,3-oxazol-2-amine |
| 99 | 1,2-thiazol-3-amine |
| 100 | 4-chloro-1,2-thiazol-3-amine |
| 101 | 4-hydroxy-1,2-thiazol-3-amine |
| 102 | 4-cyano-1,2-thiazol-3-amine |
| 103 | 4-sulfhydro-1,2-thiazol-3-amine |
| 104 | 1,2-thiazol-3,4-diamine |
| 105 | 4-formyl-1,2-thiazol-3-amine |
| 106 | 3-amino-1,2-thiazole-4-carboxylic acid |
| 107 | 4-amido-1,2-thiazol-3-amine |
| 108 | 4-methoxo-1,2-thiazol-3-amine |
| 109 | 4-methoxy-1,2-thiazol-3-amine |
| 110 | 4-nitro-1,2-thiazol-3-amine |
| 111 | 1,3-thiazol-2-amine |
| 112 | 5-chloro-1,3-thiazol-2-amine |
| 113 | 4-hydroxy-1,3-thiazol-2-amine |
| 114 | 4-cyano-1,3-thiazol-2-amine |
| 115 | 4-sulfhydro-1,3-thiazol-2-amine |
| 116 | 1,3-thiazol-2,4-diamine |
| 117 | 2-amino-1,3-thiazole-4-carbaldehyde |
| 118 | 2-amino-1,3-thiazole-4-carboxylic acid |
| 119 | 4-amido-1,3-thiazole-2-amine |
| 120 | 4-methoxo-1,3-thiazole-2-amine |
| 121 | 4-methoxy-1,3-thiazole-2-amine |
| 122 | 4-nitro-1,3-thiazole-2-amine |
| 123 | 2-vinylpyridine |
| 124 | 4-vinylpyridine |
| 125 | 4-amino-2-ethenylpyridine |
| 126 | 2,4-diamino-6-ethenylpyrimidine |
| 127 | 2,6-diamino-4-ethenylpyridine |
| 128 | 3,5-diamino-4-ethenylpyridine |
| 129 | 2,3-diamino-4-ethenylpyridine |
| 130 | 2,3-diamino-6-ethenylpyridine |
| 131 | 6-amino-3-ethenylpyridin-2-ol |
| 132 | 3-(6-aminopyridin-3-yl)prop-2-enoic acid |
| 133 | 4-amino-2-chloro-3-ethenylpyridine |
| 134 | 4-amino-3-ethenyl-2-hydroxypyridine |
| 135 | 4-amino-3-ethenylpyridine |
| 136 | 4-amino-5-ethenyl-2-methoxypyridine |
| 137 | 4-amino-3-ethenyl-5-nitropyridine |
| 138 | 4-amino-2-ethenylpyridine-3-carboxylic acid |
| 139 | methyl 4-amino-6-chloro-3-ethenylpyridine-2-carboxylate |
| 140 | 1-(4-amino-6-ethenylpyridin-3-yl)ethan-1-one |
| 141 | 3-sulfhydro-4-ethenylpyridine-2-amine |
| 142 | 3-amido-4-ethenylpyridine-2-amine |
| 143 | 3-cyano-4-ethenylpyridine-2-amine |
| 144 | 3-formyl-4-ethenylpyridine-2-amine |
| 145 | 1-amino-3-iminocyclohex-1-ene |
| 146 | 3-amino-2-cyclohexen-1-one |
| 147 | 1,2-diamino-cyclohex-1-ene |
| 148 | 1,4-diamino-cyclohex-1-ene |
| 149 | 1,2-diamino-cyclohex-4-ene |
| 150 | 1,2-diamino-cyclohex-3-ene |
| 151 | 1,4-diamino-cyclohex-2-ene |
| 152 | 3-amino-2-cyclohexen-1-thione |
| 153 | 5-amino-3,6-dihydro-2H-thiopyran-3-one |

-continued

| Compound No. | Compound |
|---|---|
| 154 | 5-amino-3,6-dihydro-2H-pyran-3-one |
| 155 | 4-ethenyl-1H-pyrazole-5-amine |
| 156 | 4-ethenyl-1,2-thiazol-3-amine |
| 157 | 3-thenyl-1,2-thiazole |
| 158 | 5-ethenyl-1,3-thiazol-2-amine |
| 159 | 5-ethenyl-1,2-oxazole |
| 160 | 5-ethenyl-3-methyl-1,2-oxazole |
| 161 | 5-(2-methylprop-1-en-1-yl)-1,2-oxazole |
| 162 | 5-(prop-1-en-2-yl)-1,2-oxazol-4-amine |
| 163 | 5-(prop-1-en-2-yl)-1,2-oxazol-3-amine |
| 164 | (1E)-2-(3-chloro-1,2-oxazol-5-yl)ethen-1-amine |
| 165 | 2-(3-chloro-1,2-oxazol-5-yl)ethen-1-amine |
| 166 | 5-(2-bromoethenyl)-3-methyl-1,2-oxazole |
| 167 | 3-methyl-5-(2-methylprop-1-en-1-yl)-1,2-oxazole |
| 168 | Dimethyl[(1E)-2-(1,2-oxazol-5-yl)ethenyl]amine |
| 169 | 1-amino-2-iminocyclohex-1-ene |
| 170 | 3-amino-2-cyclohexen-1-one |
| 171 | 1,2-diamino-cyclohex-1-ene |
| 172 | 1,4-diamino-cyclohex-1-ene |
| 173 | 1,2-diamino-cyclohex-4-ene |
| 174 | 1,2-diamino-cyclohex-3-ene |
| 175 | 9-aminospiro[4.5]dec-8-en-7-one |
| 176 | 2H,3H,4H,5H,6H,7H-furo[2,3-b]pyridin-3-one |
| 177 | 3-amino-2-cyclopenten-1-one |
| 178 | 5-amino-2,3-dihydrofuran-3-one |
| 179 | 5-amino-4-methyl-2,3-dihydrofuran-3-one |
| 180 | 5-amino-2,2-dimethyl-2,3-dihydrofuran-3-one |
| 181 | 2-amino-4-oxo-4,5-dihydrofuran-3-carbonitrile |
| 182 | 1-amino-4-ethenylcyclohexane |
| 183 | 1,4-diamino-1-ethenylcyclohexane |
| 184 | 2-amino-5-ethenylcyclohexan-1-ol |
| 185 | 1-amino-4-ethenylcyclohex-3-ene |
| 186 | 1-amino-1-ethenylcyclohex-2-ene |
| 187 | 1-amino-3-ethenylcyclopentane |
| 188 | 1-amino-1-ethenylcyclopentane |
| 189 | 2-amino-1-ethenylcyclopentan-1-ol |
| 190 | 1-amino-1-ethenylcyclopent-2-ene |
| 191 | 3-amino-5-ethenyl-5-hydroxycyclopent-2-en-1-one |
| 192 | Furfurylamine |
| 193 | (3E/Z)-4-aminopent-3-en-2-one |
| 194 | (2E/Z)-3-(dimethylamino)-2-methylprop-2-enal |
| 195 | Diaminomaleonitrile |
| 196 | Ethyl 3-aminocrotonate |
| 197 | Methyl 3-aminocrotonate |
| 198 | N-[(2E)-3-nitrosobut-2-en-2-yl]hydroxylamine |
| 199 | Methyl[1-(methylsulfanyl)-2-nitroethenyl]amine |
| 200 | 3-Aminocrotononitrile |
| 201 | N-Vinylformamide |
| 202 | 1,2-diaminobenzene |
| 203 | 1,2,4,5-tetraaminobenzene (PTAB) |
| 204 | 1,3-diaminobenzene |
| 205 | 1,4-diaminobenzene |
| 206 | 4-(prop-2-en-1-yl)-4H-1,2,4-triazol-3-amine |
| 207 | 5-amino-3-chloro-4-(prop-2-en-1-yl)-4H-1,2,4-triazole |
| 208 | 5-amino-3-hydroxy-4-(prop-2-en-1-yl)-4H-1,2,4-triazole |
| 209 | 5-amino-4-(prop-2-en-1-yl)-4H-1,2,4-triazole-3-carbonitrile |
| 210 | 5-amino-4-(prop-2-en-1-yl)-4H-1,2,4-triazole-3-thiol |
| 211 | 4-(prop-2-en-1-yl)-4H-1,2,4-triazol-3,5-diamine |
| 212 | 5-amino-4-(prop-2-en-1-yl)-4H-1,2,4-triazole-3-carbaldehyde |
| 213 | 5-amino-4-(prop-2-en-1-yl)-4H-1,2,4-triazole-3-carboxylic acid |
| 214 | 3-amido-5-amino-4-(prop-2-en-1-yl)-4H-1,2,4-triazole |
| 215 | 5-amino-3-methoxo-4-(prop-2-en-1-yl)-4H-1,2,4-triazole |
| 216 | 5-amino-3-methoxy-4-(prop-2-en-1-yl)-4H-1,2,4-triazole |
| 217 | 5-amino-3-nitro-4-(prop-2-en-1-yl)-4H-1,2,4-triazole |
| 218 | 7-iodopyrazolo[1,5-a]pyrazin-4-amine |
| 219 | 3-(3-iodo-1-methyl-1H-pyrazol-5-yl)pyrazin-2-amine |
| 220 | 5-(4-iodo-1H-pyrazol-1-yl)-1,3-thiazol-2-amine |
| 221 | 4-iodo-5-(pyridazin-3-yl)-1,2-oxazol-3-amine |
| 222 | 7-iodo-[1,2]oxazolo[4,5-b]pyridin-3-amine |
| 223 | 5-(5-iodo-1-methyl-1H-pyrazol-4-yl)-1,2-oxazol-3-amine |
| 224 | 9-aminospiro[4.5]dec-8-en-7-one |
| 225 | 2H,3H,4H,5H,6H,7H-furo[2,3-b]pyridin-3-one |
| 226 | 5-(aminomethyl)-3-chlorofuran |
| 227 | 5-(aminomethyl)-3-hydroxofuran |

-continued

| Compound No. | Compound |
|---|---|
| 228 | 5-(aminomethyl)-3-cyanofuran |
| 229 | 5-(aminomethyl)-3-sulfhydrofuran |
| 230 | 5-(aminomethyl)-3-aminofuran |
| 231 | 5-(aminomethyl)-3-formylfuran |
| 232 | 5-(aminomethyl)-3-carboxofuran |
| 233 | 5-(aminomethyl)-3-amidofuran |
| 234 | 5-(aminomethyl)-3-methoxofuran |
| 235 | 5-(aminomethyl)-3-methoxyfuran |
| 236 | 5-(aminomethyl)-3-nitrofuran |
| 237 | 1-[4-(prop-2-en-1-yl)furan-2-yl]methanamine |
| 238 | 1-[3-chloro-4-(prop-2-en-1-yl)furan-2-yl]methanamine |
| 239 | 1-[3-hydroxy-4-(prop-2-en-1-yl)furan-2-yl]methanamine |
| 240 | 1-[3-cyano-4-(prop-2-en-1-yl)furan-2-yl]methanamine |
| 241 | 1-[3-sulfhydro-4-(prop-2-en-1-yl)furan-2-yl]methanamine |
| 242 | 1-[3-amino-4-(prop-2-en-1-yl)furan-2-yl]methanamine |
| 243 | 1-[3-formyl-4-(prop-2-en-1-yl)furan-2-yl]methanamine |
| 244 | 1-[3-carboxo-4-(prop-2-en-1-yl)furan-2-yl]methanamine |
| 245 | 1-[3-amido-4-(prop-2-en-1-yl)furan-2-yl]methanamine |
| 246 | 1-[3-methoxo-4-(prop-2-en-1-yl)furan-2-yl]methanamine |
| 247 | 1-[3-methoxy-4-(prop-2-en-1-yl)furan-2-yl]methanamine |
| 248 | 1-[3-nitro-4-(prop-2-en-1-yl)furan-2-yl]methanamine |

DETAILED DESCRIPTION OF IMPLEMENTATIONS

Figure 1:
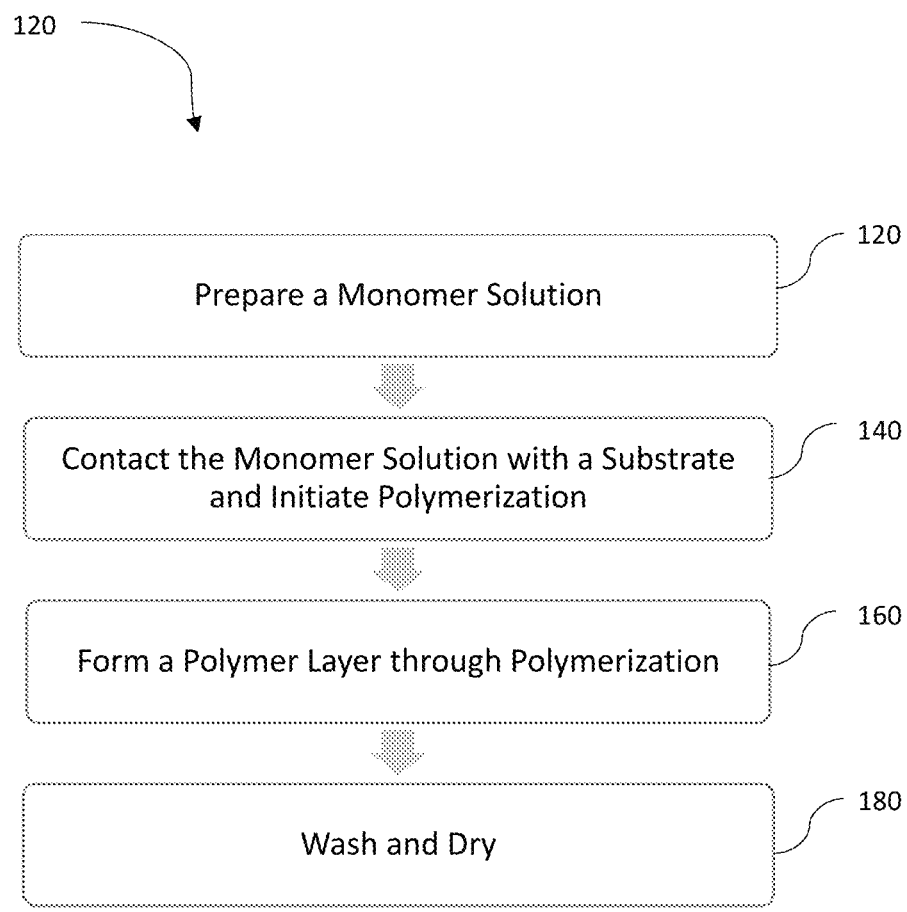
FIG. 1 is a flowchart of a method of forming a polymer layer on a substrate surface according to an implementation.

Specific implementations will be described and discussed in more detail with reference to the drawings disclosing the implementations of the present invention. However, not all implementations of the invention are disclosed in the drawings. The same elements or configurations are described using the same reference numerals. The invention disclosed in this document may be implemented in many different forms, and it should not be construed that the present invention is limited only to the implementations set forth by way of examples in this document. The implementations disclosed in this document are provided to satisfy the requirements of the patent law. Various modifications that can be readily imagined in light of the implementations disclosed herein can be made by those skilled in the art disclosed in this document. It should be understood that the scope of the present invention is not limited only to the implementations disclosed in this document, and modifications of these implementations or other implementations that can be readily imagined by those skilled in the art fall within the scope of the claims.

As used herein, the term "alkyl" includes a linear alkyl, a branched alkyl or a cyclic alkyl unless otherwise defined. The term "C1-C6 alkyl" means an alkyl having 1 to 6 carbon atoms.

As used herein, the term "alkoxy" means "alkyl-O—" unless otherwise defined, the term "C1-C6 alkoxy" means "C1-C6 alkyl-O—," where "alkyl" or "C1-C6 alkyl" is as defined above.

As used herein, the term "halo" includes fluoro, chloro, bromo and iodo.

As used herein, the term "oligomer" refers to a polymer consisting of a relatively small number of repeating units, about 20 or less repeating units. In this case, the repeating units may be composed of the same molecule or different molecules.

As used herein, the term "(co)polymer" refers to both a "polymer" and a "copolymer," and means a polymer consisting of a larger number of repeating units than an oligomer, and one produced by bonding between different molecules is particularly referred to as a "copolymer." The copolymer can be in various forms such as an alternating copolymer, a random copolymer, a block copolymer, and a graft copolymer.

I. MONOMER

An implementation of the present invention provides a method of coating the surface of a substrate by a polymerization reaction of compounds containing amino groups or tautomers thereof as monomer. The monomer compounds containing amino groups are compounds represented by Chemical Formulas 1 to 11.

Mechanism of Polymerization Reaction

The compounds represented by Chemical Formulas 1 to 11 are polymerized by nucleophilic or electrophilic reactions with substrates. This polymerization reactions may be initiated and proceed on the surface of substrates having nucleophiles or electrophiles even without a polymerization initiator such as a radical initiator. The mechanisms of the nucleophilic or electrophilic reactions with the substrates will be described later in detail for each of the compounds represented by Chemical Formulas 1 to 11. These reaction mechanisms are only to help the understanding of the present invention, and the implementations of the present invention do not necessarily follow such reaction mechanisms.

Compound Represented by Chemical Formula 1

An implementation of the present invention provides an amino heterocyclic compound represented by Chemical Formula 1.

<Chemical Formula 1>

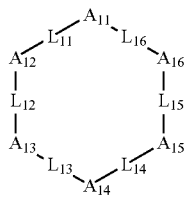

$L_{11}$ to $L_{16}$

In Chemical Formula 1, $L_{11}$ to $L_{16}$ are each independently a single bond or a double bond, and one or more of $L_{11}$ to $L_{16}$ are double bonds.

$A_{11}$ to $A_{16}$ $A_{11}$ to $A_{16}$ are each independently selected from the group consisting of —C($R_{11}R_{12}$)—, —N($R_{13}$)—, —O— and —S—, and one or more of $A_{11}$ to $A_{16}$ are —N($R_{13}$)—, —O— or —S— and one or more of $A_{11}$ to $A_{16}$ are C($R_{11}R_{12}$)—.

$R_{11}$ to $R_{13}$ $R_{11}$ and $R_{12}$ are each independently selected from the group consisting of H, $NH_2$, =NH, $C_1$-$C_6$ alkyl, $C_1$-$C_6$ alkoxy, halo, CN, carboxyl, formyl, OH and SH, or form a carbonyl or thiocarbonyl group together with a carbon atom connected thereto, and $R_{13}$ is hydrogen or $NH_2$.

Single Bond/Double Bond

However, (a) two Ls adjacent to an arbitrary L that is a double bond among $L_{11}$ to $L_{16}$ are single bonds and A connected by L that is a double bond is not —O— or —S—, (b) when A connected by an arbitrary L that is a double bond among $L_{11}$ to $L_{16}$ is C($R_{11}R_{12}$)— or —N($R_{13}$)—, $R_{12}$ and $R_{13}$ bonded to the carbon or nitrogen atom thereof do not exist, and (c) one or more of $R_{11}$, $R_{12}$ or $R_{13}$ are $NH_2$.

Imine-Enamine Tautomer

In an aqueous solution of the compound represented by Chemical Formula 1, equilibrium between a compound in an imine (or Schiff base) form and a compound in its enamine tautomeric form is achieved. An imine-enamine tautomer is a nitrogen analog of a keto-enol tautomer. In both cases, a hydrogen atom exchange between a heteroatom and a carbon atom occurs. For example, in the case of 4-aminopyridine, the following equilibrium is achieved.

<Reaction Scheme 1>

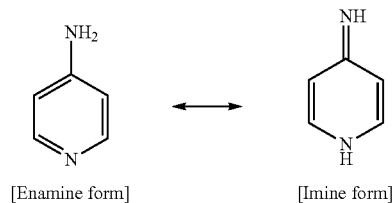

[Enamine form]    [Imine form]

Nucleophilic Reaction

An enamine tautomer exhibits a behavior similar to that of an enol, and the carbon at the alpha position exhibits nucleophilic properties. The imine-enamine tautomerism gives the imine the possibility of a reaction pathway based on the nucleophilic properties of the carbon at the alpha position. In the case of 4-aminopyridine as described above, the enamine form exhibits stronger aromatic properties than the imine form and is thus more stable than the imine form. Hence, the reactivity of imine is higher as the tautomerization equilibrium ratio of imine:enamine is smaller. In this case, a nucleophile attacks the carbon at position 2 of the imine to cause a nucleophilic reaction as illustrated in Reaction Scheme 2 below.

<Reaction Scheme 2>

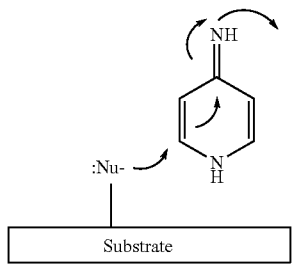

:Nu⁻ = Nucleophile

Nucleophilic Polymerization Reaction

According to the present invention, a chain polymerization reaction between compounds in an imine form takes place at the same time or before or after the nucleophilic reaction by a nucleophile on the substrate surface as described above. At this time, the imine group at position 4 acts as a nucleophile to attack the carbon at position 2 of another compound molecule in an imine form, and a nucleophilic reaction takes place. As a result of such a reaction, the surface of a substrate is modified with the compound represented by Chemical Formula 1 or a tautomer thereof, or an oligomer or (co)polymer of these as illustrated in Chemical Formula 12 below. The degree of polymerization of the polymer to be applied may be controlled by adjusting the concentration ratios of the compounds to the reaction site of the substrate. For example, the degree of polymerization of the polymer to be applied will increase as the concentration of the compound with respect to the reaction site of the substrate increases, and will decrease as the concentration of the compound with respect to the reactive site of the substrate decreases.

<Chemical Formula 12>

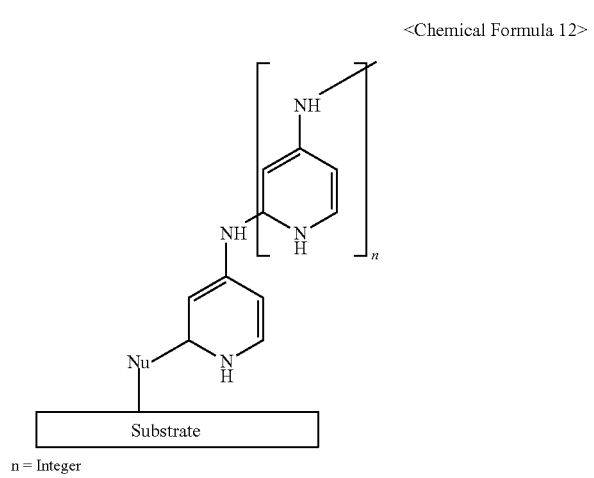

n = Integer

Electrophilic Polymerization Reaction

Meanwhile, when an electrophile exists on the substrate surface, as illustrated in Reaction Scheme 3 below, an electrophilic reaction of the electrophile with the imine group at position 4 of a compound in an imine form takes place and the compound is bonded to the substrate surface. As in the case of a nucleophilic reaction, a polymerization reaction between the compound molecules in an imine form also takes place, and the substrate surface is modified with the compound represented by Chemical Formula 1 or a tautomer thereof, or an oligomer or (co)polymer of these as illustrated in Chemical Formula 13 below.

<Reaction Scheme 3>

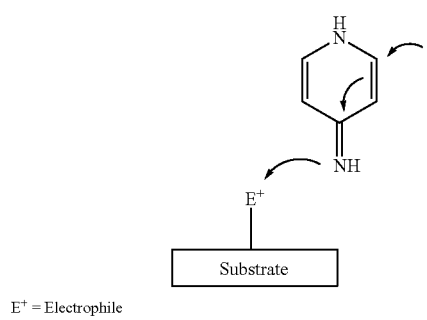

$E^+$ = Electrophile

<Chemical Formula 13>

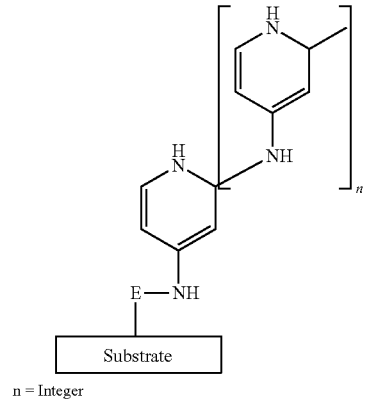

n = Integer

Compound Represented by Chemical Formula 2

An implementation of the present invention provides an amino heterocyclic compound represented by Chemical Formula 2.

<Chemical Formula 2>

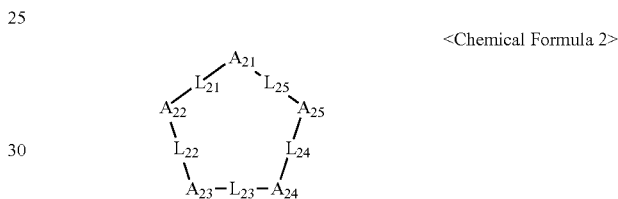

$L_{21}$ to $L_{25}$

In Chemical Formula 2, $L_{21}$ to $L_{25}$ are each independently a single bond or a double bond, and one or more of $L_{21}$ to $L_{25}$ are double bonds.

$A_{21}$ to $A_{25}$ $A_{21}$ to $A_{25}$ are each independently selected from the group consisting of —$C(R_{21}R_{22})$—, —$N(R_{23})$—, —O— and —S—, one or more of $A_{21}$ to $A_{25}$ are —$N(R_{23})$—, —O— or —S—, and one or more of $A_{21}$ to $A_{25}$ are —$C(R_{21}R_{22})$—.

$R_{21}$ to $R_{23}$ $R_{21}$ and $R_{22}$ are each independently selected from the group consisting of H, $NH_2$, =NH, $C_1$-$C_6$ alkyl, $C_1$-$C_6$ alkoxy, halo, CN, carboxyl, formyl, OH and SH, or form a carbonyl or thiocarbonyl group together with a carbon atom connected thereto, and $R_{23}$ is hydrogen or $NH_2$.

Double Bond/Single Bond

However, (a) two Ls adjacent to an arbitrary L that is a double bond among $L_{21}$ to $L_{25}$ are single bonds and A connected by L that is a double bond is not —O— or —S—, (b) when A connected by an arbitrary L that is a double bond among $L_{21}$ to Las is $C(R_{21}R_{22})$— or —$N(R_{23})$—, $R_{22}$ and $R_{23}$ bonded to the carbon or nitrogen atom thereof do not exist, and (c) one or more of $R_{21}$, $R_{22}$ or $R_{23}$ are $NH_2$.

Polymerization Reaction

In the case of the 5-membered amino heterocyclic compound represented by Chemical Formula 2 as well, the reaction takes place along the same pathway as that of the 6-membered amino heterocyclic compound represented by Chemical Formula 1. For example, in the case of 4-aminoimidazole, the equilibrium as illustrated in Reaction Scheme 4 is achieved, a compound in an imine form reacts with a nucleophile or electrophile on the substrate surface (Reaction Schemes 5 and 6), and the substrate surface is modified with the compound represented by Chemical Formula 2 or a tautomer thereof, or an oligomer or (co)polymer of these as illustrated in Chemical Formula 14 or 15 below.

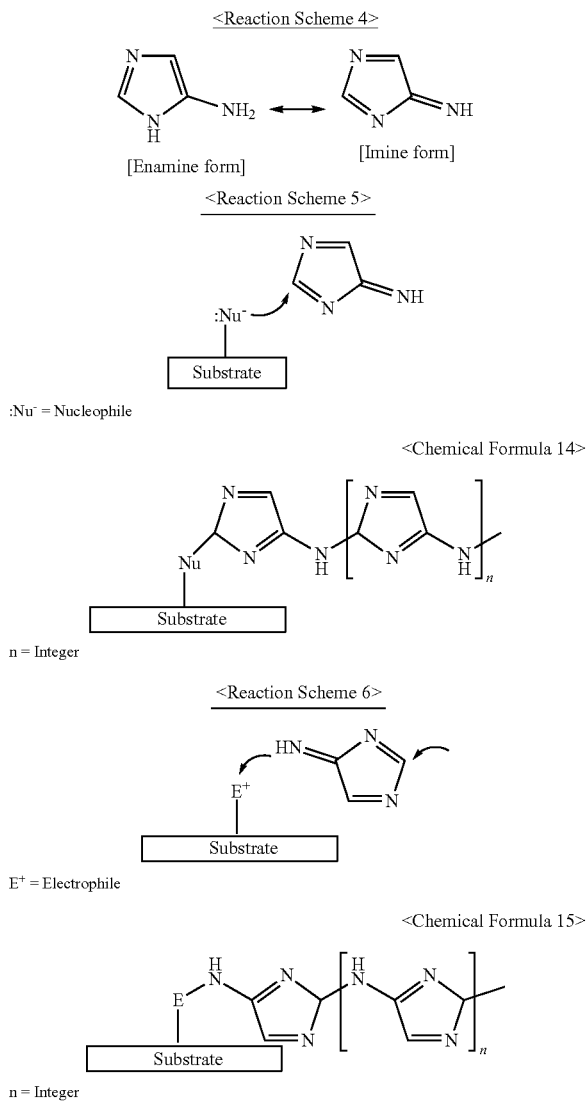

Compound Represented by Chemical Formula 3

An implementation of the present invention provides a vinyl amino heterocyclic compound represented by Chemical Formula 3.

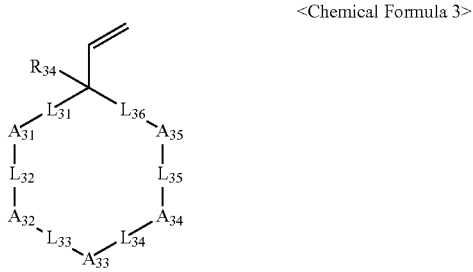

$L_{31}$ to $L_{36}$

In Chemical Formula 3, $L_{31}$ to $L_{36}$ are each independently a single bond or a double bond.

$A_{31}$ to $A_{35}$ $A_{31}$ to $A_{35}$ are each independently selected from the group consisting of —C($R_{31}R_{32}$)—, —N($R_{33}$)—, —O— and —S—, and one or more of $A_{31}$ to $A_{35}$ are —N($R_{33}$)—, —O— or —S— and one or more of $A_{31}$ to $A_{35}$ are —C($R_{31}R_{32}$)—.

$R_{31}$ to $R_{34}$ $R_{31}$ and $R_{32}$ are each independently selected from the group consisting of H, $NH_2$, =NH, $C_1$-$C_6$ alkyl, $C_1$-$C_6$ alkoxy, halo, CN, carboxyl, formyl, OH and SH, or form a carbonyl or thiocarbonyl group together with a carbon atom connected thereto, $R_{33}$ is hydrogen or $NH_2$, and $R_{34}$ is hydrogen.

Double Bond/Single Bond

However, (a) two Ls adjacent to an arbitrary L that is a double bond among $L_{31}$ to $L_{36}$ are single bonds and A connected by L that is a double bond is not —O— or —S—, (b) when A connected by an arbitrary L that is a double bond among $L_{31}$ to $L_{36}$ is C($R_{31}R_{32}$)— or —N($R_{33}$)—, $R_{32}$ and $R_{33}$ bonded to the carbon or nitrogen atom thereof do not exist, and (c) $R_{34}$ does not exist when $L_{31}$ or $L_{36}$ is a double bond.

Nucleophilic Reaction

The vinyl group of the vinyl amino heterocyclic compound represented by Chemical Formula 3 of the present invention provides a pathway for inducing a nucleophilic reaction by a nucleophile on the substrate surface. For example, in the case of 4-amino-2-ethenylpyridine, a nucleophilic reaction between the nucleophile on the substrate surface and the vinyl group takes place as illustrated in Reaction Scheme 7 below.

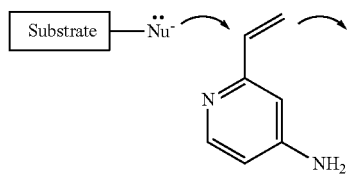

$\ddot{Nu}^-$ = Nucleophile

Nucleophilic Polymerization Reaction

According to the present invention, a chain polymerization reaction between vinyl heterocyclic compounds takes place at the same time or before or after the nucleophilic reaction by a nucleophile on the substrate surface as described above. In other words, the vinyl group acts as a nucleophile to attack the vinyl group of another vinyl heterocyclic compound molecule, and a nucleophilic reaction takes place. As a result of such a reaction, the surface of a substrate is modified with the compound represented by Chemical Formula 3 or an oligomer or (co)polymer thereof as illustrated in Chemical Formula 16 below. The degree of polymerization of the polymer to be applied may be controlled by adjusting the concentration ratios of the compounds to the reaction site of the substrate. For example, the degree of polymerization of the polymer to be applied will increase as the concentration of the compound with respect to the reaction site of the substrate increases, and will decrease as the concentration of the compound with respect to the reactive site of the substrate decreases.

<Chemical Formula 16>

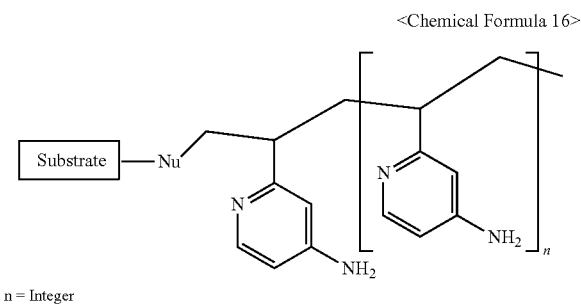

n = Integer

Electrophilic Polymerization Reaction

Meanwhile, when an electrophile exists on the substrate surface, as illustrated in Reaction Scheme 8 below, an electrophilic reaction of the electrophile with the vinyl group takes place and the compound is bonded to the substrate surface. As in the case of a nucleophilic reaction, a polymerization reaction between the heterocyclic compounds having a vinyl group also takes place, and the substrate surface is modified with the compound represented by Chemical Formula 3 or an oligomer or (co)polymer thereof as illustrated in Chemical Formula 17 below.

<Reaction Scheme 8>

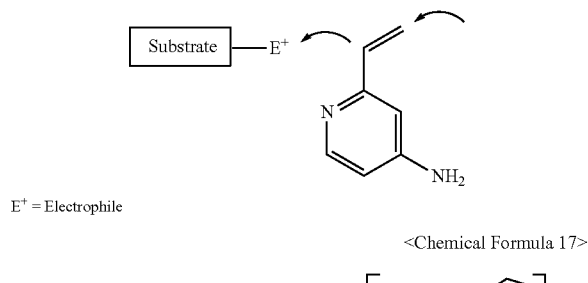

$E^+$ = Electrophile

<Chemical Formula 17>

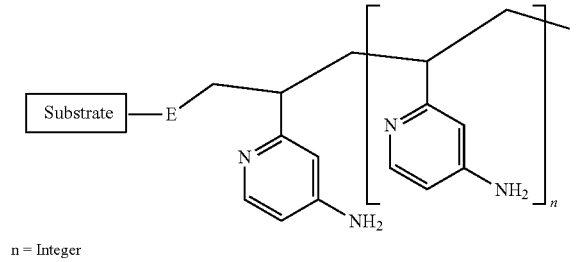

n = Integer

Compound Represented by Chemical Formula 4

An implementation of the present invention provides a vinyl amino heterocyclic compound represented by Chemical Formula 4.

<Chemical Formula 4>

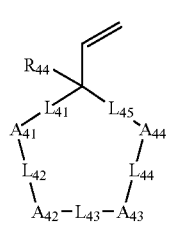

$L_{41}$ to $L_{45}$

In Chemical Formula 4, $L_{41}$ to $L_{45}$ are each independently a single bond or a double bond.

$A_{41}$ to $A_{44}$ $A_{41}$ to $A_{44}$ are each independently selected from the group consisting of —$C(R_{41}R_{42})$—, —$N(R_{43})$—, —O— and —S—, and one or more of $A_{41}$ to $A_{44}$ are —$N(R_{43})$—, —O— or —S— and one or more of $A_{41}$ to $A_{44}$ are —$C(R_{41}R_{42})$—.

$R_{41}$ to $R_{43}$ $R_{41}$ and $R_{42}$ are each independently selected from the group consisting of H, $NH_2$, =NH, $C_1$-$C_6$ alkyl, $C_1$-$C_6$ alkoxy, halo, CN, carboxyl, formyl, OH and SH, or form a carbonyl or thiocarbonyl group together with a carbon atom connected thereto, $R_{43}$ is hydrogen or $NH_2$, and $R_{44}$ is hydrogen.

Single Bond/Double Bond

However, (a) two Ls adjacent to an arbitrary L that is a double bond among $L_{41}$ to $L_{45}$ are single bonds and A connected by L that is a double bond is not —O— or —S—, (b) when A connected by an arbitrary L that is a double bond among $L_{41}$ to $L_{45}$ is $C(R_{41}R_{42})$— or —$N(R_{43})$—, $R_{42}$ and $R_{43}$ bonded to the carbon or nitrogen atom thereof do not exist, and (c) $R_{44}$ does not exist when $L_{41}$ or $L_{45}$ is a double bond.

Polymerization Reaction

In the case of the 5-membered vinyl amino heterocyclic compound represented by Chemical Formula 4 as well, the reaction takes place along the same pathway as that of the 6-membered vinyl amino heterocyclic compound represented by Chemical Formula 3. For example, in the case of 2-amino-5-ethenyl-1H-imidazole, 2-amino-5-ethenyl-1H-imidazole reacts with a nucleophile or electrophile on the substrate surface as illustrated in Reaction Schemes 9 and 10, respectively, and the substrate surface is modified with the compound represented by Chemical Formula 4 or an oligomer or (co)polymer thereof as illustrated in Chemical Formula 18 or 19.

<Reaction Scheme 9>

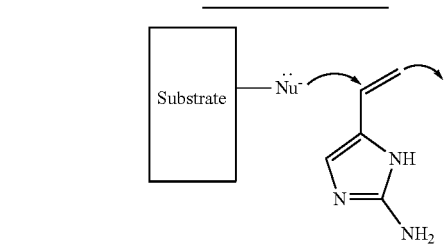

$Nu^-$ = Nucleophile

<Reaction Scheme 10>

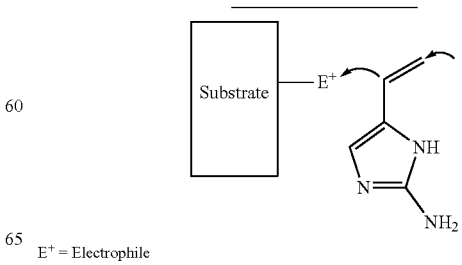

$E^+$ = Electrophile

<Chemical Formula 18>

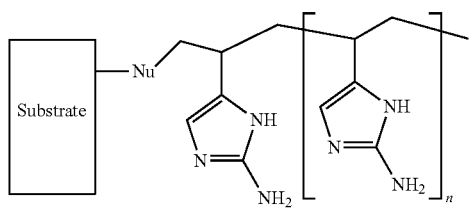

n = Integer

<Chemical Formula 19>

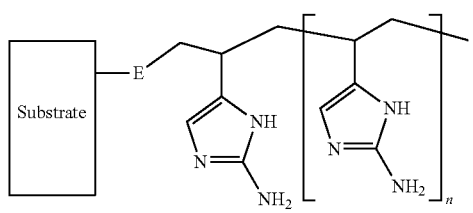

n = Integer

Compound Represented by Chemical Formula 5

An implementation of the present invention provides an aminocycloalkene compound represented by Chemical Formula 5.

<Chemical Formula 5>

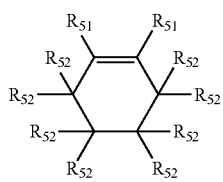

$R_{51}$ and $R_{52}$

In Chemical Formula 5, $R_{51}$s are each independently selected from the group consisting of H, —$NH_2$, halo, $C_1$-$C_6$ alkyl, $C_1$-$C_6$ alkoxy, CN, carboxyl, formyl, OH and SH, and $R_{52}$s are each independently selected from the group consisting of H, —$NH_2$, halo, $C_1$-$C_6$ alkyl, $C_1$-$C_6$ alkoxy, CN, carboxyl, formyl, OH, SH and =NH, or form a carbonyl or thiocarbonyl group together with a carbon atom connected thereto. However, (a) at least one or more of $R_{51}$s or $R_{52}$s are $NH_2$, (b) when an R$2 is $NH_2$, halo, $C_1$-$C_6$ alkyl, $C_1$-$C_6$ alkoxy, CN, carboxyl, formyl, OH or SH, another $R_{52}$ bonded to the same carbon as the first $R_{52}$ is H, and (c) when an $R_{52}$ is =NH or forms a carbonyl or thiocarbonyl group together with a carbon atom connected thereto, another $R_{52}$ bonded to the same carbon as the first $R_{52}$ does not exist.

Imine-Enamine Tautomer

In an aqueous solution of the aminocycloalkene compound represented by Chemical Formula 5 of the present invention, equilibrium between a compound in an imine (or Schiff base) form and a compound in its enamine tautomeric form is achieved. An imine-enamine tautomer is a nitrogen analog of a keto-enol tautomer. In both cases, a hydrogen atom exchange between a heteroatom and a carbon atom occurs. For example, in the case of 3-iminocyclohex-1-en-1-amine, the following equilibrium is achieved.

<Reaction Scheme 11>

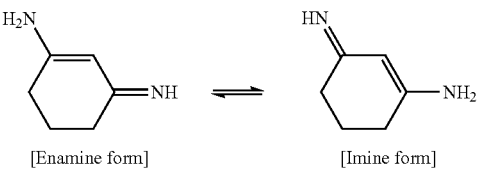

[Enamine form]   [Imine form]

Nucleophilic Reaction

An enamine tautomer exhibits a behavior similar to that of an enol, and the carbon at the alpha position exhibits nucleophilic properties. The imine-enamine tautomerism gives the imine the possibility of a reaction pathway based on the nucleophilic properties of the carbon at the alpha position. In the case of 3-iminocyclohex-1-en-1-amine as described above, the imine form exhibits higher reactivity. In this case, a nucleophile attacks the carbon at position 1 of the imine to cause a nucleophilic reaction.

<Reaction Scheme 12>

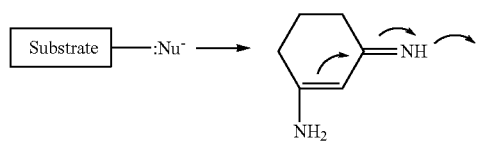

:Nu⁻ = Nucleophile

Nucleophilic Polymerization Reaction

According to the present invention, a chain polymerization reaction between compounds in an imine form takes place at the same time or before or after the nucleophilic reaction by a nucleophile on the substrate surface as described above. At this time, the imine group at position 3 acts as a nucleophile to attack the carbon at position 1 of another compound molecule in an imine form, and a nucleophilic reaction takes place. As a result of such a reaction, the surface of a substrate is modified with the compound represented by Chemical Formula 5 or a tautomer thereof, or an oligomer or (co)polymer of these as illustrated in Chemical Formula 20 below. The degree of polymerization of the polymer to be applied may be controlled by adjusting the concentration ratios of the compounds to the reaction site of the substrate. For example, the degree of polymerization of the polymer to be applied will increase as the concentration of the compound with respect to the reaction site of the substrate increases, and will decrease as the concentration of the compound with respect to the reactive site of the substrate decreases.

<Chemical Formula 20>

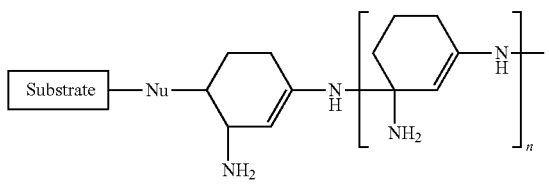

n = Integer

Electrophilic Polymerization Reaction

Meanwhile, when an electrophile exists on the substrate surface, as illustrated in Reaction Scheme 13 below, an electrophilic reaction of the electrophile with the imine group at position 3 of a compound in an imine form takes place and the compound is bonded to the substrate surface. As in the case of a nucleophilic reaction, a polymerization reaction between the compounds in an imine form also takes place, and the substrate surface is modified with the compound represented by Chemical Formula 5 or a tautomer thereof, or an oligomer or (co)polymer of these as illustrated in Chemical Formula 21 below.

Polymerization Reaction

In the case of the 5-membered aminocycloalkene compound represented by Chemical Formula 6 as well, the reaction takes place along the same pathway as that of the 6-membered aminocycloalkene compound represented by Chemical Formula 5. For example, in the case of 3-aminocyclopent-2-en-1-one, the equilibrium as illustrated in Reaction Scheme 4 is achieved, a compound in an imine form reacts with a nucleophile or electrophile on the substrate surface (Reaction Schemes 15 and 16), and the substrate surface is modified with the compound represented by Chemical Formula 6 or a tautomer thereof, or an oligomer or (co)polymer of these as illustrated in Chemical Formula 22 or 23.

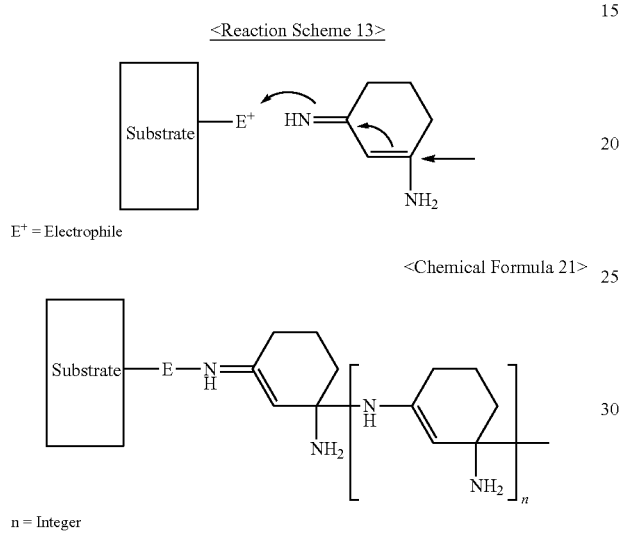

$E^+$ = Electrophile n = Integer

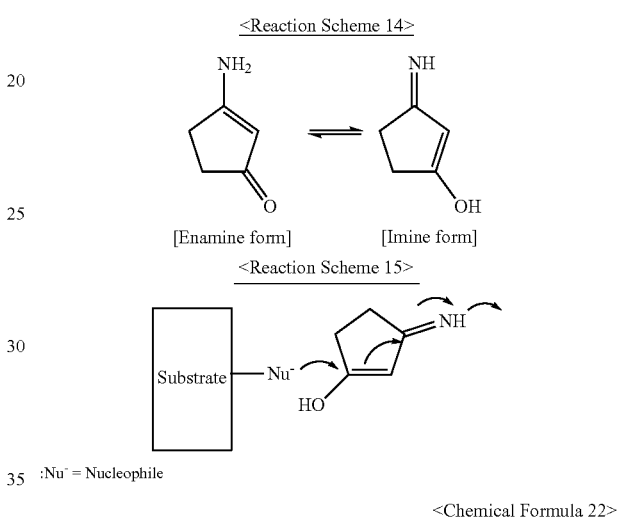

:Nu⁻ = Nucleophile

Compound Represented by Chemical Formula 6

An implementation of the present invention provides an aminocycloalkene compound represented by Chemical Formula 6.

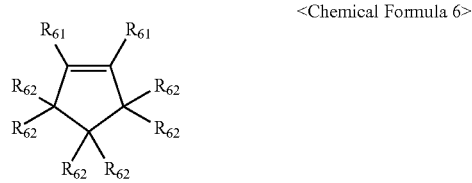

<Chemical Formula 6>

$R_{61}$ and $R_{62}$

In Chemical Formula 6, $R_{61}$s are each independently selected from the group consisting of H, $NH_2$, halo, $C_1$-$C_6$ alkyl, $C_1$-$C_6$ alkoxy, CN, carboxyl, formyl, OH and SH, and $R_{62}$s are each independently selected from the group consisting of H, $NH_2$, halo, $C_1$-$C_6$ alkyl, $C_1$-$C_6$ alkoxy, CN, carboxyl, formyl, OH, SH and =NH, or form a carbonyl or thiocarbonyl group together with a carbon atom connected thereto. However, (a) at least one or more of $R_{61}$s or $R_{62}$s are $NH_2$, (b) when an $R_{62}$ is $NH_2$, halo, $C_1$-$C_6$ alkyl, $C_1$-$C_6$ alkoxy, CN, carboxyl, formyl, OH or SH, another $R_{62}$ bonded to the same carbon as the first Roz is H, and (c) when an $R_{62}$ is =NH or forms a carbonyl or thiocarbonyl group together with a carbon atom connected thereto, another $R_{62}$ bonded to the same carbon as the first $R_{62}$ does not exist.

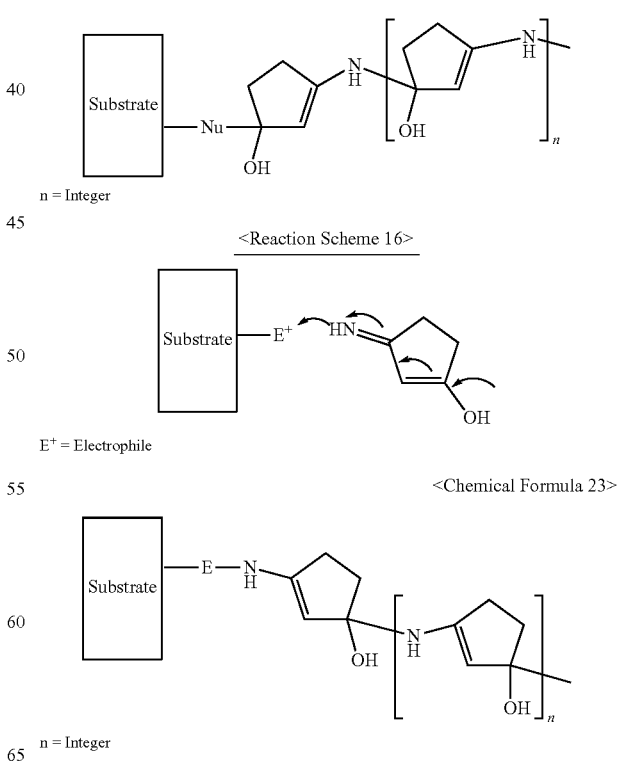

$E^+$ = Electrophile n = Integer

Compound Represented by Chemical Formula 7

An implementation of the present invention provides a vinylamino non-aromatic cyclic compound represented by Chemical Formula 7.

<Chemical Formula 7>

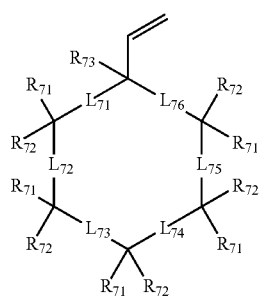

(?) indicates text missing or illegible when filed $L_{71}$ to $L_{76}$

In Chemical Formula 7, $L_{71}$ to $L_{76}$ are each independently a single bond or a double bond, and the number of double bonds among $L_{71}$ to $L_{76}$ is 0 to 2.

$R_{71}$ to $R_{73}$ $R_{71}$ and $R_{72}$ are each independently selected from the group consisting of H, $NH_2$, $=NH$, $C_1$-$C_6$ alkyl, $C_1$-$C_6$ alkoxy, halo, CN, carboxyl, formyl, OH and SH, or form a carbonyl or thiocarbonyl group together with a carbon atom connected thereto. $R_{73}$ is selected from the group consisting of H, $NH_2$, $C_1$-$C_6$ alkyl, $C_1$-$C_6$ alkoxy, halo, CN, carboxyl, formyl, OH and SH.

Single Bond/Double Bond

However, (a) two Ls adjacent to an arbitrary L that is a double bond among $L_{71}$ to $L_{76}$ are single bonds, (b) $R_{72}$ bonded to the carbon atom connected by an arbitrary L that is a double bond among $L_{71}$ to $L_{76}$ does not exist, (c) $R_{73}$ does not exist when $L_{71}$ or $L_{76}$ is a double bond, (d) when $R_{71}$ or $R_{72}$ is $=NH$ or forms a carbonyl or thiocarbonyl group together with the carbon atom connected thereto, $R_{71}$ or $R_{72}$ connected to such a carbon atom does not exist, and (e) at least one or more of $R_{71}$ to $R_{73}$ are $NH_2$.

Nucleophilic Reaction

The vinyl group of the vinylamino non-aromatic cyclic compound represented by Chemical Formula 7 of the present invention provides a pathway for inducing a nucleophilic reaction by a nucleophile on the substrate surface. For example, in the case of 1-amino-4-ethenylcyclohexane, a nucleophilic reaction between a nucleophile on the substrate surface and the vinyl group takes place as illustrated in Reaction Scheme 17 below.

<Reaction Scheme 17>

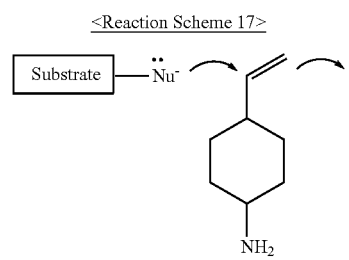

$Nu^-$ = Nucleophile

Nucleophilic Polymerization Reaction

According to the present invention, a chain polymerization reaction between vinylamino non-aromatic cyclic compounds takes place at the same time or before or after the nucleophilic reaction by a nucleophile on the substrate surface as described above. In other words, the vinyl group acts as a nucleophile to attack the vinyl group of another vinylamino non-aromatic cyclic compound molecule, and a nucleophilic reaction takes place. As a result of such a reaction, the surface of a substrate is modified with the compound represented by Chemical Formula 7 or an oligomer or (co)polymer thereof as illustrated in Chemical Formula 24 below. The degree of polymerization of the polymer to be applied may be controlled by adjusting the concentration ratios of the compounds to the reaction site of the substrate. For example, the degree of polymerization of the polymer to be applied will increase as the concentration of the compound with respect to the reaction site of the substrate increases, and will decrease as the concentration of the compound with respect to the reactive site of the substrate decreases.

<Chemical Formula 24>

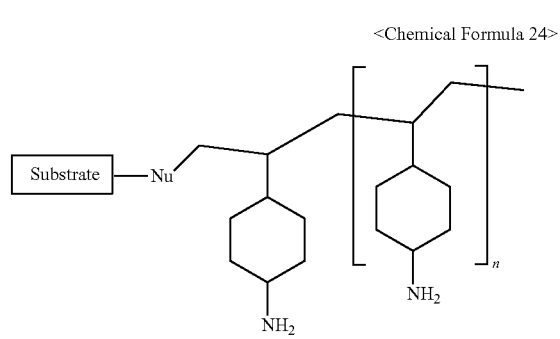

n = Integer

Electrophilic Polymerization Reaction

Meanwhile, when an electrophile exists on the substrate surface, as illustrated in Reaction Scheme 18 below, an electrophilic reaction of the electrophile with the vinyl group takes place and the compound is bonded to the substrate surface. As in the case of a nucleophilic reaction, a polymerization reaction between the amino non-aromatic cyclic compounds having a vinyl group also takes place, and the substrate surface is modified with the compound represented by Chemical Formula 7 or an oligomer or (co)polymer thereof as illustrated in Chemical Formula 25 below.

<Reaction Scheme 18>

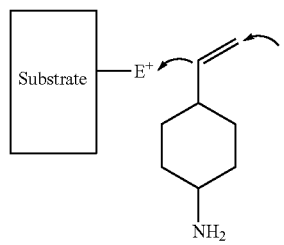

$E^+$ = Electrophile

-continued

<Chemical Formula 25>

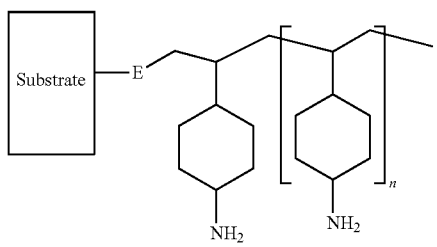

n = Integer

Compound Represented by Chemical Formula 8

An implementation of the present invention provides a vinylamino non-aromatic cyclic compound represented by Chemical Formula 8.

<Chemical Formula 8>

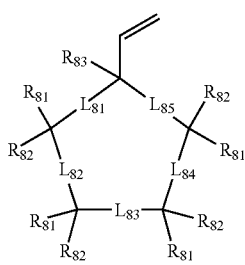

$L_{81}$ to $L_{85}$

In Chemical Formula 8, $L_{81}$ to $L_{82}$ are each independently a single bond or a double bond, and the number of double bonds among $L_{81}$ to $L_{82}$ is 0 to 1.

$R_{81}$ to $R_{83}$ $R_{81}$ and $R_{82}$ are each independently selected from the group consisting of H, $NH_2$, =NH, $C_1$-$C_6$ alkyl, $C_1$-$C_6$ alkoxy, halo, CN, carboxyl, formyl, OH and SH, or form a carbonyl or thiocarbonyl group together with a carbon atom connected thereto. $R_{83}$ is selected from the group consisting of H, $NH_2$, $C_1$-$C_6$ alkyl, $C_1$-$C_6$ alkoxy, halo, CN, carboxyl, formyl, OH and SH.

Single Bond/Double Bond

However, (a) two Ls adjacent to an arbitrary L that is a double bond among $L_{81}$ to $L_{85}$ are single bonds, (b) $R_{82}$ bonded to the carbon atom connected by an arbitrary L that is a double bond among $L_{81}$ to $L_{85}$ does not exist, (c) $R_{83}$ does not exist when $L_{81}$ or $L_{85}$ is a double bond, (d) when $R_{81}$ or $R_{82}$ is =NH or forms a carbonyl or thiocarbonyl group together with the carbon atom connected thereto, $R_{81}$ or $R_{82}$ connected to such a carbon atom does not exist, and (e) at least one or more of $R_{81}$ to $R_{83}$ are $NH_2$.

Polymerization Reaction

In the case of the 5-membered vinylamino non-aromatic cyclic compound represented by Chemical Formula 8 as well, the reaction takes place along the same pathway as that of the 6-membered vinylamino non-aromatic cyclic compound represented by Chemical Formula 7. For example, in the case of 1-amino-3-ethenylcyclopentane, the vinyl group of the compound reacts with a nucleophile or electrophile on the substrate surface, and the substrate surface is modified with the compound represented by Chemical Formula 8 or an oligomer or (co)polymer thereof as illustrated in Chemical Formula 26 or 27.

<Reaction Scheme 19>

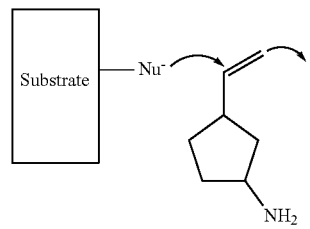

Nu⁻ = Nucleophile

<Reaction Scheme 20>

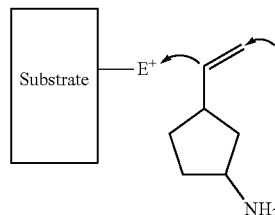

E⁺ = Electrophile

<Chemical Formula 26>

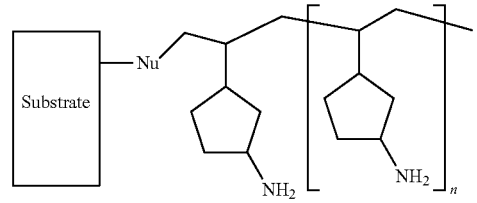

n = Integer

<Chemical Formula 27>

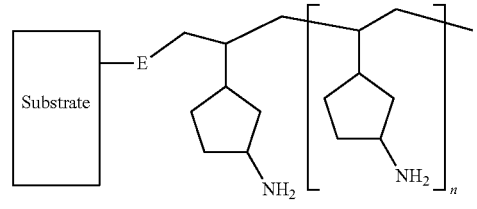

n = Integer

Compound Represented by Chemical Formula 9

An implementation of the present invention provides furfurylamine represented by Chemical Formula 9.

<Chemical Formula 9>

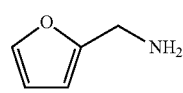

Polymerization Reaction

The furfurylamine represented by Chemical Formula 9 is expected to undergo a chain polymerization reaction between the furfurylamine molecules at the same time or before or after the nucleophilic reaction by a nucleophile on the substrate surface. It is presumed that the polymerization reaction between furfurylamines follows the Diels-Alder reaction pathway as predicted from the structure. In the copolymerization reaction between furfurylamine and another compound having a double bond as well, the main reaction pathway is the Diels-Alder reaction between the two double bonds of the furan ring of furfurylamine and the double bond of another compound. However, these predicted reaction pathways are only intended to aid the understanding of the present invention, and the scope of the present invention is not restricted or particularly limited by the reaction pathway itself.

Compound Represented by Chemical Formula 10

An implementation of the present invention provides an unsaturated acyclic amine compound represented by Chemical Formula 10.

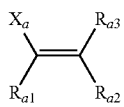

<Chemical Formula 10>

$X_a$

In Chemical Formula 10, $X_a$ is —$NH_2$, —N=CH—OH, or —N=O.

$R_{a1}$ to $R_{a3}$ $R_{a1}$ is hydrogen, $C_1$-$C_6$ alkyl, or —CN, and $R_{a2}$ and $R_{a3}$ are each independently a substituent selected from the group consisting of hydrogen, $C_1$-$C_6$ alkyl, —CN, —OH, —$NH_2$, —NH—OH, —C(O)$R_{a4}$ and —C(O)O$R_{a5}$ (where $R_{a4}$ and $R_{a5}$ are hydrogen or $C_1$-$C_6$ alkyl).

Polymerization Reaction

According to the present invention, the unsaturated acyclic amine compound is expected to undergo a chain polymerization reaction between the unsaturated acyclic amine compounds at the same time or before or after the nucleophilic reaction by a nucleophile on the substrate surface (see Reaction Schemes 21 to 22 below). However, these predicted reaction pathways are only intended to aid the understanding of the present invention, and the scope of the present invention is not restricted or particularly limited by the reaction pathway itself.

<Reaction Scheme 21>

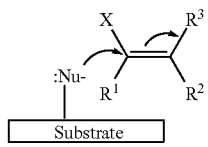

:Nu⁻ = Nucleophile

<Reaction Scheme 22>

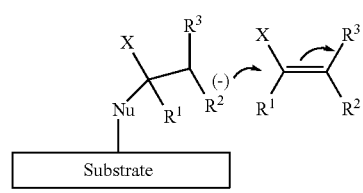

:Nu⁻ = Nucleophile

<Chemical Formula 28>

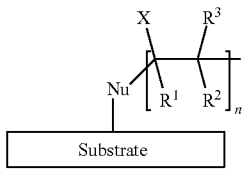

n = Integer

Compound Represented by Chemical Formula 11

An implementation of the present invention provides an amine compound represented by Chemical Formula 11.

<Chemical Formula 11>

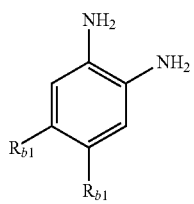

$R_{b1}$

In Chemical Formula 11, $R_{b1}$ is a substituent selected from the group consisting of H, $NH_2$, and NH-acyl.

Imine-Enamine Tautomer

In an aqueous solution of the compound represented by Chemical Formula 11 of the present invention, equilibrium between a compound in an imine (or Schiff base) form and a compound in its enamine tautomeric form is achieved. An imine-enamine tautomer is a nitrogen analog of a keto-enol tautomer. In both cases, a hydrogen atom exchange between a heteroatom and a carbon atom occurs. For example, the following equilibrium is achieved.

<Reaction Scheme 24>

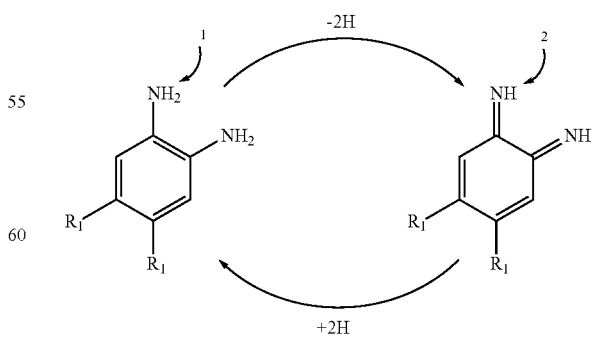

$R_1$ = H, $NH_2$, NH—acyl

Nucleophilic Reaction

An enamine tautomer exhibits a behavior similar to that of an enol, and the carbon at the alpha position exhibits nucleophilic properties. The imine-enamine tautomerism gives the imine the possibility of a reaction pathway based on the nucleophilic properties of the carbon at the alpha position. An enamine form as described above exhibits stronger aromatic properties than an imine form and is thus more stable than an imine form. Hence, the reactivity of imine is higher as the tautomerization equilibrium ratio of imine:enamine is smaller. In this case, a nucleophile attacks carbon of the imine to cause a nucleophilic reaction as illustrated in Reaction Scheme 25 below.

<Reaction Scheme 25>

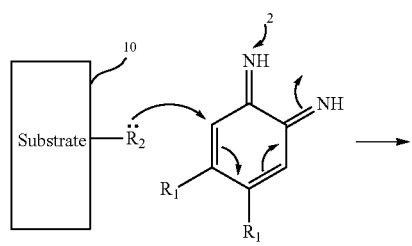

$R_2$: Nucleophile

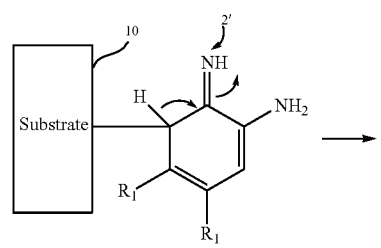

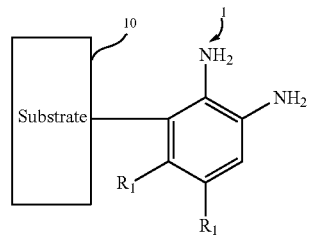

Nucleophilic Polymerization Reaction

According to the present invention, a chain polymerization reaction between compounds in an imine form takes place at the same time or before or after the nucleophilic reaction by a nucleophile on the substrate surface as described above. At this time, the imine group at position 4 acts as a nucleophile to attack the carbon at position 2 of another compound molecule in an imine form, and a nucleophilic reaction takes place. As a result of such a reaction, the surface of a substrate is modified with the compound represented by Chemical Formula 11 or a tautomer thereof, or an oligomer or (co)polymer of these as illustrated in Chemical Formula 11 below. The degree of polymerization of the polymer to be applied may be controlled by adjusting the concentration ratios of the compounds to the reaction site of the substrate. For example, the degree of polymerization of the polymer to be applied will increase as the concentration of the compound with respect to the reaction site of the substrate increases, and will decrease as the concentration of the compound with respect to the reactive site of the substrate decreases.

<Chemical Formula 29>

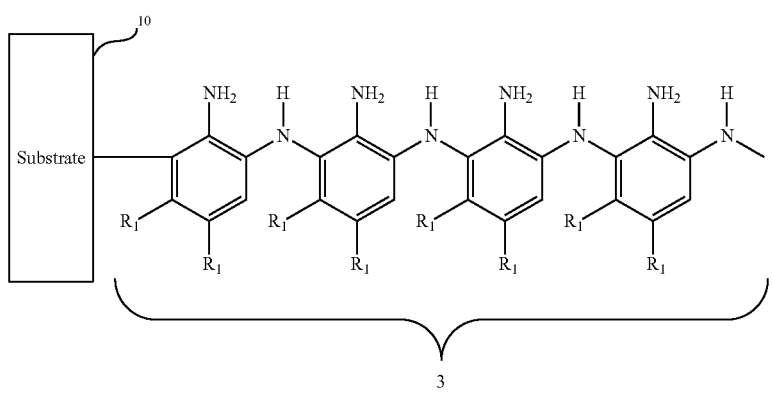

Electrophilic Polymerization Reaction

Meanwhile, when an electrophile exists on the substrate surface, as illustrated in Reaction Scheme 26 below, an electrophilic reaction of the electrophile with the imine group at position 4 of a compound in an imine form takes place and the compound is bonded to the substrate surface. As in the case of a nucleophilic reaction, a polymerization reaction between the compound molecules in an imine form also takes place, and the substrate surface is modified with the compound represented by Chemical Formula 11 or a tautomer thereof, or an oligomer or (co)polymer of these as illustrated in Chemical Formula 30 below.

<Reaction Scheme 26>

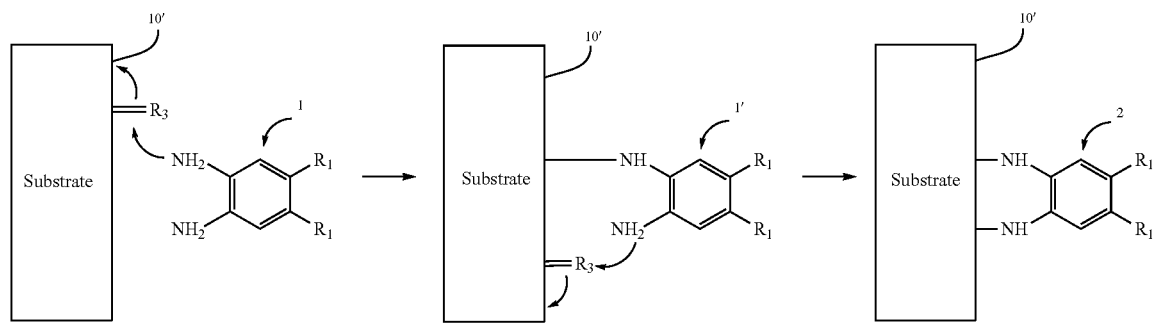

$R_3$: Electrophile

<Chemical Formula 30>

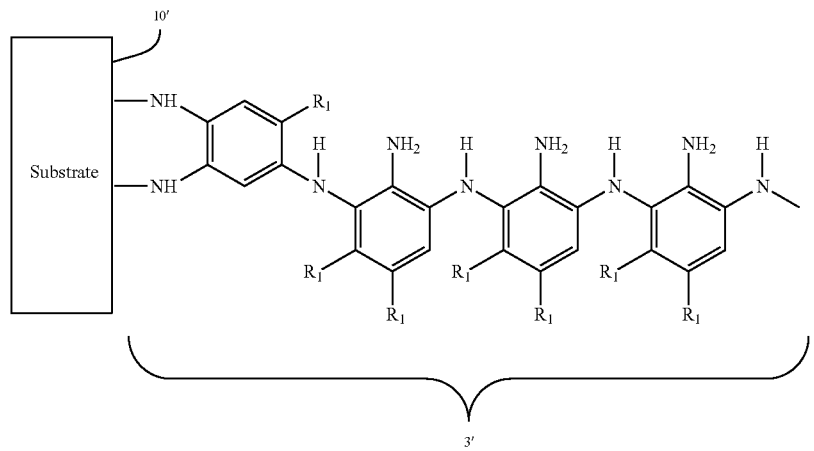

Other Monomer Compounds

There are compounds having an amino group, which do not belong to Chemical Formulas 1 to 11 but may be used as a monomer in a method of coating the surface of a substrate, and these are referred to as "other monomer compounds." Other monomer compounds may be used together with or instead of the compounds represented by Chemical Formulas 1 to 11 of the present specification.

Examples of Monomer Compounds

Each of the compounds represented by Chemical Formulas 1 to 11 and other monomer compounds may be one or more selected from the group consisting of compounds listed in Table 1 below.

TABLE 1

| Kind | Compound No. | Compound name |
|---|---|---|
| Chemical Formula 1 | 1 | 2-aminopyridine |
|  | 2 | 2,3-diaminopyridine |
|  | 3 | 2,4-diaminopyridine |
|  | 4 | 2,5-diaminopyridine |
|  | 5 | 2,6-diaminopyridine |
|  | 6 | 3,4-diaminopyridine |
|  | 7 | 3,5-diaminopyridine |
|  | 8 | 3,5-diamino-1,4-dihydropyridine |

TABLE 1-continued

| Kind | Compound No. | Compound name |
|---|---|---|
|  | 9 | 2,3,4-triaminopyridine |
|  | 10 | 2,3,5-triaminopyridine |
|  | 11 | 2,3,6-triaminopyridine |
|  | 12 | 2,4,6-triaminopyridine |
|  | 13 | 3,4,5-triaminopyridine |
|  | 14 | 2,3,4,5-tetraaminopyridine |
|  | 15 | 2,3,4,6-tetraaminopyridine |
|  | 16 | 2,3,5,6-tetraaminopyridine |
|  | 17 | 4,5-diaminopyrimidine |
|  | 18 | 4,6-diaminopyrimidine |
|  | 19 | 2,5-diaminopyrimidine |

TABLE 1-continued

| Kind | Compound No. | Compound name |
|---|---|---|
| | 20 | 2,4,5-triaminopyrimidine |
| | 21 | 2,4,6-triaminopyrimidine |
| | 22 | 4,5,6-triaminopyrimidine |
| | 23 | 2,4,5,6-tetraaminopyrimidine |
| | 24 | 4-amino-2,3-dihydropyrimidine |
| | 25 | 1,5,6-triamino-1,2-dihydropyrimidine |
| | 26 | 2,4-diamino-1,6-dihydro-1,3,5-triazine |
| | 27 | 1,2-diamino-1,2-dihydropyridine |
| | 28 | 3-amino-1,2-dihydropyridine |
| | 29 | 2-amino-3-formylpyridine |
| | 30 | 2-amino-3-hydroxypyridine |
| | 31 | 4-amino-2-oxo-1,2-dihydro-pyrimidine-5-carboxylic acid |
| | 32 | tert-butyl 4-amino-2-oxo-5,6-dihydropyridine-1(2H)-carboxylate |
| | 33 | 5-Aminopyridine-2-carboxylic acid |
| | 34 | 3-amino-4-chloro-2H-pyran-2-one |
| | 35 | 3-amino-4-hydroxy-2H-pyran-2-one |
| | 36 | 3-amino-4-methoxy-2H-pyran-2-one |
| | 37 | 3-aminopyridine-2-carboxamide |
| Chemical Formula 2 | 38 | 2,5-diamino-1H-imidazole |
| | 39 | 1,5-diamino-1H-imidazole |
| | 40 | 1,2-diamino-1H-imidazole |
| | 41 | 2,5-diamino-1H-pyrrole |
| | 42 | 1,2,5-triamino-1H-pyrrole |
| | 43 | 1,3-diamino-1H-pyrrole |
| | 44 | 5-amino-2H-pyrrole |
| | 45 | 4-amino-2H-imidazole |
| | 46 | 2-amino-2H-imidazole |
| | 47 | 2-amino-4,5-dihydro-1H-pyrrole |
| | 48 | 2,5-diamino-2,5-dihydro-1H-pyrrole |
| | 49 | 1-amino-2,5-dihydro-1H-pyrrole |
| | 50 | 2,3-diamino-1H-pyrrol-1-ol |
| | 51 | 4-amino-N-methyl-N-(prop-2-en-1-yl)-1H-pyrrole-2-carboxamide |
| | 52 | 4-amino-2-oxo-6-sulfanyl-2H-thiopyran-5-carboxamide |
| | 53 | 5-amino-3,4-dihydro-2H-pyrrole-2-carboxylic acid |
| | 54 | 5-amino-3-(3-hydroxypropyl)-1H-pyrazole-4-carbonitrile |
| | 55 | 5-amino-3-propyl-1H-pyrazole-4-carbonitrile |
| | 56 | 3-amino-5-ethyl-1H-pyrazole-4-carbonitrile |
| | 57 | 5-amino-3-methyl-1H-pyrazole-4-carbonitrile |
| | 58 | 5-aminofuran-2-carboxylic acid |
| | 59 | 1-(5-aminothiophen-2-yl)ethan-1-one |
| | 60 | 5-aminofuran-2-carbaldehyde |
| | 61 | 5-aminothiophene-2-thiol |
| | 62 | Methyl 2-aminofuran-3-carboxylate |
| | 63 | 2-aminothiophene-3-carbonitrile |
| | 64 | 1H-pyrazole-3-amine |
| | 65 | 4-chloro-1H-pyrazole-3-amine |
| | 66 | 3-amino-1H-pyrazol-4-ol |
| | 67 | 5-amino-1H-pyrazole-4-carbonitrile |
| | 68 | 5-amino-1H-pyrazole-4-thiol |
| | 69 | 1H-pyrazole-4,5-diamine |
| | 70 | 5-amino-1H-pyrazole-4-carbaldehyde |
| | 71 | 5-amino-1H-pyrazole-4-carboxylic acid |
| | 72 | 5-amino-1H-pyrazole-4-carboxamide |
| | 73 | 1-(5-amino-1H-pyrazol-4-yl)ethan-1-one |
| | 74 | 4-methoxy-1H-pyrazol-5-amine |
| | 75 | 4-nitro-1H-pyrazol-5-amine |
| | 76 | 1,2-oxazol-3-amine |
| | 77 | 4-chloro-1,2-oxazol-3-amine |
| | 78 | 4-hydroxy-1,2-oxazol-3-amine |
| | 79 | 4-cyano-1,2-oxazol-3-amine |
| | 80 | 4-sulfhydro-1,2-oxazol-3-amine |
| | 81 | 1,2-oxazol-3,4-diamine |
| | 82 | 4-formyl-1,2-oxazol-3-amine |
| | 83 | 3-amino-1,2-oxazole-4-carboxylic acid |
| | 84 | 4-amido-1,2-oxazol-3-amine |
| | 85 | 4-methoxo-1,2-oxazol-3-amine |
| | 86 | 4-methoxy-1,2-oxazol-3-amine |
| | 87 | 4-nitro-1,2-oxazol-3-amine |
| | 88 | 1,3-oxazol-2-amine |
| | 89 | 5-chloro-1,3-oxazol-2-amine |
| | 90 | 5-hydroxy-1,3-oxazol-2-amine |
| | 91 | 5-cyano-1,3-oxazol-2-amine |
| | 92 | 5-sulfhydro-1,3-oxazol-2-amine |
| | 93 | 1,3-oxazol-2,5-diamine |
| | 94 | 2-amino-1,3-oxazol-5-carbaldehyde |
| | 95 | 2-amino-1,3-oxazol-5-carboxylic acid |
| | 96 | 2-amino-5-methyl-4,5-dihydro-1,3-oxazol-4-one |
| | 97 | 5-methoxy-1,3-oxazol-2-amine |
| | 98 | 5-nitro-1,3-oxazol-2-amine |
| | 99 | 1,2-thiazol-3-amine |
| | 100 | 4-chloro-1,2-thiazol-3-amine |
| | 101 | 4-hydroxy-1,2-thiazol-3-amine |
| | 102 | 4-cyano-1,2-thiazol-3-amine |
| | 103 | 4-sulfhydro-1,2-thiazol-3-amine |
| | 104 | 1,2-thiazol-3,4-diamine |
| | 105 | 4-formyl-1,2-thiazol-3-amine |
| | 106 | 3-amino-1,2-thiazole-4-carboxylic acid |
| | 107 | 4-amido-1,2-thiazol-3-amine |
| | 108 | 4-methoxo-1,2-thiazol-3-amine |
| | 109 | 4-methoxy-1,2-thiazol-3-amine |
| | 110 | 4-nitro-1,2-thiazol-3-amine |
| | 111 | 1,3-thiazol-2-amine |
| | 112 | 5-chloro-1,3-thiazol-2-amine |
| | 113 | 4-hydroxy-1,3-thiazol-2-amine |
| | 114 | 4-cyano-1,3-thiazol-2-amine |
| | 115 | 4-sulfhydro-1,3-thiazol-2-amine |
| | 116 | 1,3-thiazol-2,4-diamine |
| | 117 | 2-amino-1,3-thiazole-4-carbaldehyde |
| | 118 | 2-amino-1,3-thiazole-4-carboxylic acid |
| | 119 | 4-amido-1,3-thiazole-2-amine |
| | 120 | 4-methoxo-1,3-thiazole-2-amine |
| | 121 | 4-methoxy-1,3-thiazole-2-amine |
| | 122 | 4-nitro-1,3-thiazole-2-amine |
| Chemical Formula 3 | 123 | 2-vinylpyridine |
| | 124 | 4-vinylpyridine |
| | 125 | 4-amino-2-ethenylpyridine |
| | 126 | 2,4-diamino-6-ethenylpyrimidine |
| | 127 | 2,6-diamino-4-ethenylpyridine |
| | 128 | 3,5-diamino-4-ethenylpyridine |
| | 129 | 2,3-diamino-4-ethenylpyridine |
| | 130 | 2,3-diamino-6-ethenylpyridine |
| | 131 | 6-amino-3-ethenylpyridin-2-ol |
| | 132 | 3-(6-aminopyridin-3-yl)prop-2-enoic acid |
| | 133 | 4-amino-2-chloro-3-ethenylpyridine |
| | 134 | 4-amino-3-ethenyl-2-hydroxypyridine |
| | 135 | 4-amino-3-ethenylpyridine |
| | 136 | 4-amino-5-ethenyl-2-methoxypyridine |
| | 137 | 4-amino-3-ethenyl-5-nitropyridine |
| | 138 | 4-amino-2-ethenylpyridine-3-carboxylic acid |
| | 139 | methyl 4-amino-6-chloro-3-ethenylpyridine-2-carboxylate |
| | 140 | 1-(4-amino-6-ethenylpyridin-3-yl)ethan-1-one |
| | 141 | 3-sulfhydro-4-ethenylpyridine-2-amine |
| | 142 | 3-amido-4-ethenylpyridine-2-amine |
| | 143 | 3-cyano-4-ethenylpyridine-2-amine |
| | 144 | 3-formyl-4-ethenylpyridine-2-amine |
| Chemical Formula 4 | 145 | 1-amino-3-iminocyclohex-1-ene |
| | 146 | 3-amino-2-cyclohexen-1-one |
| | 147 | 1,2-diamino-cyclohex-1-ene |
| | 148 | 1,4-diamino-cyclohex-1-ene |
| | 149 | 1,2-diamino-cyclohex-4-ene |
| | 150 | 1,2-diamino-cyclohex-3-ene |
| | 151 | 1,4-diamino-cyclohex-2-ene |
| | 152 | 3-amino-2-cyclohexen-1-thione |
| | 153 | 5-amino-3,6-dihydro-2H-thiopyran-3-one |
| | 154 | 5-amino-3,6-dihydro-2H-pyran-3-one |
| | 155 | 4-ethenyl-1H-pyrazole-5-amine |
| | 156 | 4-ethenyl-1,2-thiazol-3-amine |
| | 157 | 3-thenyl-1,2-thiazole |
| | 158 | 5-ethenyl-1,3-thiazol-2-amine |
| | 159 | 5-ethenyl-1,2-oxazole |
| | 160 | 5-ethenyl-3-methyl-1,2-oxazole |

TABLE 1-continued

| Kind | Compound No. | Compound name |
|---|---|---|
| | 161 | 5-(2-methylprop-1-en-1-yl)-1,2-oxazole |
| | 162 | 5-(prop-1-en-2-yl)-1,2-oxazol-4-amine |
| | 163 | 5-(prop-1-en-2-yl)-1,2-oxazol-3-amine |
| | 164 | (1E)-2-(3-chloro-1,2-oxazol-5-yl)ethen-1-amine |
| | 165 | 2-(3-chloro-1,2-oxazol-5-yl)ethen-1-amine |
| | 166 | 5-(2-bromoethenyl)-3-methyl-1,2-oxazole |
| | 167 | 3-methyl-5-(2-methylprop-1-en-1-yl)-1,2-oxazole |
| | 168 | Dimethyl[(1E)-2-(1,2-oxazol-5-yl)ethenyl]amine |
| Chemical Formula 5 | 169 | 1-amino-3-iminocyclohex-1-ene |
| | 170 | 3-amino-2-cyclohexen-1-one |
| | 171 | 1,2-diamino-cyclohex-1-ene |
| | 172 | 1,4-diamino-cyclohex-1-ene |
| | 173 | 1,2-diamino-cyclohex-4-ene |
| | 174 | 1,2-diamino-cyclohex-3-ene |
| | 175 | 9-aminospiro[4.5]dec-8-en-7-one |
| | 176 | 2H,3H,4H,5H,6H,7H-furo[2,3-b]pyridin-3-one |
| Chemical Formula 6 | 177 | 3-amino-2-cyclopenten-1-one |
| | 178 | 5-amino-2,3-dihydrofuran-3-one |
| | 179 | 5-amino-4-methyl-2,3-dihydrofuran-3-one |
| | 180 | 5-amino-2,2-dimethyl-2,3-dihydrofuran-3-one |
| | 181 | 2-amino-4-oxo-4,5-dihydrofuran-3-carbonitrile |
| Chemical Formula 7 | 182 | 1-amino-4-ethenylcyclohexane |
| | 183 | 1,4-diamino-1-ethenylcyclohexane |
| | 184 | 2-amino-5-ethenylcyclohexan-1-ol |
| | 185 | 1-amino-4-ethenylcyclohex-3-ene |
| | 186 | 1-amino-1-ethenylcyclohex-2-ene |
| Chemical Formula 8 | 187 | 1-amino-3-ethenylcyclopentane |
| | 188 | 1-amino-1-ethenylcyclopentane |
| | 189 | 2-amino-1-ethenylcyclopentan-1-ol |
| | 190 | 1-amino-1-ethenylcyclopent-2-ene |
| | 191 | 3-amino-5-ethenyl-5-hydroxycyclopent-2-en-1-one |
| Chemical Formula 9 | 192 | Furfurylamine |
| Chemical Formula 10 | 193 | (3E/Z)-4-aminopent-3-en-2-one |
| | 194 | (2E/Z)-3-(dimethylamino)-2-methylprop-2-enal |
| | 195 | Diaminomaleonitrile |
| | 196 | Ethyl 3-aminocrotonate |
| | 197 | Methyl 3-aminocrotonate |
| | 198 | N-[(2E)-3-nitrosobut-2-en-2-yl]hydroxylamine |
| | 199 | Methyl[1-(methylsulfanyl)-2-nitroethenyl]amine |
| | 200 | 3-Aminocrotononitrile |
| | 201 | N-Vinylformamide |
| Chemical Formula 11 | 202 | 1,2-diaminobenzene |
| | 203 | 1,2,4,5-tetraaminobenzene (PTAB) |
| Others (other monomer compounds) | 204 | 1,3-diaminobenzene |
| | 205 | 1,4-diaminobenzene |
| | 206 | 4-(prop-2-en-1-yl)-4H-1,2,4-triazol-3-amine |
| | 207 | 5-amino-3-chloro-4-(prop-2-en-1-yl)-4H-1,2,4-triazole |
| | 208 | 5-amino-3-hydroxy-4-(prop-2-en-1-yl)-4H-1,2,4-triazole |
| | 209 | 5-amino-4-(prop-2-en-1-yl)-4H-1,2,4-triazole-3-carbonitrile |
| | 210 | 5-amino-4-(prop-2-en-1-yl)-4H-1,2,4-triazole-3-thiol |
| | 211 | 4-(prop-2-en-1-yl)-4H-1,2,4-triazol-3,5-diamine |
| | 212 | 5-amino-4-(prop-2-en-1-yl)-4H-1,2,4-triazole-3-carbaldehyde |
| | 213 | 5-amino-4-(prop-2-en-1-yl)-4H-1,2,4-triazole-3-carboxylic acid |
| | 214 | 3-amido-5-amino-4-(prop-2-en-1-yl)-4H-1,2,4-triazole |
| | 215 | 5-amino-3-methoxo-4-(prop-2-en-1-yl)-4H-1,2,4-triazole |
| | 216 | 5-amino-3-methoxy-4-(prop-2-en-1-yl)-4H-1,2,4-triazole |
| | 217 | 5-amino-3-nitro-4-(prop-2-en-1-yl)-4H-1,2,4-triazole |
| | 218 | 7-iodopyrazolo[1,5-a]pyrazin-4-amine |
| | 219 | 3-(3-iodo-1-methyl-1H-pyrazol-5-yl)pyrazin-2-amine |
| | 220 | 5-(4-iodo-1H-pyrazol-1-yl)-1,3-thiazol-2-amine |
| | 221 | 4-iodo-5-(pyridazin-3-yl)-1,2-oxazol-3-amine |
| | 222 | 7-iodo-[1,2]oxazolo[4,5-b]pyridin-3-amine |
| | 223 | 5-(5-iodo-1-methyl-1H-pyrazol-4-yl)-1,2-oxazol-3-amine |
| | 224 | 9-aminospiro[4.5]dec-8-en-7-one |
| | 225 | 2H,3H,4H,5H,6H,7H-furo[2,3-b]pyridin-3-one |
| | 226 | 5-(aminomethyl)-3-chlorofuran |
| | 227 | 5-(aminomethyl)-3-hydroxofuran |
| | 228 | 5-(aminomethyl)-3-cyanofuran |
| | 229 | 5-(aminomethyl)-3-sulfhydrofuran |
| | 230 | 5-(aminomethyl)-3-aminofuran |
| | 231 | 5-(aminomethyl)-3-formylfuran |
| | 232 | 5-(aminomethyl)-3-carboxofuran |
| | 233 | 5-(aminomethyl)-3-amidofuran |
| | 234 | 5-(aminomethyl)-3-methoxofuran |
| | 235 | 5-(aminomethyl)-3-methoxyfuran |
| | 236 | 5-(aminomethyl)-3-nitrofuran |
| | 237 | 1-[4-(prop-2-en-1-yl)furan-2-yl]methanamine |
| | 238 | 1-[3-chloro-4-(prop-2-en-1-yl)furan-2-yl]methanamine |
| | 239 | 1-[3-hydroxo-4-(prop-2-en-1-yl)furan-2-yl]methanamine |
| | 240 | 1-[3-cyano-4-(prop-2-en-1-yl)furan-2-yl]methanamine |
| | 241 | 1-[3-sulfhydro-4-(prop-2-en-1-yl)furan-2-yl]methanamine |
| | 242 | 1-[3-amino-4-(prop-2-en-1-yl)furan-2-yl]methanamine |
| | 243 | 1-[3-formyl-4-(prop-2-en-1-yl)furan-2-yl]methanamine |
| | 244 | 1-[3-carboxo-4-(prop-2-en-1-yl)furan-2-yl]methanamine |
| | 245 | 1-[3-amido-4-(prop-2-en-1-yl)furan-2-yl]methanamine |
| | 246 | 1-[3-methoxo-4-(prop-2-en-1-yl)furan-2-yl]methanamine |
| | 247 | 1-[3-methoxy-4-(prop-2-en-1-yl)furan-2-yl]methanamine |
| | 248 | 1-[3-nitro-4-(prop-2-en-1-yl)furan-2-yl]methanamine |

II. SUBSTRATE

As illustrated above, the compounds represented by Chemical Formulas 1 to 11 can be polymerized by both nucleophilic and electrophilic reactions, and can thus react with substrates having either nucleophiles or electrophiles on the surface to undergo a polymerization reaction. Hence, the compounds represented by Chemical Formulas 1 to 11 may react with the surface of various substrates to form a polymer layer on the surface. Such substrates may be glass, wood, stones, metals, ceramics, natural or synthetic polymers, and the like, but are not particularly limited to this list.

Metal Substrate

The substrate may be one or more selected from the group consisting of iron, copper, aluminum, zinc, tin, silver, gold, titanium, tungsten, nickel, molybdenum, cobalt, magnesium, and alloys thereof.

Ceramic Substrate

The substrate may be one or more selected from the group consisting of zinc oxide, zirconium oxide, titanium oxide, aluminum borate, iron oxide, calcium carbonate, barium carbonate, lead oxide, tin oxide, cerium oxide, lithium oxide, calcium oxide, magnesium oxide, trimanganese tetroxide, niobium oxide, tantalum oxide, tungsten oxide, antimony oxide, aluminum phosphate, calcium silicate, zirconium silicate, ITO (tin-containing indium oxide), titanium silicate, barium titanate, strontium titanate, calcium titanate, montmorillonite, saponite, vermiculite, hydrotalcite, kaolinite, kanemite, margadiite, kenyaite, silica, alumina, zeolite, lithium nitride, lithium silicate, lithium borate, lithium aluminate, lithium phosphate, lithium phosphorus oxynitride, lithium silicon sulfide, lithium lanthanum oxide, lithium titanium oxide, lithium borosulfide, lithium aluminosulfide, lithium phosphosulfide, and aluminum titanium oxide.

Natural Polymer Substrate

The substrate may be one or more selected from the group consisting of starch, cellulose, chitosan, chitin, gelatin, pectin, carrageenan, dextran, collagen, hyaluronic acid, alginate, gluten, fibrin, and agarose.

Synthetic Polymer Substrate

The substrate may be a general-purpose thermoplastic polymer, thermosetting polymer, engineering polymer, elastomer or the like. For example, the substrate may be one or more selected from the group consisting of polyolefins including polyethylene, polypropylene, polymethylpentene, polybutene-1, and the like; polyolefin elastomers including polyisobutylene, ethylene-propylene rubber, ethylene-propylene-diene rubber (EPDM), and the like; halogenated polyolefins including polyvinyl chloride, polyvinylidene chloride, polychlorotrifluoroethylene, polyvinylidene fluoride, polytetrafluoroethylene, and the like; polystyrene, polyvinyl alcohol, polyacetal, polyvinyl acetate, polyacrylonitrile, polybutadiene, polyisoprene, phenol resins, epoxy resins, polyamide, polyesters including polyethylene terephthalate and polybutylene terephthalate; polyimide, polyamideimide, polyetherimide, polyacrylate, polyurethane, polysiloxane, polynaphthalene, polythiophene, polyaniline, polyparaphenylene sulfide, polychloroprene, styrene-butadiene rubber, nitrile rubber, silicone rubber, and copolymers thereof.

Shape of Substrate

The substrate may also be in the form of a film, a powder, a bead, a plate, a rod, a tube, or an arbitrary three-dimensional shape. In addition, it is also possible to modify only a part of the substrate by bringing only the part of the substrate into contact with any compound represented by Chemical Formulas 1 to 11, if necessary.

III. FORMATION OF POLYMER LAYER ON SUBSTRATE SURFACE

As described above, the compounds represented by Chemical Formulas 1 to 11 may react with and be bonded to the substrate surface and form a polymer layer on the substrate surface by a chain polymerization reaction. A polymer layer formed on the substrate surface may change the properties (for example, hydrophilicity) of the substrate surface, and thus a certain substrate may be modified to be more suitable for certain use. In addition, since the compound is bonded to the substrate surface as a monomer unit to form a polymer layer, defects such as small cavities or cracks in the substrate may also be filled and physical properties such as water vapor transmission property and strength of the substrate may also be improved. In addition, since the compound is chemically bonded to the substrate surface, it is not required to use an adhesive, and the polymer layer is more firmly bonded to the substrate surface and is less likely to peels off compared to usual coatings.

Method of FIG. 1

As illustrated in FIG. 1, according to an implementation of the present invention, the method of forming a polymer layer on the substrate surface using one or more of the compounds represented by Chemical Formulas 1 to 11 as a monomer includes step 120 of providing a solution containing a monomer; step 140 of initiating a polymerization reaction of the monomer on a substrate surface; step 160 of polymerizing the monomer on the substrate surface to form a polymer layer, and step 180 of performing washing and drying.

Preparation of Monomer Solution

In step 120 of FIG. 1, one or more of the compounds represented by Chemical Formulas 1 to 11 are added to a solvent to prepare a reaction composition solution containing a monomer. This reaction composition solution is referred to as a "monomer solution."

Acidity (pH)

In the method of modifying a substrate, the monomer solution may be acidic, neutral or basic. For example, the pH of the monomer solution may be about 1, 2, 3, 4, 5, 6, 7, 8, 9, 10, 11, 12, 13, or 14. The pH of the monomer solution may fall within a range obtained by selecting two of the values listed in the immediately preceding sentence. For example, the pH of the monomer ranges from about 3 to 10 or from about 7 to 13.

Solvent

For example, pure water, a buffer (weakly acidic, neutral or basic), an NaOH solution (0.01 M, 0.1 M or 1 M), a 50 mM to 500 mM borate buffer (pH 9), or 15% to 20% DMEA (N,N-dimethylamine: CAS 598-56-1; salt free, pH 13 to 14) may be used as a solvent, but the solvent is not particularly limited to these.

Concentration

The concentration of the monomer is not particularly limited, and can be appropriately adjusted depending on the solute and solvent used and other reaction conditions. For example, the concentration of the monomer in the monomer solution may be about 0.1, 0.2, 0.3, 0.5, 0.7, 1, 1.5, 2, 2.5, 3, 3.5, 4, 4.5, 5, 5.5, 6, 6.5, 7, 7.5, 8, 8.5, 9, 9.5, or 10 mg/mL. The concentration of the monomer in the monomer solution may fall within a range obtained by selecting two of the values listed in the immediately preceding sentence. For example, the concentration of the monomer ranges from about 0.1 to 5 mg/mL or from about 0.5 to 7 mg/mL.

One or More Monomers

In order to form a polymer layer composed of a copolymer of two or more monomers on the substrate surface, two or more monomers may be added to the monomer solution.

Initiation of Polymerization Reaction

In step 140 of FIG. 1, the polymerization reaction is initiated by bringing the monomer solution into contact with the substrate surface.

Contact Method

Any method used in known coating processes can be adopted as long as the surface of the substrate can contact with the monomer solution for sufficiently long time. For example, the monomer solution may be filled in a vessel having a volume sufficient to accommodate the substrate, and then the substrate may be immersed in the monomer solution. Alternatively, spin-coating, spray-coating, or the like can be adopted. In addition, the monomer solution may be brought into contact with a part or the whole of the substrate or one surface or both surfaces of the substrate.

Initiation of Polymerization Reaction

The polymerization reaction is usually performed without the addition of a separate initiator, but may be performed with the addition of an initiator in some cases. The polymerization reaction is performed at a temperature lower than the boiling point of the solvent, and usually at 0° C. to 90° C.

Without Initiator

According to an implementation of the present invention, the polymerization reaction of the monomer may be initiated without the addition of a separate initiator such as a radical initiator. For example, at least some of the compounds represented by Chemical Formulas 1 to 11 are self-initiating monomers capable of initiating a polymerization reaction by reacting with a substrate surface without a separate initiator. For example, the composition for the polymerization reaction may be free of known radical initiators such as azo compounds including AIBN (azobisisobutyronitrile) and ABCN (1,1'-azobis(cyclohexane-carbonitrile)) or organic peroxides including di-tert-butyl peroxide (($CH_3$)$_3$C—O—O—C($CH_3$)$_3$) and benzoyl peroxide ((PhCOO)$_2$).

Polymerization Reaction

In step 160 of FIG. 1, a polymerization reaction is performed to form a polymer layer on the substrate surface.

Polymerization Reaction Through Contact

According to an implementation, the monomer may react with the substrate surface to form a polymer layer as the substrate is simply in contact with the monomer solution at a designated temperature for sufficiently long time.

Contact Time with Monomer Solution

The time for which the substrate is in contact with the monomer solution may be about 0.5, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 42, 44, 46, 48, 50, 52, 54, 56, 68, 60, 62, 64, 66, 68, 70, 72, 74, 76, 78, or 80 hours. The time for which the substrate is in contact with the monomer solution may fall within a range obtained by selecting two of the numbers listed in the immediately preceding sentence. For example, the time for the polymerization reaction may range from about 2 to about 10 hours, from about 6 to about 12 hours, or from about 8 to about 24 hours.

Temperature of Monomer Solution

The polymerization reaction is performed at a temperature lower than the boiling point of the solvent used. The temperature of the monomer solution is adjusted to about 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., 90° C., 95° C., or 100° C. This temperature may fall within a range obtained by selecting two of the numbers listed in the immediately preceding sentence. For example, the temperature of the polymerization reaction composition ranges from about 20° C. to about 70° C., from about 40° C. to about 90° C., or from about 10° C. to about 30° C.

Catalyst

When a catalyst can be used, a catalyst for accelerating the reaction may be added, but is not necessarily required.

Stirring

The polymerization reaction composition may be stirred to activate the reaction for bonding with the substrate or the polymerization reaction.

Oligomer

Polymers of various sizes are produced by the polymerization reaction, and oligomers or dimers are also produced. Polymers or oligomers may be produced while the monomer solution and the substrate are in contact with each other.

Completion of Polymerization Reaction

When the polymerization reaction is complete, the substrate is taken out of the reaction vessel and the surface is wiped or touched with absorbent paper or an absorbent pad to remove the liquid components of the polymerization reaction composition remaining on the polymer layer or the surface of the substrate. In some cases, washing with water or another washing solution is performed before or after the liquid components are wiped off. The liquid on the surface is wiped off when washing is performed.

Baking Step

According to an implementation, the substrate may be baked after being subjected to the polymerization reaction and washed with water or another washing solution. Baking may be performed in hot and dry environment using an oven or another proper machine. Baking may serve to evaporate the solvent remaining in the polymer layer, crosslink a part of the polymer formed in the polymer layer, and cure and harden the polymer layer.

Baking Time

The time for the baking process needs not be restrained and may be appropriately selected and adjusted by those skilled in the art according to the kind of specific compound used and the kind of substrate. For example, the baking time may be 1, 2, 3, 4, 5, 6, 7, 8, 9, 10, 11, 12, 13, 14, 15, 16, 17, 18, 19, 20, 21, 22, 23, or 24 hours. The baking time may fall within a range obtained by selecting two of the values listed in the immediately preceding sentence. For example, the baking time ranges from about 1 to 9 hours or from 3 to 24 hours.

Baking Temperature

Baking is carried out at a temperature such that the substrate is not denatured, and the temperature may be appropriately selected and adjusted by those skilled in the art according to the kind of specific compound used and the kind of substrate. For example, the temperature for the baking treatment may be 50° C., 55° C., 60° C., 65° C., 70° C., 75° C., 80° C., 85° C., 90° C., 95° C., or 100° C. The baking temperature may fall within a range obtained by selecting two of the values listed in the immediately preceding sentence. For example, the baking temperature ranges from about 50° C. to 90° C. or from 60° C. to 100° C.

Washing and Drying

In step 180 of FIG. 1, the baked substrate is washed to remove monomer compounds which are not bonded or polymerized as well as impurities. Washing may be performed with an acidic solution and/or a basic solution. For example, the substrate may be washed with an acidic solution, washed with water, then washed with a basic solution, and washed with water. Alternatively, the substrate may be washed with a basic solution, washed with water, then washed with an acidic solution, and washed with water. The substrate after being washed is dried at room temperature or an elevated temperature to obtain a substrate on which a polymer layer is formed.

Use of Pre-Polymerized Polymer

According to an implementation of the present invention, a solution ("polymer solution") containing a pre-polymerized polymer may be additionally used in one or more of the steps. For example, the substrate may be further reacted with the polymer solution after the polymerization reaction and before the baking treatment. In this case, crosslinking may be promoted by adding a pre-polymerized polymer to the polymer layer obtained by the polymerization reaction.

IV. POLYMER LAYER FORMED ON SUBSTRATE SURFACE

Form of Polymer Layer

By the method, a polymer layer is formed on a part or the whole of a substrate surface. The polymer layer may be bonded to the substrate surface by a chemical bond. For example, at least some of the polymer molecules of the polymer layer may be attached to the substrate surface by a covalent bond. The polymer layer may be formed on the whole or a part of the substrate surface or one surface or both surfaces of the substrate surface.

Thickness of Polymer Layer

The thickness of a polymer layer formed on a substrate surface by the method is not particularly limited, and may be appropriately selected and adjusted by those skilled in the art according to the kind of specific compound used, the kind of substrate, and the reaction conditions. For example, the thickness of the polymer layer may be 0.05, 0.1, 0.2, 0.3, 0.4, 0.5, 0.6, 0.7, 0.8, 0.9, 1, 1.2, 1.4, 1.6, 1.8, 2, 2.4, 2.8, 3.2, 4, 4.5, 5, 5.5, 6, 6.5, 7, 7.5, 8, 8.5, 9, 9.5 10, 11, 12, 13, 14 or 15 µm. The thickness of the polymer layer may fall within a range obtained by selecting two of the values listed in the immediately preceding sentence. For example, the thickness of the polymer layer ranges from about 0.05 to 5 µm or from 1 to 15 µm.

Effect of Polymer Layer

The present invention relates to a polymer layer formed by independently attaching monomers, or oligomers or (co)polymers thereof to a substrate, and a method of forming the same, and may be used for chemical surface coating of various substrates. In particular, it is possible to impart suitable hydrophilicity to the surface of an inherently hydrophobic material to be used where hydrophilicity is required, or vice versa. In addition, the adhesion between the interfaces may be enhanced by transforming the chemical properties of one interface, and the yield and reliability of a biochemical separation process may be improved by employing appropriately modified compounds for better retention and separation. The present invention can be thus used in numerous industrial fields.

V. OLED PANEL ENCAPSULATION STRUCTURE

Existing OLED Panel Encapsulation Structure

Several encapsulation structures and methods for OLED panels are reportedly employing technologies involving glass frit and Invar. Organic light-emitting materials used in OLED panels are oxidized when coming in contact with oxygen or water vapor, and the light-emitting performance thereof deteriorates. Hence, these encapsulation technologies use airtight materials and structures which prevent oxygen or water vapor in the air from entering the interior of OLED display products. However, the technology using glass frit or invar is not suitable for application to large OLED panels or flexible OLED panels.

Flexible Encapsulation Apparatus

The idea of a flexible encapsulation apparatus has been proposed for application to large OLED panels or flexible OLED panels. Aluminum oxide based flexible encapsulation structures using repeating units of alternately laminated aluminum oxide layers and polymer layers have been studied. Flexible encapsulation structures using silicon nitride instead of aluminum oxide have also been studied.

Aluminum Oxide Laminate Encapsulation Apparatus

When aluminum oxide is deposited by an atomic layer deposition (ALD) technique, an aluminum oxide layer having a dense structure, through which oxygen or water vapor hardly passes, may be formed. Aluminum oxide has excellent interfacial adhesion with most engineering polymers, and it is thus theoretically possible to obtain a flexible OLED panel encapsulation apparatus when aluminum oxide is laminated together with a polymer layer.

Fabrication of Aluminum Oxide-Polymer Laminate

An aluminum oxide-polymer laminate may be formed by alternately laminating an aluminum oxide layer and a polymer layer. For example, an aluminum oxide layer is formed on a polymer substrate by the ALD technique, a polymer layer is formed thereon by applying a polymer, an aluminum oxide layer is formed thereon again by the ALD technique, and a polymer layer is formed thereon again. By repeating this process, a flexible encapsulation apparatus, in which aluminum oxide layers and polymer layers are alternately laminated, may be fabricated.

Disadvantage of Aluminum Oxide Layer Fabricating Process

The aluminum oxide thin film is brittle until the thin film is laminated with a polymer layer several times. In order to fabricate an encapsulation apparatus for a large OLED panel, it is required to fabricate a large-area aluminum oxide thin film, but the large-area aluminum oxide thin film has a disadvantage of being broken during transport or handling for a process even when the thin film is attached to the polymer substrate. The ALD technique can deposit an aluminum oxide layer having a density suitable for OLED encapsulation, but requires a vacuum chamber and long time for deposition, and the cost of the process is burdensome.

Silicon Nitride Laminate Flexible Encapsulation Apparatus

It is also theoretically possible to use a silicon nitride layer lamination flexible encapsulation apparatus, in which silicon nitride layers and polymer layers are alternately laminated for OLED panels. Aluminum oxide layers with quality suitable for encapsulation of OLED panels may only be formed by ALD technique, but silicon nitride layers can be formed by plasma enhanced chemical vapor deposition (PECVD) technique. Compared to ALD-fabricated aluminum oxide layers, PECVD-fabricated silicon nitride layers are less dense but take significantly less time.

Disadvantage of Silicon Nitride Layer Fabricating Process

The PECVD technique also requires a vacuum chamber, and this increases the cost of the process. Moreover, silicon nitride does not have as high interfacial adhesion with a polymer layer as aluminum oxide. The surface of the polymer layer needs to be treated with plasma to enhance the adhesion with the polymer layer, but the processing cost increases further since the plasma process also requires a vacuum chamber.

Formation of Metal Layer by ALD

It is also conceivable to fabricate a flexible encapsulation apparatus by alternately laminating a polymer layer with a metal layer instead of an oxide or nitride of a metal such as aluminum oxide or silicon nitride several times. The ALD technique may be applied to various metals to form metal layers. However, the use of ALD technique increases the processing cost. Moreover, metals generally have plenty of defects in the crystal structure, and thus have a higher oxygen or water molecule (water vapor) transmission rate than metal oxides or nitrides fabricated by the same process. Consequently, when the use of ALD technique is mandated and all other conditions are equal, metal oxide layers are currently preferred to metal layers.

Formation of Metal Layer by Vapor Deposition

For metals with low boiling point, metal layers with thicknesses of several hundred nanometers may be formed by vapor deposition technique. The processing cost for vapor deposition technique is lower than that for ALD technique, but vapor deposition technique still needs a vacuum chamber and significantly long time.

VI. METAL FOIL LAMINATE

Flexible Encapsulation Apparatus Using Metal Foil

According to implementations of the present invention, a flexible encapsulation apparatus (or flexible laminate) for OLED panels is provided by alternately stacking several prefabricated metal foils with polymers. A metal foil is fabricated by a method in which a melt of a melted metal is thinly formed, cooled, and hardened. The production cost of a metal foil is remarkably lower compared to that of metal films fabricated with ALD or vapor deposition technique.

Metal Foil Laminate

In order to fabricate a flexible encapsulation apparatus by stacking a metal foil, sheets of metal foils need to be transported and handled. Metal foils attached to plastic films with appropriate mechanical strength can be more conveniently and efficiently handled. This is especially true when large-area metal foils are to be used. To this end, a plastic film is first provided, and an adhesive layer is formed on one surface thereof. A metal foil is placed on the adhesive layer, and the stacked body is pressed from both sides to fabricate a metal laminate having a structure of plastic layer-adhesive layer-metal layer. In order to distinguish the metal laminate using a metal foil as described above from the metal laminate of another implementation, this metal laminate is called a "metal foil laminate." The metal foil laminate may be fabricated to have various areas depending on the size of OLED panels.

Metal Foil

Metal foils are distinguished from thin films or films of metal oxides or metal nitrides. A thin oxide film is formed on the surface of the metal foil in contact with air, but the main component of the central portion is the metal, when the longitudinal cross section of the foil is taken. On the contrary, the main component of the central portion of the cross section of a metal oxide or metal nitride is still the metal oxide or metal nitride.

Metal

A metal foil laminate may be fabricated using a variety of metal foils. Aluminum, copper, tin, zinc, magnesium, stainless steel, nickel, chromium, tungsten and the like may be used.

Thickness of Metal Foil

The thickness of a metal foil is usually several micrometers to several hundred micrometers. More specifically, the thickness may be about 0.5, 1, 2, 3, 4, 5, 6, 7, 8, 9, 10, 12, 14, 16, 18, 20, 22.5, 25, 27.5, 30, 35, 40, 45, 50, 55, 60, 65, 70, 75, 80, 85, 90, 95, 100, 110, 120, 130, 140, 150, 160, 170, 180, 190, 200, 220, 240, 260, 280, 300, 320, 340, 360, 380, or 400 μm. The thickness of the metal foil may fall within a range obtained by selecting two of the numbers listed in the immediately preceding sentence. For example, the metal foil may have a thickness ranging from about 3 to about 100 μm, from about 10 to about 50 μm, from about 20 to about 100 μm, or from about 50 to about 200 μm.

Internal Defect of Metal

All metals have defects in the internal crystal structure. Moreover, defects may be additionally generated during the fabrication process, transport, and storage. The shape and size of these defects vary. When the cross section of a metal is cut, these defects will look like hollows having depths in that cut. Metal foils are not different. When the size of the defect is small as compared to the thickness of the metal foil, the defect will look like a hollow having a depth in the longitudinal direction along the thickness.

Pinhole in Metal Foil

When the defect is large as compared to the thickness of the metal foil, the defect may appear in the form of a hole penetrating in the longitudinal direction along the thickness, namely, as the form of a pinhole. The pinhole formed in the metal layer of the metal foil laminate may be a channel through which air passes. Unless this pinhole is plugged or filled, the metal foil laminate has a high oxygen or water molecule transmission rate and it is thus difficult to provide an effective encapsulation apparatus.

Size of Pinhole

The size of pinholes formed in the metal foil may be larger as the foil is thicker. Commonly, there are pinholes having diameters in a range of several nanometers to several micrometers. However, when the metal foil has a thickness of several hundred micrometers, pinholes having a diameter of 10 micrometers or more are also generated.

Structure of Plastic Film

Plastic films used in the manufacture of airtight packaging materials may be composed of a single layer or multiple layers. The multi-layer structure is a structure in which layers of different materials are in contact with each other, and layers of the same material may be repeatedly layered several times.

Thickness of Plastic Film

The thickness of the plastic film may be about 1, 2, 3, 4, 5, 6, 7, 8, 9, 10, 12, 14, 16, 18, 20, 22.5, 25, 27.5, 30, 35, 40, 45, 50, 55, 60, 65, 70, 75, 80, 85, 90, 95, 100, 110, 120, 130, 140, 150, 160, 170, 180, 190, 200, 220, 240, 260, 280, 300, 320, 340, 360, 380, 400, 425, 450, 474, or 500 μm. The thickness of the plastic film may fall within a range obtained by selecting two of the numbers listed in the immediately preceding sentence. For example, the plastic film may have a thickness ranging from about 10 to about 50 μm or from about 20 to about 100 μm.

Material of Plastic Film

The plastic film may be formed of engineering polymers of various materials. The single layer or each of the multiple layers of the plastic film may contain one or more polymer materials selected from polypropylene (PP), polyethylene terephthalate (PET), polyethylene (PE), polyvinyl chloride (PVC), polyvinylidene chloride (PVDC), polystyrene (PS), nylon, polycarbonate (PC), polyvinyl acetate (PVA), polyvinyl alcohol (PVOH), EVA (poly(ethylene-vinyl acetate)), EVOH (poly(ethylene-vinyl alcohol)), PMMA (poly(methyl methacrylate), an acrylic resin, Kapton, UPILEX, and a polyimide resin.

Adhesive

The adhesive layer of the metal foil laminate may be any adhesive layer as long as it can paste the plastic film and the metal foil to each other. An epoxy resin, an acrylic resin, a polyurethane resin may be used. For example, DGEBA (diglycidyl ether of bisphenol A), EPN (epoxyphenol novolak), ECN (epoxycresol novolak), poly(methyl acrylate), poly(methyl methacrylate) (PMMA), poly(n-butyl acrylate), poly(n-butyl methacrylate), poly(n-dodecyl acrylate), poly(n-dodecyl methacrylate), poly(hydroxyethyl methacrylate) (HEMA), and the like can be used; polyurethane resins obtained by reacting isocyanates with polyols can also be used.

Pressing

The triple-layer structure of plastic film-adhesive-metal foil obtained by applying an adhesive to one surface of a plastic film and placing a metal foil on the adhesive is pressed while passing through a pressing roller to be completed into a metal foil laminate.

Structure of Metal Foil Laminate

Figure 2:
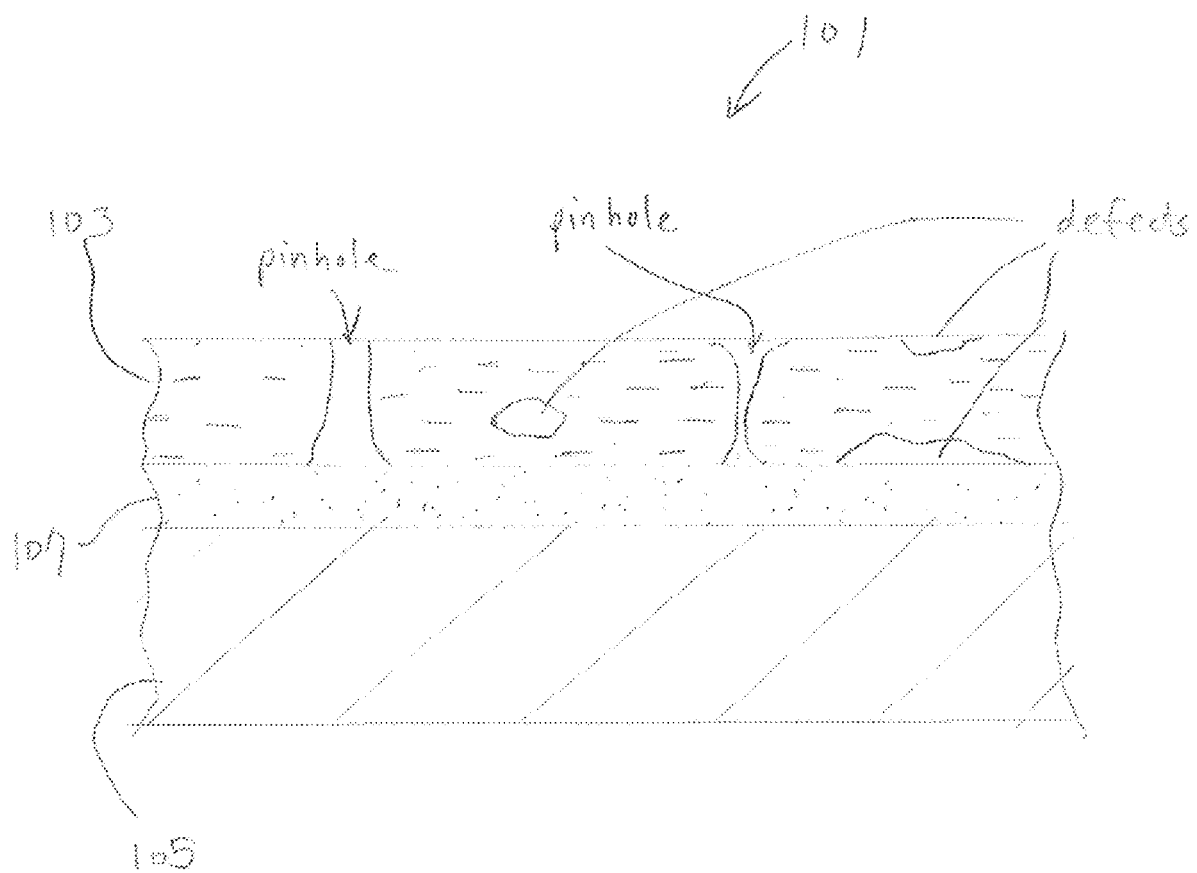
FIG. 2 illustrates the structure of a metal foil laminate according to an implementation.

FIG. 2 illustrates the structure of a metal foil laminate 101, and illustrates defects such as pinholes included in a metal layer 103. The metal foil laminate 101 has a basic structure of plastic 105 layer-adhesive layer 107-metal layer 103 in the order, but one or more functional layers may be additionally formed between the plastic layer and the metal layer, if necessary. An adhesive layer may be additionally formed between the plastic layer or the metal layer and the added functional layer. In this document (excluding claims), it means that the "metal foil laminate" has a structure of plastic layer-adhesive layer-metal layer in the order, and may or may not have a functional layer, although a specific structure may be mentioned.

VII. FABRICATION OF POLYMER-METAL FOIL LAMINATE BY POLYMERIZATION REACTION

Bringing of Metal Foil Laminate into Contact with Polymerization Reaction Composition Solution A polymerization reaction vessel (or reservoir) having a size that can accommodate the metal foil laminate is prepared. A polymerization reaction composition solution is filled in this vessel. The metal foil laminate is brought into contact with the polymerization reaction composition solution in the vessel to cause a polymerization reaction on the surface of the metal foil laminate.

Immersion of Metal Foil Laminate in Composition Solution

When the metal foil laminate is put into the polymerization reaction vessel, only the surface on the metal layer side may be brought into contact with the composition solution while the surface on the plastic layer side is kept away from contact with the composition solution, or alternatively, the whole metal foil laminate may be immersed in the composition solution so that both surfaces come in contact with the composition solution. The productivity of the process may be increased when a plurality of metal foil laminates is immersed together in one polymerization reaction vessel to perform the polymerization reaction. A plurality of metal foil laminates may also be immersed in the composition solution so as to be stacked one over another. In this case, a spacing structure for maintaining the distance between adjacent metal foil laminates may be inserted so that the composition solution may enter between the metal foil laminates.

Continuous Process

The process of bringing the metal foil laminate into contact with the polymerization reaction composition in the polymerization reaction vessel may be performed as a continuous process. As the metal foil laminate wound on a roll is unwound, the metal foil laminate moves to the polymerization reaction vessel and is immersed in the polymerization reaction composition. A polymer layer is formed on the surface of the metal foil laminate by the polymerization reaction while the metal foil laminate immersed in the polymerization reaction composition moves, and the metal foil laminate emerges from the polymerization reaction vessel as the metal foil laminate continues to move.

Formation of Polymer Layer on Surface by Polymerization Reaction

When the polymerization reaction composition solution and the metal layer surface of the metal foil laminate are in contact with each other for long enough time for the polymerization reaction, a polymerization reaction takes place on the metal layer surface and a polymer layer is formed. When the metal foil laminate is immersed in the composition solution so that both surfaces thereof are submerged, a polymer layer is formed on each of the surface of the metal layer and the surface of the plastic layer. The metal foil laminate on which a polymer layer is formed is cured and hardened as crosslinks between adjacent polymer chains inside the polymer layer are formed in the subsequent baking process.

Thickness of Polymer Layer

The thickness of the polymer layer may be about 0.1, 0.2, 0.3, 0.4, 0.5, 0.6, 0.7, 0.8, 0.9, 1, 1.2, 1.4, 1.5, 1.6, 1.8, 2, 2.5, 3, 4, 5, 6, 7, 8, 9, 10, 12, 15, 20, 25, or 30 µm. The thickness of the polymer layer may fall within a range obtained by selecting two of the numbers listed in the immediately preceding sentence. For example, the polymer layer may have a thickness ranging from about 0.5 to about 3 µm or from about 1 to about 5 µm. When both the surface of the metal layer and the surface of the plastic layer are simultaneously brought into contact with the polymerization reaction composition and separated therefrom as well, the initiation and progress speeds of the polymerization reaction on these two surfaces are different from each other, and the thicknesses of the polymer layers obtained may be thus different from each other.

Polymer-Metal Foil Laminate

Figure 3:
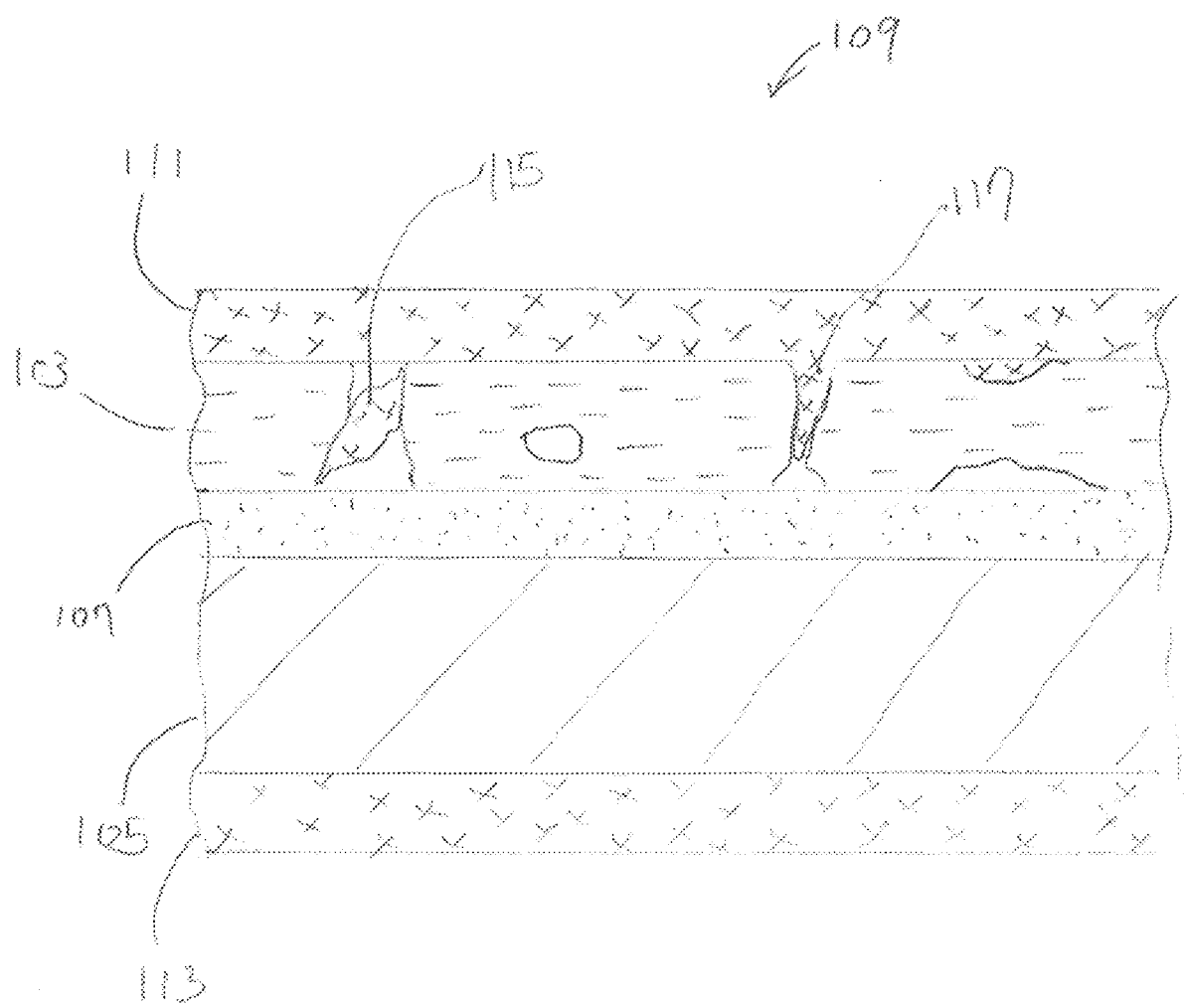
FIG. 3 illustrates the structure of a polymer-metal laminate according to an implementation.

FIG. 3 illustrates a polymer-metal laminate 109 having a structure of polymer layer 113-plastic layer 105-adhesive layer 107-metal layer 103-polymer layer 111 obtained as a result of the polymerization reaction. When the polymerization reaction is not performed on the surface of the plastic layer, a structure of plastic layer 105-adhesive layer 107-metal layer 103-polymer layer 111, in which the polymer layer 113 is omitted, is obtained. This polymer-metal laminate fabricated using a metal foil laminate is called a "polymer-metal laminate" to distinguish this from the polymer-metal laminate of another implementation. One or more functional layers may be additionally formed between the plastic layer and the metal layer, if necessary. One or more functional layers may also be additionally formed between the plastic layer and the polymer layer, if necessary. When a functional layer is additionally formed, an adhesive layer may be additionally formed on one side or both sides thereof. In this document (excluding claims), the "polymer-metal foil laminate" has a structure of plastic layer-adhesive layer-metal layer-polymer layer or polymer layer-plastic layer-adhesive layer-metal layer-polymer layer in the order, and may or may not have a functional layer, although a specific structure may be mentioned.

Polymerization Reaction to Fill Pinhole

The polymerization reaction not only forms a polymer layer on the surface of the metal layer, but also fills or plugs pinholes formed in the metal layer. When the polymerization reaction composition permeates into the pinholes and causes a polymerization reaction on the inner surface of the pinholes, the resulting polymer or oligomer fills the whole or a part of the inner space of the pinholes (115 and 117 in FIG. 3). The polymer or oligomer filling a part or the whole of the inner space of the pinholes may extend outside the pinholes and be connected to the polymer layer formed on the metal surface (117 in FIG. 3). The polymer or oligomer also covers and plugs the pinholes in the polymer layer formed on the metal surface outside the pinholes.

VIII. FLEXIBLE ENCAPSULATION APPARATUS USING POLYMER-METAL FOIL LAMINATE

Air Tightness of Polymer-Metal Foil Laminate

For polymer-metal foil laminates, lower gas transmission rate (GTR) or water vapor transmission rate (WVTR) is always desirable. The water vapor transmission rate varies depending on the thickness of the metal foil, but the water vapor transmission rate of one polymer-metal foil laminate is about $1\times10^{-6}$, $2\times10^{-6}$, $3\times10^{-6}$, $4\times10^{-6}$, $5\times10^{-6}$, $6\times10^{-6}$, $7\times10^{-6}$, $8\times10^{-6}$, $9\times10^{-6}$, $1\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, $1\times10^{-4}$, $2\times10^{-4}$, $3\times10^{-4}$, $4\times10^{-4}$, $5\times10^{-4}$, $6\times10^{-4}$, $7\times10^{-4}$, $8\times10^{-4}$, $9\times10^{-4}$, $1\times10^{-3}$, $2\times10^{-3}$, $3\times10^{-3}$, $4\times10^{-3}$, $5\times10^{-3}$, or $6\times10^{-3}$ g/m$^2$/day. The water vapor transmission rate of one polymer-metal foil laminate may fall within a range obtained by selecting two of the numbers listed in the immediately preceding sentence. For example, the water vapor transmission rate may range from about $1\times10^{-5}$ to about $1\times10^{-4}$ g/m$^2$/day or from about $5\times10^{-5}$ to about $5\times10^{-4}$ g/m$^2$/day.

Lamination of Two Polymer-Metal Foil Laminates

Figure 4:
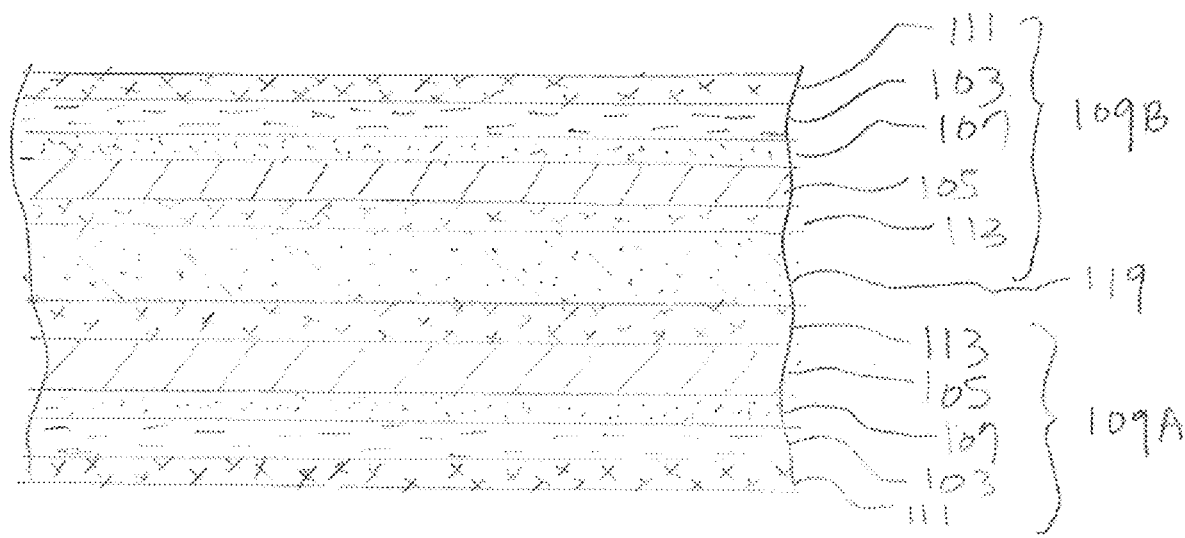
FIG. 4 illustrates a structure in which two polymer-metal foil laminates are laminated according to an implementation.

FIG. 4 illustrates a structure in which two polymer-metal foil laminates are laminated. An adhesive 119 is applied to one surface of one polymer-metal foil laminate 109A and one surface of the other polymer-metal foil laminate 109B is stacked thereon to obtain a structure of [polymer-metal foil laminate (109A)]-[adhesive (119)]-[polymer-metal foil laminate (109B)]. This structure is then pressed and integrated.

Lamination of Multiple Laminates

When an adhesive is placed between an integrated body composed of two polymer-metal foil laminates and one polymer-metal foil laminate and the stacked body is pressed and integrated, a lamination, in which three polymer-metal foil laminates are integrated, may be fabricated. When two integrated bodies each composed of two polymer-metal foil laminates are pasted together with an adhesive and integrated, a lamination, in which four polymer-metal foil laminates are integrated, may be fabricated. By repeating the same operation, a lamination, in which the desired number of polymer-metal foil laminates are integrated, may be fabricated.

Various Structures of Integrated Lamination

Laminations of various structures may be produced depending on which surfaces face each other and whether the polymer-metal foil laminate is a polymer-metal foil laminate having a polymer layer on both sides or a polymer-metal foil laminate having a polymer layer only on one side when two polymer-metal foil laminates are integrated. Examples of these structures are as follow.

(1) [Polymer layer-plastic layer-adhesive layer-metal layer-polymer layer]-[adhesive layer]-[polymer layer-plastic layer-adhesive layer-metal layer-polymer layer]
(2) [Polymer layer-plastic layer-adhesive layer-metal layer-polymer layer]-[adhesive layer]-[polymer layer-metal layer-adhesive layer-plastic layer-polymer layer]
(3) [Polymer layer-metal layer-adhesive layer-plastic layer-polymer layer]-[adhesive layer]-[polymer layer-plastic layer-adhesive layer-metal layer-polymer layer]
(4) [Plastic layer-adhesive layer-metal layer-polymer layer]-[adhesive layer]-[polymer layer-plastic layer-adhesive layer-metal layer-polymer layer]
(5) [Plastic layer-adhesive layer-metal layer-polymer layer]-[adhesive layer]-[polymer layer-metal layer-adhesive layer-plastic layer-polymer layer]
(6) [Polymer layer-metal layer-adhesive layer-plastic layer]-[adhesive layer]-[polymer layer-plastic layer-adhesive layer-metal layer-polymer layer]
(7) [Polymer layer-metal layer-adhesive layer-plastic layer]-[adhesive layer]-[polymer layer-metal layer-adhesive layer-plastic layer-polymer layer]
(8) [Plastic layer-adhesive layer-metal layer-polymer layer]-[adhesive layer]-[plastic layer-adhesive layer-metal layer-polymer layer]
(9) [Plastic layer-adhesive layer-metal layer-polymer layer]-[adhesive layer]-[polymer layer-metal layer-adhesive layer-plastic layer]
(10) [Polymer layer-metal layer-adhesive layer-plastic layer]-[adhesive layer]-[plastic layer-adhesive layer-metal layer-polymer layer]

One or more functional layers may be additionally formed between two polymer-metal foil laminates, between the plastic layer and the metal layer, and between the polymer layer and the plastic layer. Although not required, the functional layer may require an adhesive layer on one side or both sides.

Flexible Encapsulation Apparatus Using Metal Foil

One polymer-metal foil laminate fabricated using a metal foil itself provides considerable air tightness, and may be thus used to encapsulate devices or objects required to exhibit air tightness, such as display devices. A flexible laminate fabricated by integrating two or more polymer-metal foil laminates may be used as a flexible encapsulation apparatus for devices or objects required to exhibit higher air tightness, for example, OLED panels. The flexible encapsulation apparatus according to an implementation has a structure in which 1, 2, 3, 4, 5, 6, 7, 8, 9, 10, 11, 12, 13, 15, 15, 16, 17, 18, 19, or 20 polymer-metal foil laminates are integrated.

Attachment of Flexible Encapsulation Apparatus to OLED Panel

An unfinished OLED product, in which an OLED panel is formed on the front glass or plastic, is provided. The back surface of this unfinished OLED product is covered with a flexible encapsulation apparatus having an area corresponding to the size of the unfinished OLED product. The interior is sealed by attaching the edge of the flexible encapsulation apparatus to the edge of the back surface of the unfinished OLED product so as to prevent air transmission.

Gas Tightness of Flexible Encapsulation Apparatus

It is known that the encapsulation apparatus of OLED panel products is required to have a water vapor transmission rate of less than $1\times10^{-6}$ g/m$^2$/day. The flexible encapsulation apparatus using the polymer-metal foil laminate is fabricated by stacking several polymer-metal foil laminates of which the oxygen or water vapor transmission rate is significantly lowered by filling metal foil pinholes by a polymerization reaction. When several polymer-metal foil laminates are integrated, the gas transmission path becomes complicated, the gas transmission rate thus drastically decreases, and the flexible encapsulation apparatus has a water vapor transmission rate of less than $1\times10^{-6}$ g/m$^2$/day. The water vapor transmission rate of the flexible encapsulation apparatus fabricated by stacking two or more polymer-metal foil laminates is about $1\times10^{-9}$, $2\times10^{-9}$, $3\times10^{-9}$, $4\times10^{-9}$, $5\times10^{-9}$, $6\times10^{-9}$, $7\times10^{-9}$, $8\times10^{9}$, $9\times10^{-9}$, $1\times10^{-8}$, $2\times10^{-8}$, $3\times10^{-8}$, $4\times10^{-8}$, $5\times10^{-8}$, $6\times10^{-8}$, $7\times10^{-8}$, $8\times10^{-8}$, $9\times10^{-8}$, $1\times10^{-7}$, $2\times10^{-7}$, $3\times10^{-7}$, $4\times10^{-7}$, $5\times10^{-7}$, $6\times10^{-7}$, $7\times10^{-7}$, $8\times10^{-7}$, $9\times10^{-7}$, or $1\times10^{-6}$ g/m$^2$/day. The water vapor transmission rate of the flexible encapsulation apparatus fabricated by integrating two or more polymer-metal foil laminates may fall within a range obtained by selecting two of the numbers listed in the immediately preceding sentence. For example, the water vapor transmission rate may range from about $1 \times 10^{-8}$ to about $1 \times 10^{-6}$ g/m$^2$/day or from about $5 \times 10^{-5}$ to about $5 \times 10^{-7}$ g/m$^2$/day.

Heat Dissipation Function of Flexible Encapsulation Apparatus

In the flexible encapsulation apparatus using the polymer-metal foil laminate, a plurality of metal layers may have a function to receive heat generated from the OLED panel and transfer the heat to the edge of the product. An effective heat dissipation system is provided by installing a heat dissipation structure such as a heat dissipation fin in the edge of an OLED product and connecting it to the metal layer of the encapsulation apparatus.

IX. GAS-TIGHT PLASTIC FILM

Gas-Tight Plastic Film to Block Gas Transmission

Various plastic films are used as packaging materials for articles. In many cases, these plastic films have pores through which gases such as air may pass. For packaging materials used for food that loses their freshness when coming in contact with oxygen or food that becomes damp when coming in contact with water vapor, a metal layer such as aluminum is formed on the plastic film to block the transmission of air or water vapor into the packaging materials. For articles other than food that are required to block the transmission of oxygen, water vapor or other gases thereinto during storage, a packaging material, with a gas transmission barrier made of a metal layer formed on a plastic film, is used.

Formation of Metal Thin Film by Vapor Deposition

Metals having low boiling point may be deposited into a metal layer having thickness of several hundred nanometers by vapor deposition technique. When the pressure of the vapor deposition chamber is lowered, vapor deposition of a metal may be performed at a relatively low temperature. It is thus possible to deposit a metal on an organic compound substrate at a low temperature at which the substrate is not damaged.

Pinhole in Vapor-Deposited Metal Layer and Pinhole Size

Metal layers, vapor-deposited on a plastic film, contain pinholes. There are pinholes due to defects in the crystal structure of a metal, and there are pinholes due to the state of the plastic film surface or foreign substances at the time of vapor deposition. When a metal is vapor-deposited on a plastic film exhibiting hydrophobicity, pinholes much larger than those formed by defects in the crystal structure of the metal are formed. The diameters of pinholes formed in the vapor-deposited metal layer range from several nanometers to several hundred micrometers.

Pinhole Size and Air Tightness

As the number and size of pinholes in the metal layer decrease, the transmission rates of gas such as oxygen and water vapor of the packaging material decrease and the air tightness of the packaging material increases. Plastic packaging materials exhibiting high air tightness can maintain the inherent properties of the articles to be packaged for a long time and thus have a variety of uses. On the other hand, when the sizes of pinholes are too large, such plastic packaging materials are difficult to function as a packaging material to block gas transmission. The portions having large pinholes that greatly damage air tightness are removed, and the remainder is used as a packaging material for blocking gas transmission.

Detection of Pinhole with Naked Eye

Pinholes may be detected by illuminating one side of the packaging material on which a metal layer is formed with a light and checking the amount of light transmitted from the opposite side of the packaging material. Most easily, after inspecting pinholes with checking light transmission with the naked eye, the portion with pinhole may be removed, or the entire packaging material may not be used as packaging material. By such a method, a packaging material without large pinholes with diameters of ten nanometers to hundred nanometers may be obtained, and a water vapor transmission rate of $1 \times 10^{-1}$ g/m$^2$/day or less may be obtained.

Pinhole Hardly Detectable with Naked Eye

In the metal layer formed on a plastic film by vapor deposition, there may be pinholes that can be detected with the naked eye, but there may also be small pinholes that are hardly detectable with the naked eye. For highly airtight packaging materials, these invisible pinholes also need to be taken care of.

X. VAPOR-DEPOSITED METAL-PLASTIC LAMINATE

Highly Airtight Plastic Packaging Material

According to an implementation of the present invention, the polymerization reaction is performed on the surface of a metal layer formed on a plastic film by vapor deposition. By the polymerization reaction, a polymer layer is formed on the surface of the metal layer and pinholes having sizes undetectable with the naked eye as well as pinholes detectable with the naked eye are filled. When the pinholes in the metal layer are filled in this way, it is possible to provide a plastic packaging material having a higher air tightness than the plastic packaging material including the portion with pinholes detected with the naked eye.

Vapor-Deposited Metal-Plastic Laminate

Figure 5:
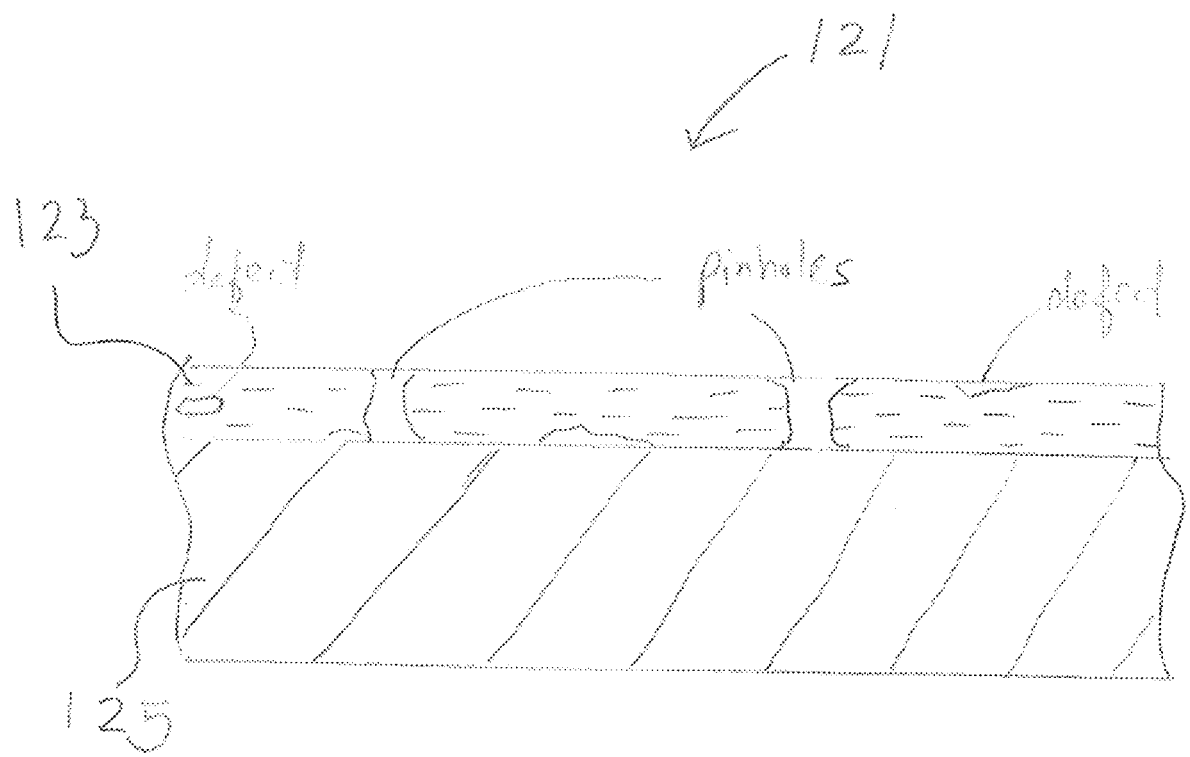
FIG. 5 illustrates the structure of a vapor-deposited metal-plasma laminate according to an implementation.

First, a metal laminate is fabricated by depositing a metal on the surface of a plastic film substrate by vapor deposition technique. To enhance the interfacial adhesion with the metal, the surface of the plastic film may be treated with plasma before vapor deposition is performed. A metal laminate fabricated by depositing a metal on a plastic film in this way is called a "vapor-deposited metal-plastic laminate" in order to distinguish this metal laminate from the metal laminate in another implementation. FIG. 5 illustrates a basic structure of a vapor-deposited metal-plasma laminate 121 including a plastic film 125 and a metal layer 123, and illustrates defects such as pinholes included in the metal layer 123.

Structure of Plastic Film

The plastic film serving as a substrate for vapor deposition may be composed of a single layer or multiple layers. The multi-layer structure is a structure in which layers of different materials are in contact with each other, and layers of the same material may be repeatedly layered.

Material of Plastic Film

The plastic film may be formed of engineering polymers of various materials. The single layer or each of the multiple layers of the plastic film may contain one or more polymer materials selected from polypropylene (PP), polyethylene terephthalate (PET), polyethylene (PE), polyvinyl chloride (PVC), polyvinylidene chloride (PVDC), polystyrene (PS), nylon, polycarbonate (PC), polyvinyl acetate (PVA), polyvinyl alcohol (PVOH), EVA (poly(ethylene-vinyl acetate)), EVOH (poly(ethylene-vinyl alcohol)), PMMA (poly(methyl methacrylate), an acrylic resin, Kapton, UPILEX, and a polyimide resin.

Thickness of Plastic Film

The thickness of the plastic film may be about 1, 2, 3, 4, 5, 6, 7, 8, 9, 10, 12, 14, 15, 16, 18, 20, 22, 24, 26, 28, 30, 32, 34, 36, 38, 40, 42, 44, 46, 68, 50, 52.5, 55, 57.5, 60, 62.5, 65, 67.5, 70, 75, 80, 85, 90, 95, 100, 110, 120, 130, 140, 150, 160, 170, 180, 190, 200, 220, 240, 260, 280, or 300 μm. The thickness of the plastic film may fall within a range obtained by selecting two of the numbers listed in the immediately preceding sentence. For example, the plastic film may have a thickness ranging from about 5 to about 40 μm or from about 10 to about 30 μm.

Metal Layer of Vapor-Deposited Metal-Plastic Laminate

The metal deposited on the surface of the plastic film by vapor deposition is aluminum, copper, tin, zinc, magnesium, stainless steel, nickel, chromium, tungsten, and the like. When these metals are exposed to air, a thin oxide film is formed on their surface.

Thickness of Metal Layer

The thickness of the metal layer formed by vapor deposition ranges from several nanometers to several hundred nanometers. Specifically, thickness of the metal layer may be about 0.5, 1, 2, 3, 4, 5, 6, 7, 8, 9, 10, 12, 14, 16, 18, 20, 22, 24, 26, 28, 30, 32, 34, 36, 38, 40, 42, 44, 46, 48, 50, 52.5, 55, 57.5, 60, 62.5, 65, 67.5, 70, 75, 80, 85, 90, 95, 100, 110, 120, 130, 140, 150, 160, 170, 180, 190 or 200 nm. The thickness of the metal layer may fall within a range obtained by selecting two of the numbers listed in the immediately preceding sentence. For example, the thickness of the metal layer ranges from about 10 to about 30 μm or from about 20 to about 100 nm.

XI. FABRICATION OF POLYMER-METAL-PLASTIC LAMINATE BY POLYMERIZATION REACTION

Bringing of Vapor-Deposited Metal-Plastic Laminate into Contact with Polymerization Reaction Composition Solution A polymerization reaction composition solution is filled in a polymerization reaction vessel (or reservoir) having a size that can accommodate the vapor-deposited metal-plastic laminate (or metal-plastic laminate). The vapor-deposited metal-plastic laminate is brought into contact with the polymerization reaction composition in the vessel. A polymerization reaction is performed on the surface of the vapor-deposited metal-plastic laminate.

Immersion of Vapor-Deposited Metal-Plastic Laminate in Composition Solution

When the vapor-deposited metal-plastic laminate is put into the polymerization reaction vessel, only the surface on the metal side may be brought into contact with the composition solution while the surface on the plastic film side is kept away from contact with the composition solution, or alternatively, the whole vapor-deposited metal-plastic laminate may be immersed in the solution so that both surfaces are submerged in the solution. The productivity of the process may be increased when a plurality of vapor-deposited metal-plastic laminates are immersed together in the composition solution in one polymerization reaction vessel to perform the polymerization reaction. A plurality of vapor-deposited metal-plastic laminates may also be immersed in the composition solution so as to be stacked one over another. In this case, a spacing structure for maintaining the distance between adjacent vapor-deposited metal-plastic laminates may be inserted so that the composition solution may enter between the vapor-deposited metal-plastic laminates.

Continuous Process

The process of bringing the vapor-deposited metal-plastic laminate into contact with the polymerization reaction composition in the polymerization reaction vessel may be performed as a continuous process. The same method as the process of bringing the metal foil laminate into contact with the polymerization reaction composition is applicable.

Formation of Polymer Layer on Surface by Polymerization Reaction

When the polymerization reaction composition solution and the metal layer surface of the vapor-deposited metal-plastic laminate are in contact with each other for a sufficient amount of time for the polymerization reaction, a polymerization reaction takes place on the metal layer surface and a polymer layer is formed. When the vapor-deposited metal-plastic laminate is immersed in the composition solution so that both surfaces thereof are submerged, a polymer layer is formed on each of the surface of the metal layer and the surface of the plastic layer. The vapor-deposited metal-plastic laminate on which a polymer layer is formed is cured and hardened as crosslinks between adjacent polymer chains inside the polymer layer are formed in the subsequent baking process.

Polymer Layer

In the polymerization reaction, polymers of various sizes are produced and dimers, trimers, tetramers and oligomers are also produced. Some of the dimers, trimers, tetramers, oligomers and polymers produced form chemical bonds with the surface of the substrate. As a result, the polymer layer contains polymers of various sizes, and may contain dimers, trimers, tetramers, and oligomers.

Thickness of Polymer Layer

The thickness of the polymer layer may be about 0.1, 0.2, 0.3, 0.4, 0.5, 0.6, 0.7, 0.8, 0.9, 1, 1.2, 1.4, 1.5, 1.6, 1.8, 2, 2.5, 3, 4, 5, 6, 7, 8, 9, 10, 12, 15, 20, 25, or 30 μm. The thickness of the polymer layer may fall within a range obtained by selecting two of the numbers listed in the immediately preceding sentence. For example, the polymer layer may have a thickness ranging from about 0.5 to about 3 μm or from about 1 to about 5 μm. When both the surface of the metal layer and the surface of the plastic layer are simultaneously brought into contact with the polymerization reaction composition and separated therefrom as well, the initiation and progress speeds of the polymerization reaction on these two surfaces are different from each other, and the thicknesses of the polymer layers obtained may be thus different from each other.

Polymer-Metal-Plastic Laminate

Figure 6:
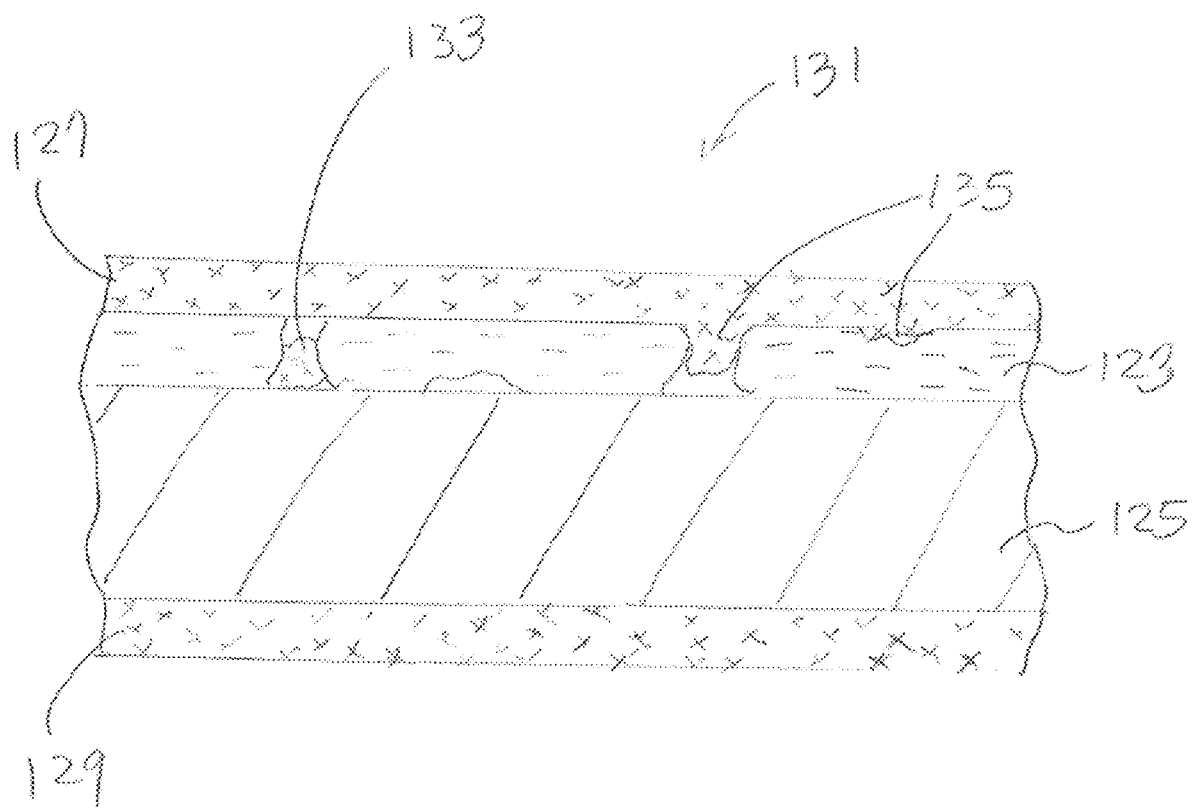
FIG. 6 illustrates the structure of a polymer-metal laminate according to an implementation.

FIG. 6 illustrates a polymer-metal laminate 131 having a structure of polymer layer 129-plastic layer 125-metal layer 123-polymer layer 127 obtained as a result of the polymerization reaction. When the polymerization reaction is not performed on the surface of the plastic layer, a structure of plastic layer 125-metal layer 123-polymer layer 127, in which the polymer layer 129 is omitted, is obtained. This polymer-metal laminate fabricated using the vapor-deposited metal-plastic laminate is called a "polymer-metal-plastic laminate" in order to distinguish this polymer-metal laminate from the polymer-metal laminate of another implementation. One or more functional layers may be additionally formed on either surface or both surfaces of the polymer layer if necessary. When a functional layer is additionally formed, an adhesive layer may be additionally formed on one side or both sides thereof. In this document (excluding claims), the "polymer-metal-plastic laminate" has a structure of plastic layer-metal layer-polymer layer or polymer layer-plastic layer-metal layer-polymer layer in the order, and may or may not have a functional layer, although a specific structure may be mentioned.

Polymerization Reaction to Fill Pinhole

The polymerization reaction not only forms a polymer layer on the surface of the metal layer, but also fills or plugs the pinholes formed in the metal layer. When the polymerization reaction composition permeates into the inner surface of the pinholes and causes a polymerization reaction on the inner surface of the pinholes, the resulting polymer or oligomer fills the whole or a part of the inner space of the pinholes (133 and 135 in FIG. 6). The polymer or oligomer filling a part or the whole of the inner space of the pinholes may extend outside the pinholes and be connected to the polymer layer formed on the metal surface (135 in FIG. 6). The polymer layer formed on the metal surface outside the pinholes also covers and plugs the pinholes.

XII. GAS-TIGHT PLASTIC PACKAGING MATERIAL

Packaging of Article Using Gas-Tight Plastic Packaging Material

A polymer-metal-polymer laminate may be used as a gas-tight plastic packaging material as is or after being subjected to additional treatments and processes. Additional treatments and processes may include printing or additional formation of a functional layer. In order to be used for packaging articles, the polymer-metal-plastic laminate may be folded like a bag or two polymer-metal-plastic laminates are stacked and the edges are sealed to be prepared into a flexible container to house articles. In the container, articles requiring hermetic storage are placed, and then the container is sealed to prevent air transmission using various sealing technologies. The articles requiring hermetic storage include various articles such as food and electronic parts, and are not limited to this list.

Gas-Tight Packaging

The gas transmission rate of a plastic packaging material obtained using the polymer-metal-plastic laminate is significantly reduced by the polymerization reaction in the vicinity of the metal foil pinholes. The water vapor transmission rate of this plastic packaging material is $1\times10^{-8}$, $2\times10^{-8}$, $3\times10^{-8}$, $4\times10^{-8}$, $5\times10^{-8}$, $6\times10^{-8}$, $7\times10^{-8}$, $8\times10^{-8}$, $9\times10^{-8}$, $1\times10^{-7}$, $2\times10^{-7}$, $3\times10^{-7}$, $4\times10^{-7}$, $5\times10^{-7}$, $6\times10^{-7}$, $7\times10^{-7}$, $8\times10^{-7}$, $9\times10^{-7}$, $1\times10^{-6}$, $2\times10^{-6}$, $3\times10^{-6}$, $4\times10^{-6}$, $5\times10^{-6}$, $6\times10^{-6}$, $7\times10^{-6}$, $8\times10^{31\ 6}$, $9\times10^{-6}$, $1\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, or $1\times10^{-4}$ g/m²/day. The water vapor transmission rate of the plastic packaging material obtained using the polymer-metal-plastic laminate may fall within a range obtained by selecting two of the numbers listed in the immediately preceding sentence. For example, the water vapor transmission rate may range from about $1\times10^{-7}$ to about $1\times10^{-6}$ g/m²/day or from about $5\times10^{-7}$ to about $5\times10^{-5}$ g/m²/day.

XIII. FLEXIBLE ENCAPSULATION APPARATUS USING POLYMER-METAL-PLASTIC LAMINATE

Lamination of Two Polymer-Metal-Plastic Laminates

An adhesive is applied to one surface of one polymer-metal-plastic laminate and one surface of the other polymer-metal-plastic laminate is stacked thereon to obtain a structure of [polymer-metal-plastic laminate]-[adhesive]-[polymer-metal-plastic laminate]. This structure is then pressed and integrated.

Lamination of Multiple Laminates

When an adhesive is placed between an integrated body composed of two polymer-metal-plastic laminates and one polymer-metal-plastic laminate and the stacked body is pressed and integrated, a lamination, in which three polymer-metal-plastic laminates are integrated, may be fabricated. When two integrated bodies each composed of two polymer-metal-plastic laminates are pasted together with an adhesive and integrated, a lamination, in which four polymer-metal-plastic laminates are integrated, may be fabricated. By repeating the same operation, a lamination, in which the desired number of polymer-metal-plastic laminates are integrated, may be fabricated.

Various Structures of Integrated Lamination

Laminations of various structures may be produced depending on which surfaces face each other and whether the polymer-metal-plastic laminate is a polymer-metal-plastic laminate having a polymer layer on both sides or a polymer-metal-plastic laminate having a polymer layer only on one side when two polymer-metal-plastic laminates are integrated. One or more functional layers may be additionally formed at positions where the adhesive is applied. Although not required, the functional layer may require an adhesive layer on one side or both sides.

Flexible Encapsulation Apparatus Using Polymer-Metal-Plastic Laminate

The polymer-metal-plastic laminate itself or a lamination, in which two or more polymer-metal-plastic laminates are integrated, may be used as a flexible encapsulation apparatus for OLED. The flexible encapsulation apparatus according to an implementation has a structure in which 1, 2, 3, 4, 5, 6, 7, 8, 9, 10, 11, 12, 13, 15, 15, 16, 17, 18, 19, or 20 polymer-metal-plastic laminates are integrated.

Attachment of Flexible Encapsulation Apparatus to OLED Panel

In the same method as in the description of the flexible encapsulation apparatus using the polymer-metal foil laminate, the flexible encapsulation apparatus is attached to the back surface of an OLED product and the interior is sealed.

Gas tightness of flexible encapsulation apparatus

The flexible encapsulation apparatus using the polymer-metal-plastic laminate is fabricated by stacking two or more polymer-metal-plastic laminates of which the gas transmission rate is significantly lowered by filling pinholes in the vapor-deposited metal layer by a polymerization reaction. When several polymer-metal-plastic laminates are integrated, the gas transmission path becomes complicated, the gas transmission rate drastically decreases, and the flexible encapsulation apparatus has a water vapor transmission rate of less than $1\times10^{-6}$ g/m²/day. The water vapor transmission rate of the flexible encapsulation apparatus fabricated by stacking two or more polymer-metal-plastic laminates is about $1\times10^{-9}$, $2\times10^{-9}$, $3\times10^{-9}$, $4\times10^{-9}$, $5\times10^{-9}$, $6\times10^{-9}$, $7\times10^{-9}$, $8\times10^{-9}$, $9\times10^{-9}$, $1\times10^{-8}$, $2\times10^{-8}$, $3\times10^{-8}$, $4\times10^{-8}$, $5\times10^{-8}$, $6\times10^{-8}$, $7\times10^{-8}$, $8\times10^{-8}$, $9\times10^{-8}$, $1\times10^{-7}$, $2\times10^{-7}$, $3\times10^{-7}$, $4\times10^{-7}$, $5\times10^{-7}$, $6\times10^{-7}$, $7\times10^{-7}$, $8\times10^{-7}$, $9\times10^{-7}$, or $1\times10^{-6}$ g/m²/day. The water vapor transmission rate of the flexible encapsulation apparatus fabricated by integrating two or more polymer-metal-foil laminates may fall within a range obtained by selecting two of the numbers listed in the immediately preceding sentence. For example, the water vapor transmission rate may range from about $1\times10^{-8}$ to about $1\times10^{6}$ g/m²/day or from about $5\times10^{-5}$ to about $5\times10^{-7}$ g/m²/day.

Heat Dissipation Function of Flexible Encapsulation Apparatus

In the flexible encapsulation apparatus using the polymer-metal-plastic laminate, a plurality of metal layers may have a function to receive heat generated from the OLED panel and transfer the heat to the edge of the product. An effective heat dissipation system is provided by installing a heat dissipation structure such as a heat dissipation fin in the edge of an OLED product and connecting it to the metal layer of the encapsulation apparatus.

XIV. POLYMERIZATION REACTION

Polymerization Reaction to Form Polymer Layer on Surface

A polymer layer is formed on the surfaces of a metal layer and a plastic layer of metal laminates, such as a metal foil laminate or a vapor-deposited metal-plastic laminate, by a polymerization reaction using monomers represented by Chemical Formulas 1 to 11. It is presumed that the monomers represented by Chemical Formulas 1 to 11 react with nucleophilic or electrophilic functional groups on the substrate surface to initiate the polymerization reaction while forming chemical bondings to the substrate surface. However, not all polymers (including oligomers) formed by the polymerization reaction bind to the substrate surface. The polymerization reaction and the resulting products expressed in the claims are not necessarily implemented according to such a reaction mechanism.

Composition for Polymerization Reaction

The polymerization reaction composition on the metal surface of metal laminates, such as a metal foil laminate or a vapor-deposited metal-plastic laminate, contains monomers and a solvent. The polymerization reaction composition may further contain the pre-polymerized oligomers or polymers when being reused for the next polymerization reaction. A base, acid, or buffer solution may be added to the polymerization reaction composition in order to adjust the pH. In some cases, a polymerization initiator may be further contained in the polymerization reaction composition.

Monomer

The monomers used in the polymerization reaction are self-initiating monomers whose polymerization reaction is initiated spontaneously. These monomers are basic compounds represented by Chemical Formulas 1 to 11.

Two or More Monomers

The polymerization reaction taking place on the surface of an aluminum thin film may involve two or more monomers. For example, the resulting polymer may be a copolymer by cross-addition polymerization between isomeric compounds having similar structures, such as a copolymer of 3,4-diaminopyridine and 2,6-diaminopyridine, a copolymer by cross-addition polymerization between monomers having greatly different structures, such as a copolymer of 2,5-diaminopyridine and 3-amino-2-cyclohexen-1-one or a copolymer of 2,4,6-triaminopyrimidine and methyl 3-aminocrotonate, a copolymer by a Diels-Alder polymerization reaction between furfurylamine and methyl 3-aminocrotonate, or the like.

Monomer Concentration in Polymerization Reaction Composition

The concentration of the monomer in the composition for the polymerization reaction is about 0.001, 0.005, 0.01, 0.05, 0.1, 0.5, 1.0, 1.5, 2.0, 2.5, 3.0, 3.5, 4.0, 4.5, 5.0, 5.5, 6.0, 6.5, 7.0, 7.5, 8.0, 8.5, 9.0, 9.5, 10, 10.5, 11, 11.5, 12, 12.5, 13, 13.5, 14, 14.5, 15, 15.5, 16, 16.5, 17.5, 18, 18.5, 19.5, or 20 mg/mL. The concentration of the monomer may fall within a range obtained by selecting two of the numbers listed in the immediately preceding sentence. For example, the monomer concentration may range from about 2.0 to about 5.0 or from about 1.0 to about 7.0.

Basic Composition

According to an implementation, the polymerization reaction composition is adjusted to have a basic pH of 8 or higher. Although the monomers of the compounds represented by Chemical Formulas 1 to 11 themselves are basic, basic substances such as sodium hydroxide (0.01 M, 0.1 M, 1 M or the like), 15% to 20% DMEA (N,N-dimethylethylamine, CAS 598-56-1) or 15% to 20%2-dimethylaminoethanol (CAS 108-01-0) (pH: near 13), and a boric acid/sodium borate buffer solution (pH: near 9) may be added to the polymerization reaction composition in order to adjust the pH of the composition.

Polymerization Inhibitor

Although the compounds represented by Chemical Formulas 1 to 11 are self-initiating monomers that undergo a polymerization reaction without an initiator, most of these are not monomers of which the polymerization reaction rapidly takes place. Hence, unlike other monomers for polymerization reactions contain polymerization inhibitors, a large number of the compounds represented by Chemical Formulas 1 to 11 are stored and distributed without a polymerization inhibitor. In the case of using such monomers, the polymerization reaction composition does not contain a polymerization inhibitor.

Without Initiator

The polymerization reaction may be performed without a separate initiator. In the case of a polymer-metal laminate to be used in the encapsulation apparatus for OLED, the organic light emitting layer of OLED is adversely affected when the polymer layer contains an initiator. Hence, the polymerization reaction composition does not contain a polymerization initiator such as a radical initiator or a photoinitiator. This is because the monomers represented by Chemical Formulas 1 to 11 are self-initiating monomers that undergo a polymerization reaction without an initiator. Depending on the substance on the substrate surface, the polymerization reaction may easily take place without an initiator. For example, when a polymerization reaction is performed on the surface of a metal substrate, a hydroxyl group derived from the oxide film formed on the metal surface and a monomer act to initiate a reaction.

Case of Containing Initiator

Although the monomers represented by Chemical Formulas 1 to 11 are self-initiating, it is also possible to promote the polymerization reaction using an initiator depending on the substance on the substrate surface. The polymerization reaction composition may contain an initiator as long as the final product is allowed to contain an initiator. For example, when the polymer layer is formed on the battery separator, an initiator may be contained. Examples of compounds that may be used as an initiator include AIBN (azobisisobutyronitrile), ABCN (1,1'-azobis(cyclohexane-carbonitrile)), di-tert-butyl peroxide, and benzoyl peroxide. When these initiators reach a certain temperature, the initiators generate radical intermediates, and these produced substances react with the monomer to cause a polymerization reaction.

Temperature of Polymerization Reaction Composition

The polymerization reaction is performed at a temperature lower than the boiling point of the solvent used. The temperature of the polymerization reaction composition is adjusted to about 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., 90° C., 95° C., or 100° C. This temperature may fall within a range obtained by selecting two of the numbers listed in the immediately preceding sentence. For example, the temperature of the polymerization reaction composition ranges from about 20° C. to about 70° C., from about 40° C. to about 90° C., or from about 10° C. to about 30° C.

Contact Time with Polymerization Reaction Composition

The time for which the metal laminate is in contact with the polymerization reaction composition may be about 0.5, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 42, 44, 46, 48, 50, 52, 54, 56, 68, 60, 62, 64, 66, 68, 70, 72, 74, 76, 78, or 80 hours. The time for which the metal laminate is in contact with the polymerization reaction composition may fall within a range obtained by selecting two of the numbers listed in the immediately preceding sentence. For example, the time for the polymerization reaction may range from about 2 to about 10 hours, from about 6 to about 12 hours, or from about 8 to about 24 hours.

Polymer Layer

In the polymerization reaction, polymer chains of various sizes are produced and dimers, trimers, tetramers and oligomers are also produced. Some of the dimers, trimers, tetramers, oligomers and polymers produced form chemical bonds with the surface of the substrate. As a result, the polymer layer contains polymer chains of various sizes, and may contain dimers, trimers, tetramers, and oligomers.

Removal of Liquid Remaining on Surface of Metal Laminate Having Polymer Layer Formed Thereon When a polymer layer is formed on the surface of the metal laminate by the contact of the metal laminate with the polymerization reaction composition in the polymerization reaction vessel, the metal laminate is taken out of the polymerization reaction vessel. Next, the surface is wiped or touched with absorbent paper or an absorbent pad to remove the liquid components of the polymerization reaction composition remaining on the polymer layer or the surface of the laminate. In some cases, washing with water or another washing solution is performed before or after the liquid components are wiped off. The liquid on the surface is wiped off when washing is performed.

Baking

After the liquid on the surface is removed, baking is performed in an oven. Baking serves to evaporate the liquid components remaining in the polymer layer, crosslink the polymers formed in the polymer layer, and cure and harden the polymer layer.

Baking Temperature

Baking is carried out at a low temperature such that the plastic layer is not denatured, and is performed at about 40° C., 45° C., 50° C., 55° C., 60° C., 65° C., 70° C., 75° C., 80° C., 85° C., 90° C., 95° C., 100° C., 105° C., 110° C., 115° C., 120° C., 125° C., 130° C., 135° C., 140° C., 145° C., or 150° C. The temperature for the baking may fall within a range obtained by selecting two of the numbers listed in the immediately preceding sentence. For example, baking is performed in a range of about 50° C. to about 100° C. or a range of about 60° C. to about 110° C.

Baking Time

Baking is performed for about 0.5, 1, 2, 3, 4, 5, 6, 7, 8, 9, 10, 11, or 12 hours. The baking time may fall within a range obtained by selecting two of the numbers listed in the immediately preceding sentence. For example, baking is performed in a range of about 2 hours to about 5 hours or a range of about 4 hours to about 6 hours.

Washing and Drying

When baking is complete, washing is performed in order to remove residual substances remaining on the polymer layer. The polymer layer contains the components of the polymerization reaction composition or substances produced as a result of the polymerization reaction. Some of these substances are firmly bonded to the metal surface, the plastic surface, and the polymers attached to these surfaces, but others are loosely connected thereto. The residual substances loosely connected to the polymer layer may be removed by performing washing with an acidic washing solution and a basic washing solution. After washing is complete, drying is performed. Drying may be performed in an oven.

Reuse of Resulting Mixture of Polymerization Reaction

When the polymerization reaction is complete, the polymer-metal laminate (for example, polymer-metal-foil laminate or polymer-metal-plastic laminate) is taken out of the vessel for the polymerization reaction. As a result, the composition remaining in the vessel for the polymerization reaction contains a mixture of the monomers, which have not participated in the reaction and remained in the solution, and the polymers, oligomers, and dimers produced as a result of the polymerization reaction. This composition, which contains the polymers, oligomers and dimers together, is not discarded but may be used for the next polymerization reaction. In other words, a new metal laminate is immersed in the composition remaining after being used in the previous polymerization reaction, and a polymerization reaction is performed to fabricate a polymer-metal laminate. In this case, the polymers, oligomers, and dimers already contained in the composition may be contained in the polymer layer to be produced, and these polymers, oligomers, and dimers may participate in the polymerization reaction to produce larger polymers or oligomers. Before the next polymerization reaction of the metal laminate is performed, necessary components may be added to the composition in order to adjust the concentration of the monomer contained in the composition, as well as the pH and the like thereof.

XV. FILLING OF PINHOLE IN METAL LAYER BY POLYMERIZATION REACTION

Capillary Phenomenon

The polymerization reaction composition solution in contact with the surface of the metal layer of the metal laminate enters defective sites such as pinholes and hollows. The composition solution is sucked or permeated into the defective sites by capillary phenomenon.

Polymerization Reaction in Defects or Pinholes of Metal

The monomers or oligomers that have entered the defects or pinholes of the metal layer interact with the inner surface of the pinholes and grow into an oligomer or polymer to fill the pinholes. Although the oligomer or polymer does not completely fill the whole space of the pinholes formed through the metal layer, namely, the whole space of the pinholes from the entrance on one side of the metal layer to the entrance on the opposite side, the oligomer or polymer fills or plugs part of that space so that air or water hardly passes through the pinholes.

Dissolution of Metal Surface

When the polymerization reaction composition solution comes into contact with the surface of the metal layer, the metal and metal oxide on the outermost surface of the defect included in the metal layer may be dissolved in the composition solution depending on the acidity of this solution. In particular, at the site of defects such as pinholes where the thickness of the metal layer is rapidly thinned or the metal layer disappears, some of the metal atoms are dissolved, thus a smoothing phenomenon that smooths the steep structure of defects may be caused, and the entrance of defects may be widened.

Defect Smoothing Effect

Smoothing allows the monomer to penetrate deep into the defects such as pinholes, the polymerization reaction to take place in the deep place of defects, and the polymers or oligomers to fill the defects. Although the polymerization reaction does not take place in the deep sites of defects, as the entrances of the defects gradually widens and the polymerization reaction takes place there, the polymers or oligomers can fill the defects to a certain depth from the entrance of defects. Filling the entrances or deep sites of defects with the polymers (including oligomers) eventually results in hindering the longitudinal passage of gases such as oxygen or water vapor through the metal layer.

Control of Polymerization Reaction for Smoothing

Depending on the acidity of the polymerization reaction composition solution, the smoothing phenomenon proceeds while the composition solution is in contact with the surface of the metal layer. The degree of smoothing phenomenon may be controlled by adjusting the acidity of the polymerization reaction composition. The initiation of the polymerization reaction may be controlled so that the polymerization reaction takes place after the smoothing phenomenon occurs at the defects of the metal layer. After the metal foil laminate may be immersed in an acidic or basic solution (not the polymerization reaction composition solution) having a proper acidity so that the smoothing phenomenon may be caused, the metal foil laminate may be immersed in the composition solution in the polymerization reaction vessel and the polymerization reaction may be performed.

XVI. DIFFERENCE FROM COATING WITH PRE-POLYMERIZED POLYMER

Method of Forming Polymer Layer on Surface

According to implementations of the present invention, the surface of the metal layer and the surface of the plastic film are brought into contact with the polymerization reaction composition, and a polymerization reaction is performed to form a polymer layer on the surfaces. An easier method to form a polymer layer on the surface of a substrate is to coat the surface with a pre-polymerized polymer. The formation of a polymer layer by a polymerization reaction is different from the coating of a pre-polymerized polymer.

Pre-Polymerized Polymer

Commercially available pre-polymerized polymers usually have predetermined ranges of molecular weights. This is because the same polymer having different molecular weights is used in different cases depending on the application. These commercially available polymers are almost free from impurities with significantly small molecular weights, such as monomers, dimers, trimers, and tetramers contained in the resulting mixture of the polymerization reaction during the manufacturing process. Polymers indicated to have molecular weights within specific ranges (not oligomers) are also relatively free of oligomers composed of 10 to 20 monomers, which had been already removed during the manufacturing process.

Coating of Surface with Pre-Polymerized Polymer

Polymers with significantly high molecular weights may be easily formed into a polymer coating layer by dissolving the compound into a solvent to prepare a coating solution, applying this coating solution to the surface of the substrate, and then evaporating the solvent. In addition to the solvent and the polymer, other substances are added to the coating solution for the coating of pre-polymerized polymer onto the surface.

Coating of Surface with Pre-Polymerized Polymer—Surfactant

To form a polymer layer having a constant thickness on the surface, the coating solution needs to be evenly spread on the surface of the substrate. A surfactant is added to the coating solution to evenly spread the coating solution on the surface of the substrate. As a result, when the pre-polymerized polymer is coated on the surface, the resulting coating layer contains a surfactant.

Coating of Surface with Pre-Polymerized Polymer—Binder

Depending on the substrate surface, the nature of the polymer, and the morphology such as the roughness of the substrate surface, the polymer coating layer may not adhere well to the substrate surface. For adhesion to the substrate surface, a binder is added to the coating solution. In particular, most polymers do not bind with the metal surface very strongly. Hence, in order to coat a pre-polymerized polymer on a metal surface, a binder, such as an epoxy resin, a polyurethane resin, a silicone resin, a vinyl resin, or an acrylic resin, is added to the coating solution. The resulting polymer coating layer contains a binder.

Coating of Surface with Pre-Polymerized Polymer—Oligomer

The polymer layer formed by coating a pre-polymerized polymer on a substrate surface is less likely to contain compounds having significantly lower molecular weights, such as monomers, dimers, trimers, and tetramers, or oligomers. This is because these small compounds are impurities and thus hardly contained in pre-polymerized polymers indicated to have molecular weights within specific ranges.

Pre-Polymerized Polymer—not Forming Chemical Bond and not Entering Pinhole

When a pre-polymerized polymer is applied as coating, the polymer is less likely to form chemical bonds with the metal surface. Polymers pre-polymerized from the compounds represented by Chemical Formulas 1 to 11 also hardly form chemical bonds with the metal surface. This is also the reason why a binder is needed. Moreover, when a pre-polymerized polymer is applied, the probability that the polymer enters the pinholes of the metal is not high. This is both due to the bulkiness of the polymer and to the limited time for the coating and the evaporation of the coating solution.

Polymerization Reaction Taking Place on Substrate Surface

According to an implementation of the present invention, a polymerization reaction takes place as the polymerization reaction composition comes in contact with the surface of a substrate such as a metal or a plastic film. The compounds represented by Chemical Formulas 1 to 11 may be chemically bonded and connected to the surface of the substrate while interacting with the surface of the substrate. The compounds represented by Chemical Formulas 1 to 11 grow into dimers, trimers, tetramers, and oligomers by a chain polymerization reaction to form a polymer. As a result, the resulting mixture of the polymerization reaction contains polymers of various sizes and one or more of dimers, trimers, tetramers or oligomers. When this composition is reused for the next substrate, the resulting mixture may contain polymers of more various sizes.

Polymer Layer by Polymerization Reaction-Monomer, Dimer, Trimer, Tetramer, Oligomer Polymers of various sizes and oligomers are present as mixture in the polymer layer formed by the polymerization reaction on the substrate surface according to an implementation of the present invention. In addition, one or more of monomers, dimers, trimers, or tetramers are also present therein. The purity of polymers having molecular weights within specific ranges is not particularly high in this polymer layer; on the contrary, this polymer layer contains polymers having various molecular weights, and also contains a considerable amount of oligomers. The monomers, dimers, trimers, and tetramers may be removed during the washing process, but considerable amounts thereof remain in the polymer layer when these are chemically bonded to the substrate surface. Consequently, any one of monomers, dimers, trimers, and tetramers are present in the polymer layer in an amount that is remarkably distinguishable amounts compared to the case of a polymer layer obtained by coating a commercially available pre-polymerized polymer.

Polymer Layer by Polymerization Reaction—Surfactant

Surfactants usually used in the coating of a pre-polymerized polymer are not required for polymerization reactions on a substrate surface according to an implementation of the present invention. The polymer layer formed by performing the polymerization reaction without a surfactant does not contain a surfactant. Nevertheless, a surfactant may be added to the composition for the polymerization reaction, and as a result, a surfactant may be contained in the polymer layer to be produced.

Polymer Layer by Polymerization Reaction—Binder

When a polymerization reaction on a substrate surface is performed according to an implementation of the present invention, plenty of monomers, dimers, trimers, tetramers, oligomers, and polymers are connected to the surface by chemical bonds. Hence, this polymerization reaction does not require a binder used in the coating of pre-polymerized polymer. The polymer layer formed by performing the polymerization reaction without the addition of a binder does not contain a binder. Nevertheless, a binder may be added to the composition for the polymerization reaction, and as a result, a binder may be contained in the polymer layer to be produced.

Polymerization Reaction to Fill Pinhole

The polymerization reaction according to an implementation of the present invention not only produces a polymer layer on the surface of a metal substrate, but also fills or plugs pinholes formed in the metal layer. The monomer or oligomer contained in the polymerization reaction composition enters the pinholes of the metal and interacts with its inner surface to form a chemical bond, and also grows by the polymerization reaction to fill a part or the whole of the space inside the pinholes. The polymer or oligomer formed in the pinholes in this way may extend outside the pinholes and may be connected to the oligomer or polymer produced outside the pinholes.

XVII. COATING OF SEPARATOR

Separator of Lithium Ion Battery

A separator forms a physical layer between the positive and negative electrodes of a lithium ion battery to prevent short circuits caused by direct contact between the positive and negative electrodes. To this end, the separator needs to guarantee electrochemical safety and thermal stability and sustain a certain level of mechanical strength. At the same time, the separator needs to allow lithium ions in the electrolyte to pass to generate an electric current. To facilitate this, the separator needs to be porous, thin, and exhibit high affinity for the electrolyte solution.

Polyolefin Material

The separator of a lithium ion battery is generally a microporous polymer membrane, and is usually fabricated using a polyolefin-based material such as polyethylene or polypropylene. Polyethylene and polypropylene exhibit suitable electrochemical stability and proper mechanical strength as a separator. However, the polyolefin-based material exhibits low affinity for the electrolytic solution because of the low hydrophilicity thereof, and this increases the resistance during ion conduction and thus decreases the performance of the battery.

Coating

Studies to improve the hydrophilicity of the polyolefin-based separators have been actively performed. For example, methods such as ceramic coating or polymer coating can be adopted.

Ceramic Coating

Figure 7:
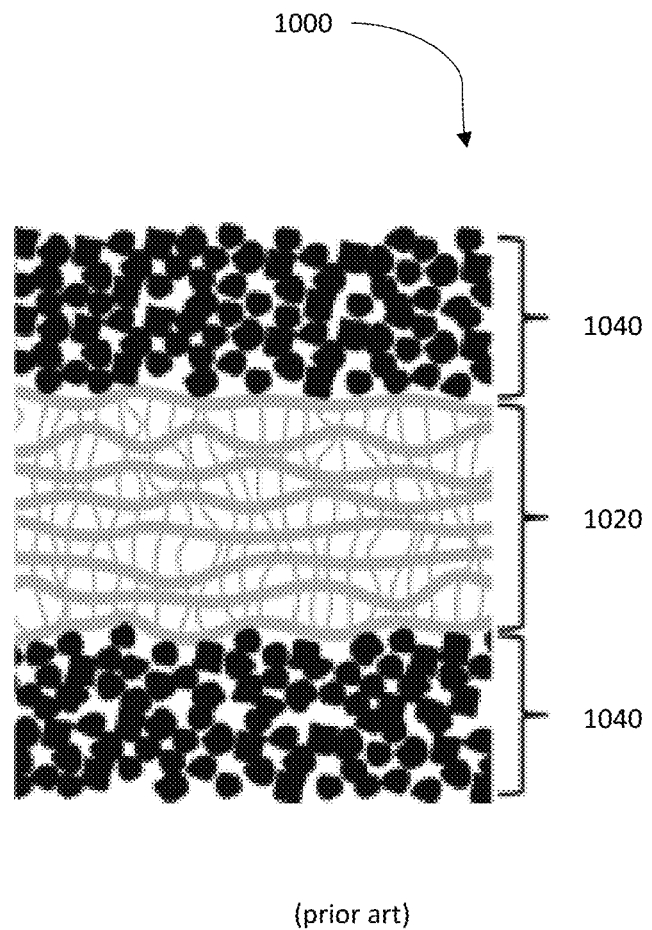
FIG. 7 illustrates the structure of an existing coating of a separator.

Currently, there exist commercial methods in which both the heat resistance and the hydrophilicity of a polyolefin separator are enhanced by coating one surface or both surfaces of the polyolefin separator with a high heat-resistant ceramic layer. For example, slurries containing a mixture of inorganic particles such as aluminum oxide and an organic binder have been routinely prepared, and applied to the surface of a polyolefin separator by methods such as dip coating. In this case, as illustrated in FIG. 7, a ceramic layer 1040 containing inorganic particles is formed on the surface of a polyolefin separator 1020 to form a structure in which the separator 1020 is sandwiched between the ceramic layers 1040.

Disadvantage of Ceramic Coating

If the whole separator is coated with ceramic to form the ceramic layer, the pores are plugged and the ventilation properties deteriorate, and thus the resistance is increased during ion conduction, and this may adversely affect the battery performance. In order to prevent or alleviate this, a process of forming pores in the coating layer is essential. The polyolefin-based separator exhibits poor adhesive properties to the ceramic coating layer because of the low surface energy thereof, and the coating layer may be easily detached during the assembly of the secondary batteries, or even within the battery a part of the inorganic coating layer may be easily detached. When the ceramic layer is easily detached, the stability of the battery decreases, and product defects tend to increase due to foreign substances generated during the slitting or assembly process. In order to solve these problems, processes such as processing of inorganic particles or multi-layer coating are being developed, but introducing these additional processes may result in increasing unit cost.

Polymer Coating

As an alternative to ceramic coating, a method of coating the separator with a polymer has been extensively studied recently since it is more feasible and easy to mass-produce. Representative examples of surface coatings for polyolefin-based separators include fluorine-based polymers such as PVdF (polyvinylidene difluoride) and PVdF-HFP (polyvinylidene fluoride-co-hexafluoropropylene).

Disadvantage of Polymer Coating

Polymer coating, like the ceramic, may also plug pores and deteriorate ventilation properties when the whole separator is coated with a polymer. To improve the hydrophilicity, a hydrophilic polymer needs to be used, but the polyolefin-based material is hydrophobic, so the adhesion between the polymer layer and the olyolefin-based separator is poor. The polymer coating has another disadvantage that the coated layer is prone to detachment during the charging and discharging process, deteriorating the performance and stability of the batteries.

Separator Substrate

An implementation of the present invention provides a method of forming a polymer layer on a separator by a polymerization reaction of a monomer instead of the ceramic coating or the polymer coating. As for the separator substrate on which a polymer layer is formed, any separator material known to be suitable for lithium ion batteries can be used. For example, the separator substrate may be selected from various microporous polymer separators.

Material of Separator Substrate

As for the material of the separator, any material offering excellent insulation and possessing appropriate physical properties required for the separator of a lithium-ion battery, can be used. For example, the separator material may be one or more selected from the group consisting of commonly used polyethylene and polypropylene, PVdF, polyester, polyacrylonitrile (PAN), polyethylene terephthalate (PET), and the like.

Structure of Separator Substrate

The structure of the separator is macroscopically robust and microscopically porous. For example, the separator may have a structure having pores in a thin film formed by an extrusion method or the like, or a woven structure or a non-woven structure. For example, the separator substrate may have a woven structure of polyethylene fibers or may be in the form of a woven fabric of polypropylene fibers.

Pores

To facilitate the conduction of lithium ions in the thickness direction of the separator, the separator needs to have sufficient number of pores, and the sizes of the pores are desired to be as uniform as possible. For example, the separator may have a porosity of 30% to 60%, and the average diameter of the pores may be 0.01, 0.02, 0.03, 0.05, 0.07, 0.10, 0.15, 0.20, 0.25, 0.30, 0.35, 0.40, 0.45, 0.50, 0.60, 0.70, 0.80, 0.90, 1, 1.1, 1.2, 1.3, 1.4, 1.5, 1.7, 1.9, 2.1, 2.4, 2.7, or 3 µm. The average diameter of the pores may fall within a range obtained by selecting two of the values listed in the immediately preceding sentence. The pores have an interconnected structure and may conduct lithium ions from one surface to the other surface in the longitudinal direction of the separator along the thickness.

Thickness of Separator

A thin separator is preferred to facilitate the conduction of lithium ions through the thickness of the separator, but a certain minimal thickness is needed for stability. For example, the thickness of the separator may be 10, 12, 14, 16, 18, 20, 22, 24, 26, 28, 30, 32, 34, 36, 38, 40, 42, 44, 46, 48, or 60 µm. The thickness of the separator may fall within a range obtained by selecting two of the values listed in the immediately preceding sentence.

XVIII. FABRICATION OF COATED SEPARATOR BY POLYMERIZATION REACTION

Preparation of Composition Solution

The composition solution for fabricating a coated separator may be the same as or similar to the monomer solution described above. For example, the composition solution may contain the compounds represented by Chemical Formulas 1 to 11. The composition solution may further contain an organic/inorganic filler to enhance the stability of the separator.

Bringing of Separator into Contact with Composition Solution

A polymerization reaction vessel (or reservoir) having a size that can accommodate the separator is prepared. A polymerization reaction composition solution is filled in this vessel. The separator is then brought into contact with the polymerization reaction composition solution in the vessel. A polymerization reaction takes place on the surface of the separator in contact with the composition solution and a polymer layer is formed.

Immersion of Separator in Composition Solution

When the separator is put into the polymerization reaction vessel, only one of the two surfaces may be brought into contact with the composition solution, or the whole separator may be immersed in the composition solution so that both surfaces are submerged in the composition solution. The productivity of the process may be increased when a plurality of separators is immersed together in the composition solution in one polymerization reaction vessel to perform the polymerization reaction. A plurality of separators may also be immersed in the composition solution so as to be stacked one over another. In this case, a spacing structure for maintaining the distance between adjacent separators may be inserted so that the composition solution may enter between the separators.

Coated Separator Having Polymer Layer Formed on Separator Surface

When a polymerization reaction is initiated in the composition solution in contact with the surface of the separator, a polymer is produced on the surface of the separator. This polymer forms a polymer layer on the separator surface, and macroscopically, a polymer layer layered in the order of separator-polymer layer is formed. The separator on which a polymer layer is formed in this way is called a "coated separator."

Coated Separator Having Polymer Layer on Both Sides

A polymer layer may be formed on both surfaces of the separator when the separator is immersed in the composition solution so that both surfaces are submerged in the composition solution and the polymerization reaction is performed. Macroscopically, a polymer layer layered in the order of polymer-separator-polymer layer is formed.

Polymer Layer

By the polymerization reaction, polymers of various sizes as well as oligomers and dimers are produced. As a result, the polymer layer of the coated separator contains polymers of various sizes, and may also contain oligomers and dimers.

Polymerization Reaction in Pore

Figure 8:
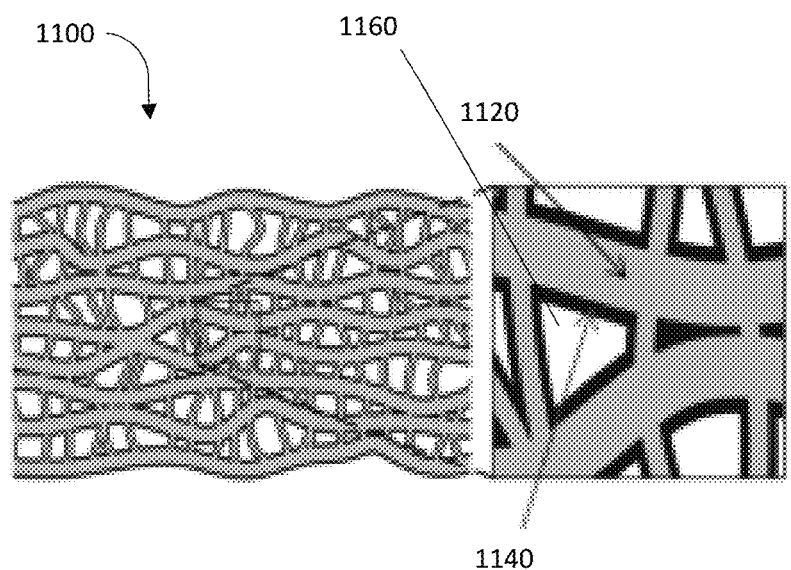
FIG. 8 illustrates the structure of a coated separator according to an implementation.

A part of the composition solution in contact with the surface of the separator may enter some pores of the separator. When the monomer that has entered the pores of the separator undergoes a polymerization reaction, the monomer is bonded to at least a part of the inner surface of the separator surrounding the pores to form a polymer covering at least a part of the inner surface of the pores. FIG. 8 illustrates an example of a polymer layer formed on the inner surface of the pores of the porous separator. As illustrated in FIG. 8, a polymer layer 1140 formed on the inner surface surrounding a pore 1160 of a porous separator 1120 improves the hydrophilicity of the pore, and thus the conduction of lithium ions dissolved in the electrolyte solution is improved.

Washing and Drying

When the polymerization reaction is complete, the coated separator is taken out of the vessel and washed with water or another washing solution to remove unnecessary substances on the surface. After washing is complete, drying is performed.

XIX. COATED SEPARATOR

Attachability of Polymer Layer

Instead of dissolving a pre-polymerized polymer into a solvent and applying to the separator surface, a monomer is polymerized on the separator surface to form a polymer layer, and thus the polymer layer is excellently attached to the separator surface.

Pore and Polymer Layer

The pores of the separator are channels that conduct lithium ions. Hence, when the coating layer fills or plugs the pores of the separator, the lithium ion conductivity may decrease and the performance of the battery may deteriorate. In the implementation, a polymerization reaction is performed while the separator is immersed in or brought into contact with a polymerization reaction composition containing a monomer but not in a polymer solution, thus a polymer is produced in situ while the monomer is spread on the surface of the separator molecule by molecule, and thus plugging of the pores may be minimized compared to the case in which the polymer itself is dissolved into a solvent and applied as coating. The hydrophilic polymer layer formed in the vicinity of the pores helps lithium ions to pass through the pores and be conducted.

Effect

According to an implementation of the present invention, a coated separator having a greatly enhanced ionic conductivity by forming a hydrophilic polymer layer on the separator surface can be prepared. At the same time, the polymer layer enhances the thermal stability and physical properties of the separator. Moreover, as the polymer layer is formed by strongly bonding in monomer units to the separator, the risk of coating detachment by repeated discharging and recharging can be minimized. Furthermore, as the polymer layer is formed by bonding monomers to the separator, the physical form of the separator is not limited to a thin film type; for example, a fabric structure type separator can also get coated. The monomer may also permeate into the nanoscopic pores to form a hydrophilic polymer layer inside the pores. Such polymer layers with many advantages may be formed through a relatively simple and inexpensive process.

XX. POLYMERIZATION REACTION ON SEPARATOR SURFACE

Composition for Polymerization Reaction

The composition for the polymerization reaction occurring on the separator surface contains a monomer and a solvent, and may further contain an oligomer or polymer obtained by pre-polymerizing the monomer. A base, acid, or buffer solution may be added to the composition in order to adjust the pH. In some cases, a polymerization initiator may be further contained in the composition. The composition solution may further contain an organic/inorganic filler in order to enhance the stability of the separator.

Monomer

The monomer used in the polymerization reaction is a self-initiating monomer in which the polymerization reaction is initiated spontaneously. This monomer is a basic compound and is a compound represented by Chemical Formulas 1 to 11.

Two or More Monomers

The polymerization reaction taking place on the surface of the separator may be a polymerization reaction using two or more monomers. For example, may be a copolymer by cross-addition polymerization between isomeric compounds having similar structures, such as a copolymer of 3,4-diaminopyridine and 2,6-diaminopyridine, a copolymer by cross-addition polymerization between monomers having greatly different structures, such as a copolymer of 2,5-diaminopyridine and 3-amino-2-cyclohexen-1-one or a copolymer of 2,4,6-triaminopyrimidine and methyl 3-aminocrotonate, a copolymer by a Diels-Alder polymerization reaction between furfurylamine and methyl 3-aminocrotonate, or the like.

Monomer Concentration in Polymerization Reaction Composition

The concentration of the monomer in the composition for the polymerization reaction is about 0.001, 0.005, 0.01, 0.05, 0.1, 0.5, 1.0, 1.5, 2.0, 2.5, 3.0, 3.5, 4.0, 4.5, 5.0, 5.5, 6.0, 6.5, 7.0, 7.5, 8.0, 8.5, 9.0, 9.5, 10, 10.5, 11, 11.5, 12, 12.5, 13, 13.5, 14, 14.5, 15, 15.5, 16, 16.5, 17.5, 18, 18.5, 19, 19.5, or 20 mg/mL. The concentration of the monomer may fall within a range obtained by selecting two of the numbers listed in the immediately preceding sentence. For example, the monomer concentration may range from about 2.0 to about 5.0 or from about 1.0 to about 7.0.

Basic Composition

According to an implementation, the polymerization reaction composition is adjusted to have a basic pH of 8 or more. Although the monomers of the compounds represented by Chemical Formulas 1 to 11 themselves are basic, basic substances such as sodium hydroxide (0.01 M, 0.1 M, 1 M or the like), 15% to 20% DMEA (N,N-dimethylethylamine, CAS 598-56-1) or 15% to 20%2-dimethylaminoethanol (CAS 108-01-0) (pH: near 13), and a boric acid/sodium borate buffer solution (pH: near 9) may be added to the polymerization reaction composition to adjust the pH of the composition.

Initiator

According to an implementation, the composition for the polymerization reaction does not contain a radical initiator or a photo initiator. According to another implementation, the composition may contain an initiator.

Initiation of Polymerization Reaction

The polymerization reaction is usually performed without the addition of a separate initiator, but may be performed with the addition of an initiator in some cases. The polymerization reaction is performed at a temperature lower than the boiling point of the solvent, and usually at 0° C. to 90° C. When the polymerization reaction is performed without the addition of an initiator, the polymerization reaction is initiated as the nucleophilic functional group on the substrate surface reacts with the unsaturated bond of the compounds represented by Chemical Formulas 1 to 11.

Case of Containing Initiator

Although the monomers of the compounds represented by Chemical Formulas 1 to 11 are self-initiating, in some cases, it is required to initiate the polymerization reaction using an initiator depending on the substance on the substrate surface. Examples of compounds that may be used as an initiator include AIBN (azobisisobutyronitrile), ABCN (1,1'-azobis (cyclohexane-carbonitrile)), di-tert-butyl peroxide, and benzoyl peroxide. When these initiators reach a certain temperature, the initiators generate radical intermediates, and these produced substances react with the monomer to cause a polymerization reaction. For example, in the case of using AIBN as an initiator, the certain temperature may be 40° C., 45° C., 50° C., 55° C., 60° C., 65° C., or 70° C.

Temperature of Polymerization Reaction Composition

The polymerization reaction is performed at a temperature lower than the boiling point of the solvent used. The temperature of the polymerization reaction composition is adjusted to about 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., 90° C., 95° C., or 100° C. This temperature may fall within a range obtained by selecting two of the numbers listed in the immediately preceding sentence. For example, the temperature of the polymerization reaction composition ranges from about 20° C. to about 70° C., from about 40° C. to about 90° C., or from about 10° C. to about 30° C.

Contact Time with Polymerization Reaction Composition

The time for which the separator substrate is in contact with the polymerization reaction composition may be about 0.5, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 42, 44, 46, 48, 50, 52, 54, 56, 68, 60, 62, 64, 66, 68, 70, 72, 74, 76, 78, or 80 hours. The time for which the separator substrate is in contact with the polymerization reaction composition may fall within a range obtained by selecting two of the numbers listed in the immediately preceding sentence. For example, the time for the polymerization reaction may range from about 2 to about 10 hours, from about 6 to about 12 hours, or from about 8 to about 24 hours.

Removal of Liquid Remaining on Surface of Separator Having Polymer Layer Formed Thereon When a polymer layer is formed on the surface of the separator by the contact of the separator with the polymerization reaction composition in the polymerization reaction vessel, the separator is taken out of the polymerization reaction vessel. Next, the surface is wiped or touched with absorbent paper or an absorbent pad to remove the liquid components of the polymerization reaction composition remaining on the polymer layer or the surface of the separator. In some cases, washing with water or another washing solution is performed before or after the liquid components are wiped off. The liquid on the surface is wiped off when washing is performed.

Baking

After the liquid on the surface is removed, baking is performed in an oven. Baking serves to evaporate the liquid components remaining in the polymer layer, crosslink the polymers formed in the polymer layer, and cure and harden the polymer layer.

Baking Temperature

Baking is carried out at a low temperature such that the separator substrate is not denatured, and is performed at about 40° C., 45° C., 50° C., 55° C., 60° C., 65° C., 70° C., 75° C., 80° C., 85° C., 90° C., 95° C., 100° C., 105° C., 110° C., 115° C., 120° C., 125° C., 130° C., 135° C., 140° C., 145° C., or 150° C. The temperature for the baking may fall within a range obtained by selecting two of the numbers listed in the immediately preceding sentence. For example, baking is performed in a range of about 50° C. to about 100° C. or a range of about 60° C. to about 110° C.

Baking Time

Baking is performed for about 0.5, 1, 2, 3, 4, 5, 6, 7, 8, 9, 10, 11, or 12 hours. The baking time may fall within a range obtained by selecting two of the numbers listed in the immediately preceding sentence. For example, baking is performed in a range of about 2 hours to 5 hours or a range of about 4 hours to about 6 hours.

Thickness of Polymer Layer

The thickness of the polymer layer may be about 0.1, 0.2, 0.3, 0.4, 0.5, 0.6, 0.7, 0.8, 0.9, 1, 1.2, 1.4, 1.5, 1.6, 1.8, 2, 2.5, 3, 4, 5, 6, 7, 8, 9, 10, 12, 15, 20, 25, or 30 μm. The thickness of the polymer layer may fall within a range obtained by selecting two of the numbers listed in the immediately preceding sentence. For example, the polymer layer may have a thickness ranging from about 0.5 to about 3 μm or from about 1 to about 5 μm.

Washing and Drying

When baking is complete, washing is performed in order to remove residual substances remaining on the polymer layer. The polymer layer contains the components of the polymerization reaction composition or substances produced as a result of the polymerization reaction. Some of these substances are firmly bonded to the metal surface, the plastic surface, and the polymers attached to these surfaces, but others are loosely connected thereto. The residual substances loosely connected to the polymer layer may be removed by performing washing with an acidic washing solution and a basic washing solution. After washing is complete, drying is performed. Drying may be performed in an oven.

Reuse of Resulting Mixture of Polymerization Reaction

When the polymerization reaction is complete, the coated separator is taken out of the vessel for the polymerization reaction. As a result, the composition remaining in the vessel for the polymerization reaction contains a mixture of the monomers, which have not participated in the reaction and remain in the solution, and the polymers, oligomers, and dimers produced as a result of the polymerization reaction. This composition, which contains the polymers, oligomers and dimers together, is not discarded but may be used for the next polymerization reaction. In other words, a new separator is immersed in the composition remaining after being used in the previous polymerization reaction, and a polymerization reaction is performed to fabricate a coated separator. In this case, the polymers, oligomers, and dimers already contained in the composition may be contained in the polymer layer to be produced, and these polymers, oligomers, and dimers may participate in the polymerization reaction to produce larger polymers or oligomers. Before the next polymerization reaction of the separator is performed, necessary components may be added to the composition in order to adjust the concentration of the monomers contained in the composition, as well as the pH and the like thereof.

XXI. EXPERIMENTAL EXAMPLES

Hereinafter, experiments and the like implementing various implementations of the present invention will be described. The protection scope of the present invention is by no means limited only to the Experimental Examples described below.

Experiment 1: Modification of Glass Slide with 2,5-diaminopyridine

A solution having a concentration of 1 mg/1 mL was prepared by adding 2,5-diaminopyridine to a borate buffer (50 mM) having a pH of 9.0. A glass slide was immersed in the solution and incubated at 90° C. for 20 hours. The glass slide was taken out, placed in an oven at 60° C. for 3 hours, and then washed with an NaOH solution for 20 seconds. The glass slide was then washed with a sufficient amount of water and dried at 60° C. for 5 minutes. Again, the glass slide was washed with an HCl solution for 20 seconds, washed with a sufficient amount of water, and then dried at 60° C. for 5 minutes.

Comparative Example 1

A glass slide having the same dimensions as that used in Example 1 was immersed in a borate buffer (50 mM) having a pH of 9.0 and incubated at 90° C. for 20 hours. The glass slide was taken out, placed in an oven at 60° C. for 3 hours, and then washed with an NaOH solution for 20 seconds. The glass slide was then washed with a sufficient amount of water and dried at 60° C. for 5 minutes. Again, the glass slide was washed with an HCl solution for 20 seconds, washed with a sufficient amount of water, and then dried at 60° C. for 5 minutes.

Example 2: Modification of Aluminum Plate with 2,5-diaminopyridine

A modified sample was prepared in the same manner as in Example 1 except that an aluminum plate was used.

Comparative Example 2

A comparative example sample was prepared in the same manner as in Comparative Example 1 except that an aluminum plate was used.

Example 3: Modification of PMMA with 2,5-diaminopyridine

A solution having a concentration of 1 mg/l mL was prepared by adding 2,5-diaminopyridine to a borate buffer (50 mM) having a pH of 9.0. A polymethyl methacrylate (PMMA) film was immersed in the solution and incubated at 90° C. for 24 hours. The film was taken out, placed in an oven at 60° C. for 3 hours, and then washed with an NaOH solution for 20 seconds. The film was then washed with a sufficient amount of water and dried at 60° C. for 5 minutes. Again, the film was washed with an HCl solution for 20 seconds, washed with a sufficient amount of water, and then dried at 60° C. for 5 minutes.

Comparative Example 3

A polymethyl methacrylate (PMMA) film having the same dimensions as that used in Example 1 was immersed in a borate buffer (50 mM) having a pH of 9.0 and incubated at 90° C. for 24 hours. The PMMA film was taken out, placed in an oven at 60° C. for 3 hours, and then washed with an NaOH solution for 20 seconds. The PMMA film was then washed with a sufficient amount of water and dried at 60° C. for 5 minutes. Again, the PMMA film was washed with an HCl solution for 20 seconds, washed with a sufficient amount of water, and then dried at 60° C. for 5 minutes.

Example 4: Modification of PC with 2,5-diaminopyridine

A surface-modified film was prepared in the same manner as in Example 3 except that a polycarbonate (PC) film was used.

Comparative Example 4

A sample was prepared in the same manner as in Comparative Example 3 except that a polycarbonate (PC) film was used.

Example 5: Modification of PI with 2,5-diaminopyridine

A surface-modified film was prepared in the same manner as in Example 3 except that a polyimide (PI) film was used.

Comparative Example 5

A sample was prepared in the same manner as in Comparative Example 3 except that a polyimide (PI) film was used.

Example 6: Modification of PMMA with 3,4-diaminopyridine

A solution having a concentration of 1 mg/mL was prepared by adding 3,4-diaminopyridine to a 0.1 M NaOH aqueous solution (25 mL). A 5×5 cm polymethyl methacrylate (PMMA) film was immersed in the solution and incubated at 80° C. for 22 hours. The film was taken out, washed with 15% isopropyl alcohol for 20 seconds, then washed with a sufficient amount of water, and dried at 60° C. for 5 minutes.

Comparative Example 6

The same 5×5 cm polymethyl methacrylate (PMMA) film as that used in Example 6 was immersed in a 0.1 M NaOH aqueous solution (25 mL) and incubated at 80° C. for 22 hours. The film was taken out, washed with a sufficient amount of water, and dried at 60° C. for 5 minutes.

Example 7: Modification of PMMA with 3,4-diaminopyridine

A solution having a concentration of 1 mg/mL was prepared by adding 3,4-diaminopyridine to a 0.1 M NaOH aqueous solution (25 mL). A 5×5 cm polymethyl methacrylate (PMMA) film was immersed in the solution and incubated at 90° C. for 22 hours. The film was taken out, washed with 15% isopropyl alcohol for 20 seconds, then washed with a sufficient amount of water, and dried at 60° C. for 5 minutes.

Comparative Example 7

The sample was the same as that in Comparative Example 6.

Example 8: Modification of PI with 3,4-diaminopyridine

A solution having a concentration of 1 mg/mL was prepared by adding 3,4-diaminopyridine to a borate buffer (500 mM) having a pH of 9.0. A polyimide (PI) film was immersed in the solution and incubated at 80° C. for 24 hours. The film was taken out, placed in an oven at 60° C. for 3 hours, and then washed with an NaOH solution for 20 seconds. The film was then washed with a sufficient amount of water and dried at 60° C. for 5 minutes. Again, the film was washed with an HCl solution for 20 seconds, washed with a sufficient amount of water, and then dried at 60° C. for 5 minutes.

Comparative Example 8

The same polyimide (PI) film as that used in Example 8 was not treated at all but was used as it was.

Example 9: Modification of PI with 2-amino-3-formylpyridine

A solution having a concentration of 1 mg/mL was prepared by adding 2-amino-3-formylpyridine to a borate buffer (500 mM) having a pH of 9.0. A polyimide (PI) film was immersed in the solution and incubated at 80° C. for 24 hours. The film was taken out, placed in an oven at 60° C. for 3 hours, and then washed with an NaOH solution for 20 seconds. The film was then washed with a sufficient amount of water and dried at 60° C. for 5 minutes. Again, the film was washed with an HCl solution for 20 seconds, washed with a sufficient amount of water, and then dried at 60° C. for 5 minutes.

Comparative Example 9

The sample was the same as that in Comparative Example 8.

Measurement of Contact Angle

In order to measure the contact angle, a goniometer (Model 300) manufactured by ramé-hart instrument co., New Jersey, USA was used. A droplet of 2 μL of the sample solution (15% aqueous solution of dimethylethanolamine) was placed on the sample surface on the sample stage of the goniometer using a microinjector. The contact angle was measured in a method in which a side picture, which showed the contact state between the droplet of the sample solution placed on the sample stage of the goniometer and the sample surface, was taken and the quantitative information of the contact angle was acquired using the DROPImage software of the goniometer.

Tables 2 to 9 show the results acquired by measuring the contact angle for the sample films of Examples 1 to 9 and the sample films of Comparative Examples 1 to 9 in the manner as above.

TABLE 2

Contact angle measurement results for sample of Example 1 and sample of Comparative Example 1

|   | Example 1 | Comparative Example 1 (glass plate) |
|---|---|---|
| 1 | 15.7° | 36.8° |
| 2 | 14.1° | 41.6° |
| 3 | 19.7° | 53.6° |
| Average | 16.5° | 44.0° |

TABLE 3

Contact angle measurement results for sample of Example 2 and sample of Comparative Example 2

|   | Example 2 | Comparative Example 2 (Al plate) |
|---|---|---|
| 1 | 129.0° | 108.3° |
| 2 | 44.5° | 111.4° |
| 3 | 38.8° | 112.3° |
| Average | 37.4° | 110.7° |

TALE 4

Contact angle measurement results for sample film of Example 3 and sample film of Comparative Example 3

|   | Example 3 | Comparative Example 3 (PMMA film) |
|---|---|---|
| 1 | 71.9° | 85.7° |
| 2 | 70.3° | 85.6° |
| 3 | 72.8° | 86.7° |
| Average | 71.7° | 86.0° |

TABLE 5

Contact angle measurement results for sample film of Example 4 and sample film of Comparative Example 4

|   | Example 4 | Comparative Example 4 (PC film) |
|---|---|---|
| 1 | 70.4° | 80.2° |
| 2 | 67.4° | 76.7° |
| 3 | 74.1° | 77.7° |
| Average | 70.6° | 78.2° |

TABLE 6

Contact angle measurement results for sample film of Example 5 and sample film of Comparative Example 5

|   | Example 5 | Comparative Example 5 (PI film) |
|---|---|---|
| 1 | 80.7° | 97.5° |
| 2 | 82.5° | 99.3° |
| 3 | 79.8° | 97.2° |
| Average | 81.1° | 98.0° |

TABLE 7

Contact angle measurement results for sample film of Example 6 and sample film of Comparative Example 6

|   | Example 6 | Comparative Example 6 (PMMA film) |
|---|---|---|
| 1 | 37.1° | 46.1° |
| 2 | 35.2° | 42.1° |
| 3 | 37.0° | 47.0° |
| Average | 36.4° | 45.1° |

TABLE 8

Contact angle measurement results for sample film of
Example 7 and sample film of Comparative Example 7

|  | Example 7 | Comparative Example 7 (PMMA film) |
| --- | --- | --- |
| 1 | 31.7° | 46.1° |
| 2 | 32.3° | 42.1° |
| 3 | 30.7° | 47.0° |
| Average | 31.6° | 45.1° |

TABLE 9

Contact angle measurement results for sample film of
Example 8 and sample film of Comparative Example 8

|  | Example 8 | Comparative Example 8 (PI film) |
| --- | --- | --- |
| 1 | 67.5° | 92.2° |
| 2 | 74.8° | 95.8° |
| 3 | 76.7° | 96.2° |
| Average | 73.0° | 94.7° |

TABLE 10

Contact angle measurement results for sample film of
Example 9 and sample film of Comparative Example 9

|  | Example 9 | Control (PI film) |
| --- | --- | --- |
| 1 | 69.3° | 92.2° |
| 2 | 71.5° | 95.8° |
| 3 | 73.3° | 96.2° |
| Average | 71.4° | 94.7° |

Example 10: Modification of PI with 4-vinylpyridine

A solution having a concentration of 1 mg/mL was prepared by adding 4-vinylpyridine to a borate buffer (500 mM) having a pH of 9.0. A polyimide (PI) film was immersed in the solution and incubated at 80° C. for 24 hours. The film was taken out, placed in an oven at 60° C. for 3 hours, and then washed with an NaOH solution for 20 seconds. The film was then washed with a sufficient amount of water and dried at 60° C. for 5 minutes. Again, the film was washed with an HCl solution for 20 seconds, washed with a sufficient amount of water, and then dried at 60° C. for 5 minutes.

Comparative Example 10

A polyimide (PI) film having the same dimensions as that used in Example 10 was not treated at all but was used as it was.

Table 1 shows the results acquired by measuring the contact angle for the sample film of Example 10 and the sample film of Comparative Example 10 in the manner as above.

TABLE 11

Contact angle measurement results for sample film of
Example 10 and sample film of Comparative Example 10

|  | Example 10 | Comparative Example 10 (PI film) |
| --- | --- | --- |
| 1 | 77.9° | 92.2° |
| 2 | 78.5° | 95.8° |
| 3 | 80.9° | 96.2° |
| Average | 79.1° | 94.7° |

Example 11: Coating of Glass Slide with 3-amino-2-cyclohexen-1-one

A solution having a concentration of 1 mg/mL was prepared by adding 3-amino-2-cyclohexen-1-one to a borate buffer (50 mM) having a pH of 9.0. A glass slide was immersed in the solution and incubated at 90° C. for 20 hours. The glass slide was taken out, placed in an oven at 60° C. for 3 hours, and then washed with an NaOH solution for 20 seconds. The glass slide was then washed with a sufficient amount of water and dried at 60° C. for 5 minutes. Again, the glass slide was washed with an HCl solution for 20 seconds, washed with a sufficient amount of water, and then dried at 60° C. for 5 minutes.

Comparative Example 11

A glass slide having the same dimensions as that used in Example 11 was immersed in a borate buffer (50 mM) having a pH of 9.0 and incubated at 90° C. for 20 hours. The glass slide was taken out, placed in an oven at 60° C. for 3 hours, and then washed with an NaOH solution for 20 seconds. The glass slide was then washed with a sufficient amount of water and dried at 60° C. for 5 minutes. Again, the glass slide was washed with an HCl solution for 20 seconds, washed with a sufficient amount of water, and then dried at 60° C. for 5 minutes.

Example 12: Coating of Aluminum Plate with 3-amino-2-cyclohexen-1-one

A coated sample was prepared in the same manner as in Example 11 except that an aluminum plate was used.

Comparative Example 12

A sample was prepared in the same manner as in Comparative Example 11 except that an aluminum plate was used.

Example 13: Coating of PI with 3-amino-2-cyclohexen-1-one

A solution having a concentration of 1 mg/mL was prepared by adding 3-amino-2-cyclohexen-1-one to a borate buffer (500 mM) having a pH of 9.0. A polyimide (PI) film was immersed in the solution and incubated at 80° C. for 24 hours. The film was taken out, placed in an oven at 60° C. for 3 hours, and then washed with an NaOH solution for 20 seconds. The film was then washed with a sufficient amount of water and dried at 60° C. for 5 minutes. Again, the film was washed with an HCl solution for 20 seconds, washed with a sufficient amount of water, and then dried at 60° C. for 5 minutes.

Comparative Example 13

A polyimide (PI) film having the same dimensions as that used in Example 13 was immersed in a borate buffer (500 mM) having a pH of 9.0 and incubated at 80° C. for 24 hours. The film was taken out, placed in an oven at 60° C. for 3 hours, and then washed with an NaOH solution for 20 seconds. The film was then washed with a sufficient amount of water and dried at 60° C. for 5 minutes. Again, the film was washed with an HCl solution for 20 seconds, washed with a sufficient amount of water, and then dried at 60° C. for 5 minutes.

Example 14: Coating of PET with 3-amino-2-cyclohexen-1-one

Two solutions having a concentration of 1 mg/mL were prepared by adding 3-amino-2-cyclohexen-1-one to a borate buffer having a pH of 9.0 and a concentration of 100 mM and a borate buffer having a pH of 9.0 and a concentration of 500 mM, respectively. A polyethylene terephthalate (PET) film was immersed in each of the solutions and incubated at 80° C. for 24 hours. The films were taken out, placed in an oven at 60° C. for 3 hours, and then washed with an NaOH solution for 20 seconds. The films were then washed with a sufficient amount of water and dried at 60° C. for 5 minutes. Again, the films were washed with an HCl solution for 20 seconds, washed with a sufficient amount of water, and then dried at 60° C. for 5 minutes. The sample obtained using a 100 mM borate buffer was referred to as Example 14-1, and the sample obtained using a 500 mM borate buffer was referred to as Example 14-2.

Comparative Example 14

A PET film having the same dimensions as that used in Example 14 was not treated at all but was used as it was.

Tables 12 to 15 show the results acquired by measuring the contact angle for the sample films of Examples 11 to 14 and the sample films of Comparative Examples 11 to 14 in the manner as above.

TABLE 12

Contact angle measurement results for sample of Example 11 and sample of Comparative Example 11

|   | Example 11 | Comparative Example 11 (glass plate) |
|---|---|---|
| 1 | 18.1° | 36.8° |
| 2 | 20.9° | 41.6° |
| 3 | 25.8° | 53.6° |
| Average | 21.6° | 44.0° |

TABLE 13

Contact angle measurement results for sample of Example 12 and sample of Comparative Example 12

|   | Example 12 | Comparative Example 12 (Al plate) |
|---|---|---|
| 1 | 36.9° | 108.3° |
| 2 | 49.4° | 111.4° |
| 3 | 48.3° | 112.3° |
| Average | 44.9° | 110.7° |

TABLE 14

Contact angle measurement results for sample film of Example 13 and sample film of Comparative Example 13

|   | Example 13 | Comparative Example 13 (PI film) |
|---|---|---|
| 1 | 62.2° | 92.2° |
| 2 | 62.3° | 95.8° |
| 3 | 69.5° | 96.2° |
| Average | 64.7° | 94.7° |

TABLE 15

Contact angle measurement results for sample film of Example 14-1 and 14-2 and sample film of Comparative Example 14

|   | Example 14-1 | Example 14-2 | Comparative Example 14 (PET film) |
|---|---|---|---|
| 1 | 89.8° | 87.1° | 94.4° |
| 2 | 88.4° | 85.5° | 96.7° |
| 3 | 87.4° | 84.2° | 96.7° |
| Average | 88.5° | 85.6° | 95.9° |

Example 15: Modification of Glass Slide with 1-ethenylcyclopentan-1-amine

A solution having a concentration of 1 mg/mL was prepared by adding 1-ethenylcyclopentan-1-amine to a borate buffer (50 mM) having a pH of 9.0. A glass slide was immersed in the solution and incubated at 90° C. for 20 hours. The glass slide was taken out, placed in an oven at 60° C. for 3 hours, and then washed with an NaOH solution for 20 seconds. The glass slide was then washed with a sufficient amount of water and dried at 60° C. for 5 minutes. Again, the glass slide was washed with an HCl solution for 20 seconds, washed with a sufficient amount of water, and then dried at 60° C. for 5 minutes.

Comparative Example 15

A glass slide having the same dimensions as that used in Example 15 was immersed in a borate buffer (50 mM) having a pH of 9.0 and incubated at 90° C. for 20 hours. The glass slide was taken out, placed in an oven at 60° C. for 3 hours, and then washed with an NaOH solution for 20 seconds. The glass slide was then washed with a sufficient amount of water and dried at 60° C. for 5 minutes. Again, the glass slide was washed with an HCl solution for 20 seconds, washed with a sufficient amount of water, and then dried at 60° C. for 5 minutes.

Example 16: Modification of Polyimide Film with 1-ethenylcyclopentan-1-amine A surface-modified film was prepared in the same manner as in Example 15 except that a polyimide (PI) film was used.

Comparative Example 16

A sample was prepared in the same manner as in Comparative Example 15 except that a polyimide (PI) film was used.

Tables 16 and 17 show the results acquired by measuring the contact angle for the sample films of Examples 15 and 16 and the sample films of Comparative Examples 15 and 16 in the manner as above.

TABLE 16

| | Example 15 | Comparative Example 15 (glass plate) |
|---|---|---|
| 1 | 59.6° | 47.8° |
| 2 | 74.6° | 37.2° |
| 3 | 71.0° | 40.7° |
| Average | 68.4° | 41.9° |

TABLE 17

| | Example 16 | Comparative Example 16 (PI film) |
|---|---|---|
| 1 | 55.8° | 62.0° |
| 2 | 63.8° | 62.4° |
| 3 | 70.0° | 63.8° |
| Average | 63.2° | 62.7° |

Example 17a: Modification of Glass Slide with Furfurylamine in Weak Basic Solution at Room Temperature A solution having a concentration of 1 mg/mL was prepared by adding furfurylamine to a borate buffer (50 mM) having a pH of 9.0. A glass slide was immersed in the solution at room temperature for 20 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 17b: Modification of Glass Slide with Copolymer of Furfurylamine and Methyl 3-aminocrotonate in Weak Basic Solution at Room Temperature Furfurylamine and methyl 3-aminocrotonate were added to a borate buffer (50 mM) having a pH of 9.0 to prepare a solution in which the concentrations of the two solutes were 1 mg/mL and 1.7 mg/mL, respectively. The subsequent process was performed in the same manner as in Example 1a to prepare a modified sample.

Comparative Example 17

A glass slide having the same dimensions as that used in Example 17 was immersed in a borate buffer (50 mM) having a pH of 9.0 at room temperature for 20 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 18a: Modification of Glass Slide with Furfurylamine in Strong Basic Solution at Room Temperature A solution having a concentration of 1 mg/mL was prepared by adding furfurylamine to an 8% aqueous solution of dimethylethanolamine having a pH of 13. A glass slide was immersed in the solution at room temperature for 12 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 18b: Modification of Glass Slide with Copolymer of Furfurylamine and Methyl 3-aminocrotonate in Strong Basic Solution at Room Temperature Furfurylamine and methyl 3-aminocrotonate were added to an 8% aqueous solution of dimethylethanolamine having a pH of 13 to prepare a solution in which the concentrations of the two solutes were 1 mg/mL and 1.7 mg/mL, respectively. The subsequent process was performed in the same manner as in Example 18a to prepare a modified sample.

Comparative Example 18

A glass slide having the same dimensions as that used in Example 18 was immersed in a borate buffer (50 mM) having a pH of 9.0 at room temperature for 12 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 19a: Modification of Polyimide Film with Furfurylamine in Weak Basic Solution at Room Temperature A surface-modified film was prepared in the same manner as in Example 17a except that a polyimide (PI) film was used.

Example 19b: Modification of Polyimide Film with Copolymer of Furfurylamine and Methyl 3-aminocrotonate in Weak Basic Solution at Room Temperature A surface-modified film was prepared in the same manner as in Example 17b except that a polyimide (PI) film was used.

Comparative Example 19

A sample was prepared in the same manner as in Comparative Example 17 except that a polyimide (PI) film was used.

Example 20: Modification of Polyimide Film with Furfurylamine in Weak Basic Solution at 50° C.

A solution having a concentration of 1 mg/mL was prepared by adding furfurylamine to a borate buffer (50 mM) having a pH of 9.0. A polyimide (PI) film was immersed in the solution and incubated at 50° C. for 3 hours. The PI film was taken out, placed in an oven at 70° C. for 3 hours, and then washed with an NaOH solution for 20 seconds. The PI film was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Comparative Example 20

A PI film having the same dimensions as that used in Example 20a was immersed in a borate buffer (50 mM) having a pH of 9.0 and incubated at 50° C. for 3 hours. The PI film was taken out, placed in an oven at 70° C. for 3 hours, and then washed with an NaOH solution for 20 seconds. The PI film was then washed with a sufficient amount of water and dried at 70° C. for 5 minutes. Again, the PI film was washed with an HCl solution for 20 seconds, washed with a sufficient amount of water, and then dried at 70° C. for 5 minutes.

Example 21: Modification of Polyimide Film with Furfurylamine in Weak Basic Solution at 70° C.

A solution having a concentration of 1 mg/1-mL was prepared by adding furfurylamine to a borate buffer (50 mM) having a pH of 9.0. A polyimide (PI) film was immersed in the solution and incubated at 70° C. for 20 hours. The subsequent process was performed in the same manner as in Example 20 to prepare a modified sample.

Comparative Example 21

A PI film having the same dimensions as that used in Example 21 was immersed in a borate buffer (50 mM) having a pH of 9.0 and incubated at 70° C. for 20 hours. The subsequent process was performed in the same manner as in Comparative Example 20 to prepare a modified sample.

Example 22a: Modification of Polyimide Film with Furfurylamine in Strong Basic Solution at Room Temperature A surface-modified film was prepared in the same manner as in Example 18a except that a polyimide (PI) film was used.

Example 22b: Modification of Polyimide Film with Copolymer of Furfurylamine and Methyl 3-aminocrotonate in Strong Basic Solution at Room Temperature A surface-modified film was prepared in the same manner as in Example 18b except that a polyimide (PI) film was used.

Comparative Example 22

A sample was prepared in the same manner as in Comparative Example 18 except that a polyimide (PI) film was used.

Example 23: Modification of Polyimide Film with Furfurylamine in Strong Basic Solution at 70° C.

A solution having a concentration of 1 mg/mL was prepared by adding furfurylamine to an 8% aqueous solution of dimethylethanolamine having a pH of 13. A polyimide (PI) film was immersed in the solution and incubated at 70° C. for 20 hours. The PI film was taken out, placed in an oven at 70° C. for 3 hours, and then washed with an NaOH solution for 20 seconds. The PI film was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Comparative Example 23

A PI film having the same dimensions as that used in Example 7 was immersed in an 8% aqueous solution of dimethylethanolamine having a pH of 13 and incubated at 70° C. for 20 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 24a: Modification of Polyethylene Film with Furfurylamine in Weak Basic Solution at Room Temperature A surface-modified film was prepared in the same manner as in Example 17a except that a polyethylene (PE) film for food packaging material (composite film in which a printing film and an aluminum film were sandwiched between polyethylene films of both surfaces) was used.

Example 24b: Modification of Polyethylene Film with Copolymer of Furfurylamine and Methyl 3-aminocrotonate in Weak Basic Solution at Room Temperature A surface-modified film was prepared in the same manner as in Example 17b except that a polyethylene (PE) film for food packaging material was used.

Comparative Example 24

A sample was prepared in the same manner as in Comparative Example 17 except that a polyethylene (PE) film for food packaging material was used.

Example 25a: Modification of Polyethylene Film with Furfurylamine in Strong Basic Solution at Room Temperature A surface-modified film was prepared in the same manner as in Example 18a except that a polyethylene (PE) film for food packaging material was used.

Example 25b: Modification of Polyethylene Film with Copolymer of Furfurylamine and Methyl 3-aminocrotonate in Strong Basic Solution at Room Temperature A surface-modified film was prepared in the same manner as in Example 18b except that a polyethylene (PE) film for food packaging material was used.

Comparative Example 25

A sample was prepared in the same manner as in Comparative Example 18 except that a polyethylene (PE) film for food packaging material was used.

Tables 18 to 26 show the results acquired by measuring the contact angle for the sample films of Examples 17 to 25 and the sample films of Comparative Examples 17 to 25 in the manner as above. The "drip solution" means a sample solution used in the contact angle measurement.

TABLE 18

Contact angle measurement results for samples of Examples 17a and 17b and sample of Comparative Example 17

| | Drip solution: water | | |
|---|---|---|---|
| | Example 17a | Example 17b | Comparative Example 17 |
| 1 | 70.0° | 68.0° | 48.2° |
| 2 | 63.6° | 66.4° | 52.5° |
| 3 | 63.6° | 65.8° | 53.2° |
| 4 | 65.0° | 61.8° | 51.0° |
| 5 | 63.6° | 64.8° | 54.0° |
| Average | 65.2° | 65.4° | 51.8° |

TABLE 19

Contact angle measurement results for samples of Examples 18a and 18b and sample of Comparative Example 18

| | Drip solution: water | | |
|---|---|---|---|
| | Example 18a | Example 18b | Comparative Example 18 |
| 1 | 29.6° | 47.2° | 32.9° |
| 2 | 23.0° | 35.0° | 35.6° |
| 3 | 22.4° | 43.2° | 27.9° |
| 4 | 32.2° | 41.9° | 30.6° |
| 5 | 36.2° | 50.6° | 28.2° |
| Average | 28.7° | 43.6° | 31.0° |

TABLE 20

Contact angle measurement results for samples of Examples 19a and 19b and sample of Comparative Example 19

| | Drip solution: water | | |
|---|---|---|---|
| | Example 19a | Example 19b | Comparative Example 19 |
| 1 | 72.0° | — | 73.0° |
| 2 | 85.6° | 75.4° | 70.6° |
| 3 | 82.8° | 76.4° | 65.4° |
| 4 | 71.6° | 75.6° | 73.0° |
| 5 | 63.8° | 70.8° | 67.6° |
| Average | 75.2° | 74.6° | 69.9° |

TABLE 21

Contact angle measurement results for sample of Example 20 and sample of Comparative Example 20

| | Drip solution: water | | Drip solution: 15% DMEA aqueous solution | |
|---|---|---|---|---|
| | Example 20 | Comparative Example 20 | Example 20 | Comparative Example 20 |
| 1 | 84.6° | 82.3° | 62.3° | 44.2° |
| 2 | 88.4° | 73.6° | 46.0° | 55.0° |
| 3 | 82.0° | 77.9° | 50.3° | 47.5° |
| Average | 85.0° | 77.9° | 52.9° | 48.9° |

TABLE 22

Contact angle measurement results for sample of Example 21 and sample of Comparative Example 21

| | Drip solution: water | | Drip solution: 15% DMEA aqueous solution | |
|---|---|---|---|---|
| | Example 21 | Comparative Example 21 | Example 21 | Comparative Example 21 |
| 1 | 85.7° | 62.4° | 45.0° | 45.0° |
| 2 | 68.6° | 78.6° | 51.2° | 45.2° |
| 3 | 75.6° | 75.4° | 45.8° | 46.9° |
| 4 | 75.4° | 67.8° | 53.4° | 51.1° |
| 5 | 75.4° | 67.6° | 48.4° | 40.5° |
| Average | 76.1° | 70.4° | 48.8° | 45.7° |

TABLE 23

Contact angle measurement results for samples of Examples 22a and 22b and sample of Comparative Example 22

| | Drip solution: water | | | Drip solution: 15% DMEA aqueous solution | | |
|---|---|---|---|---|---|---|
| | Example 22a | Example 22b | Comparative Example 22 | Example 22a | Example 22b | Comparative Example 22 |
| 1 | 55.8° | 68.8° | <10° | 34.9° | 32.0° | — |
| 2 | 53.6° | 72.4° | <10° | 34.4° | 37.4° | 21.8° |
| 3 | 47.9° | 70.8° | <15° | 45.0° | 22.0° | 25.8° |
| 4 | 49.7° | 56.8° | — | 37.2° | — | 28.3° |
| 5 | 42.6° | — | — | 42.4° | — | 33.0° |
| Average | 49.9° | 67.2° | <15° | 38.8° | 67.2° | 27.2° |

TABLE 24

Contact angle measurement results for sample of
Example 23 and sample of Comparative Example 23

|   | Drip solution: water | | Drip solution: 15% DMEA aqueous solution | |
|---|---|---|---|---|
|   | Example 23 | Comparative Example 23 | Example 23 | Comparative Example 23 |
| 1 | 53.6° | 45.0° | 21.7° | <15° |
| 2 | 45.4° | 48.0° | 15.4° | <15° |
| 3 | 45.6° | 50.1° | 21.8° | <15° |
| 4 | 44.3° | 30.2° | 21.2° | <15° |
| 5 | 38.1° | 25.8° | — | <15° |
| Average | 45.4° | 39.8° | 48.8° | <15° |

TABLE 25

Contact angle measurement results for samples of Examples
24a and 24b and sample of Comparative Example 24

|   | Drip solution: water | | | Drip solution: 15% DMEA aqueous solution | | |
|---|---|---|---|---|---|---|
|   | Example 24a | Example 24b | Comparative Example 24 | Example 24a | Example 24b | Comparative Example 24 |
| 1 | 96.9° | 102.5° | 95.8° | 93.8° | 85.5° | 85.9° |
| 2 | 102.6° | 97.2° | 91.2° | 77.2° | 92.6° | 77.2° |
| 3 | 101.5° | 104.0° | 87.9° | 90.8° | 93.2° | 64.6° |
| 4 | 97.2° | 104.5° | 93.4° | 80.8° | 92.5° | 90.1° |
| 5 | 99.2° | 91.7° | 90.6° | 90.4° | 82.6° | 86.6° |
| Average | 99.5° | 100.0° | 91.8° | 86.6° | 89.3° | 80.1° |

TABLE 26

Contact angle measurement results for samples of Examples
25a and 25b and sample of Comparative Example 25

|   | Drip solution: 15% DMEA aqueous solution | | |
|---|---|---|---|
|   | Example 25a | Example 25b | Comparative Example 25 |
| 1 | 78.6° | 82.9° | 74.7° |
| 2 | — | 86.3° | 76.3° |
| 3 | 93.3° | 95.1° | 74.1° |
| 4 | 87.9° | 87.3° | 86.3° |
| 5 | 86.0° | 85.9° | 76.0° |
| Average | 85.2° | 87.5° | 77.5° |

From the results, it has been confirmed that a hydrophobic coating is provided in both a case in which furfurylamine is used singly in the surface modification of various substrates and a case in which furfurylamine is used together with methyl 3-aminocrotonate in the surface modification of various substrates. It has been confirmed that the properties of the modified surface may vary depending on the specific substrate and surface modification conditions, and a more hydrophobic coating tends to be obtained when two compounds of furfurylamine and methyl 3-aminocrotonate are used together. Those skilled in the art will be able to optimize suitable compounds and surface modification conditions to obtain a substrate surface having desired properties from the experimental results.

Example 26: Modification of Glass Slide with Methyl 3-aminocrotonate in Weak Basic Solution at Room Temperature A solution having a concentration of 1 mg/mL was prepared by adding methyl 3-aminocrotonate to a borate buffer (50 mM) having a pH of 9.0. A glass slide was immersed in the solution at room temperature for 20 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Comparative Example 26

A glass slide having the same dimensions as that used in Example 26 was immersed in a borate buffer (50 mM) having a pH of 9.0 at room temperature for 20 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 27: Modification of Glass Slide with Methyl 3-aminocrotonate in Strong Basic Solution at Room Temperature A solution having a concentration of 1 mg/mL was prepared by adding methyl 3-aminocrotonate to an 8% aqueous solution of dimethylethanolamine having a pH of 13. A glass slide was immersed in the solution at room temperature for 12 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Comparative Example 27

A glass slide having the same dimensions as that used in Example 28 was immersed in a borate buffer (50 mM) having a pH of 9.0 at room temperature for 12 hours. The glass slide was taken out, placed in an oven at 70° C. for 3 hours, and then washed with an NaOH solution for 20 seconds. The glass slide was then washed with a sufficient amount of water and dried at 70° C. for 5 minutes. Again, the glass slide was washed with an HCl solution for 20 seconds, washed with a sufficient amount of water, and then dried at 70° C. for 5 minutes.

Example 28: Modification of Polyimide Film with Methyl 3-aminocrotonate in Weak Basic Solution at Room Temperature A surface-modified film was prepared in the same manner as in Example 27 except that a polyimide (PI) film was used.

Comparative Example 28

A sample was prepared in the same manner as in Comparative Example 27 except that a polyimide (PI) film was used.

Example 29: Modification of Polyimide Film with Methyl 3-aminocrotonate in Strong Basic Solution at Room Temperature A surface-modified film was prepared in the same manner as in Example 28 except that a polyimide (PI) film was used.

Comparative Example 29

A sample was prepared in the same manner as in Comparative Example 28 except that a polyimide (PI) film was used.

Example 30: Modification of Polyethylene Film with Methyl 3-aminocrotonate in Weak Basic Solution at Room Temperature A surface-modified film was prepared in the same manner as in Example 27 except that a polyethylene (PE) film for food packaging material (composite film in which a printing film and an aluminum film were sandwiched between polyethylene films of both surfaces) was used.

Comparative Example 30

A sample was prepared in the same manner as in Comparative Example 27 except that a polyethylene (PE) film for food packaging material was used.

Example 31: Modification of Polyethylene Film with Methyl 3-aminocrotonate in Strong Basic Solution at Room Temperature A surface-modified film was prepared in the same manner as in Example 28 except that a polyethylene (PE) film for food packaging material was used.

Comparative Example 31

A sample was prepared in the same manner as in Comparative Example 28 except that a polyethylene (PE) film for food packaging material was used.

TABLE 27

Contact angle measurement results for sample of Example 26 and sample of Comparative Example 26

| | Example 26 | Comparative Example 26 |
|---|---|---|
| 1 | 60.2° | 48.2° |
| 2 | 56.6° | 52.5° |
| 3 | 58.4° | 53.2° |
| 4 | 61.4° | 51.0° |
| 5 | 52.6° | 54.0° |
| Average | 57.8° | 51.8° |

TABLE 28

Contact angle measurement results for sample of Example 27 and sample of Comparative Example 27

Drip solution: water

| | Example 27 | Comparative Example 27 |
|---|---|---|
| 1 | 56.2° | 32.9° |
| 2 | 33.2° | 35.6° |
| 3 | 28.4° | 27.9° |
| 4 | 33.6° | 30.6° |
| 5 | 45.2° | 28.2° |
| Average | 39.3° | 31.0° |

TABLE 29

Contact angle measurement results for sample of Example 28 and sample of Comparative Example 28

Drip solution: water

| | Example 28 | Comparative Example 28 |
|---|---|---|
| 1 | 66.2° | 73.0° |
| 2 | 69.8° | 70.6° |
| 3 | 65.8° | 65.4° |
| 4 | 67.5° | 73.0° |
| 5 | 80.4° | 67.6° |
| Average | 69.9° | 69.9° |

TABLE 30

Contact angle measurement results for sample of Example 29 and sample of Comparative Example 29

| | Drip solution: water | | Drip solution: 15% DMEA aqueous solution | |
|---|---|---|---|---|
| | Example 29 | Comparative Example 29 | Example 29 | Comparative Example 29 |
| 1 | 78.0° | <10° | 31.9° | — |
| 2 | 68.8° | <10° | 30.0° | 21.8° |
| 3 | 66.6° | <15° | 23.9° | 25.8° |
| 4 | 61.2° | — | 36.6° | 28.3° |
| 5 | 69.0° | — | 37.3° | 33.0° |
| Average | 68.7° | <15° | 31.9° | 27.2° |

TABLE 31

Contact angle measurement results for sample of Example 30 and sample of Comparative Example 30

| | Drip solution: water | | Drip solution: 15% DMEA aqueous solution | |
|---|---|---|---|---|
| | Example 30 | Comparative Example 30 | Example 30 | Comparative Example 30 |
| 1 | 104.2° | 95.8° | 97.0° | 85.9° |
| 2 | 106.6° | 91.2° | 88.5° | 77.2° |

TABLE 31-continued

Contact angle measurement results for sample of
Example 30 and sample of Comparative Example 30

| | Drip solution: water | | Drip solution: 15% DMEA aqueous solution | |
|---|---|---|---|---|
| | Example 30 | Comparative Example 30 | Example 30 | Comparative Example 30 |
| 3 | 96.9° | 87.9° | 93.0° | 64.6° |
| 4 | 109.2° | 93.4° | 97.4° | 90.1° |
| 5 | 107.4° | 90.6° | 83.1° | 86.6° |
| Average | 104.9° | 91.8° | 91.8° | 80.1° |

TABLE 32

Contact angle measurement results for sample of
Example 31 and sample of Comparative Example 31

| | Drip solution: 15% DMEA aqueous solution | |
|---|---|---|
| | Example 31 | Comparative Example 31 |
| 1 | 91.2° | 74.7° |
| 2 | 94.0° | 76.3° |
| 3 | 81.0° | 74.1° |
| 4 | 78.6° | 86.3° |
| 5 | 73.3° | 76.0° |
| Average | 83.6° | 77.5° |

From the results, it has been confirmed that a hydrophobic coating is provided when an unsaturated acyclic amine compound is used in the surface modification of various substrates. It has been confirmed that the properties of the modified surface may vary depending on the specific substrate and surface modification conditions, and it is also possible to adjust the properties of the modified surface by appropriately selecting the unsaturated acyclic amine compound used in the surface modification. Those skilled in the art will be able to optimize suitable compounds and surface modification conditions to obtain a substrate surface having desired properties from the experimental results.

EXPERIMENTAL EXAMPLES—PREPARATION OF MONOMER SOLUTION

Experiment 32

A monomer solution having a concentration of 1 mg/l mL is prepared by adding Compound No. 1 in Table 1 to a borate buffer (50 mM) having a pH of 9.0.

Experiments 33 to 256

Monomer solutions are prepared in the same manner as in Experiment 32 except that Compound Nos. 2 to 225 in Table 1 are respectively added instead of Compound No. 1.

Experiment 257

A monomer solution having a concentration of 0.5 mg/l mL is prepared by adding Compound No. 1 in Table 1 to a borate buffer (50 mM) having a pH of 9.0.

Experiments 258 to 481

Monomer solutions are prepared in the same manner as in Experiment 257 except that Compound Nos. 2 to 225 in Table 1 are respectively added instead of Compound No. 1.

Experiment 482

A monomer solution having a concentration of 5 mg/l mL is prepared by adding Compound No. 1 in Table 1 to a borate buffer (50 mM) having a pH of 9.0.

Experiments 483 to 706

Monomer solutions are prepared in the same manner as in Experiment 482 except that Compound Nos. 2 to 225 in Table 1 are respectively added instead of Compound No. 1.

Experiment 707

A monomer solution having a concentration of 1 mg/l mL is prepared by adding Compound No. 1 in Table 1 to an 8% aqueous solution of dimethylethanolamine having a pH of 13.

Experiments 708 to 931

Monomer solutions are prepared in the same manner as in Experiment 707 except that Compound Nos. 2 to 225 in Table 1 are respectively added instead of Compound No. 1.

Experiment 932

A monomer solution having a concentration of 1 mg/l mL is prepared by adding Compound No. 1 in Table 1 to a 0.1 M NaOH aqueous solution.

Experiments 933 to 1156

Monomer solutions are prepared in the same manner as in Experiment 932 except that Compound Nos. 2 to 225 in Table 1 are respectively added instead of Compound No. 1.

EXPERIMENTAL EXAMPLES—FORMATION OF POLYMER LAYER

Experiment 1157

An aluminum thin film is immersed in the monomer solutions prepared in Experiments 32 to 1156. After being held in the immersed state at 60° C. for 12 hours, the aluminum thin film is taken out of the monomer solution and put into an oven at 90° C. The aluminum thin film is held in the oven at 90° C. for 3 hours, then taken out, washed, and dried. It is examined whether a polymer layer is formed on the surface of the dried aluminum thin film.

Experiment 1158

An aluminum thin film is immersed in the monomer solutions prepared in Experiments 32 to 1156. After being held in the immersed state at 60° C. for 24 hours, the aluminum thin film is taken out of the monomer solution and put into an oven at 90° C. The aluminum thin film is held in the oven at 90° C. for 3 hours, then taken out, washed, and dried. It is examined whether a polymer layer is formed on the surface of the dried aluminum thin film.

Experiment 1159

An aluminum thin film is immersed in the monomer solutions prepared in Experiments 32 to 1156. After being held in the immersed state at 60° C. for 48 hours, the aluminum thin film is taken out of the monomer solution and put into an oven at 90° C. The aluminum thin film is held in the oven at 90° C. for 3 hours, then taken out, washed, and dried. It is examined whether a polymer layer is formed on the surface of the dried aluminum thin film.

Experiment 1160

An aluminum thin film is immersed in the monomer solutions prepared in Experiments 32 to 1156. After being held in the immersed state at 90° C. for 12 hours, the aluminum thin film is taken out of the monomer solution and put into an oven at 90° C. The aluminum thin film is held in the oven at 90° C. for 3 hours, then taken out, washed, and dried. It is examined whether a polymer layer is formed on the surface of the dried aluminum thin film.

Experiment 1161

An aluminum thin film is immersed in the monomer solutions prepared in Experiments 32 to 1156. After being held in the immersed state at 90° C. for 24 hours, the aluminum thin film is taken out of the monomer solution and put into an oven at 90° C. The aluminum thin film is held in the oven at 90° C. for 3 hours, then taken out, washed, and dried. It is examined whether a polymer layer is formed on the surface of the dried aluminum thin film.

Experiment 1162

An aluminum thin film is immersed in the monomer solutions prepared in Experiments 32 to 1156. After being held in the immersed state at 90° C. for 48 hours, the aluminum thin film is taken out of the monomer solution and put into an oven at 90° C. The aluminum thin film is held in the oven at 90° C. for 3 hours, then taken out, washed, and dried. It is examined whether a polymer layer is formed on the surface of the dried aluminum thin film.

Experiment 1163

An aluminum thin film is immersed in the monomer solutions prepared in Experiments 32 to 1156. After being held in the immersed state at 60° C. for 24 hours, the aluminum thin film is taken out of the monomer solution and put into an oven at 90° C. The aluminum thin film is held in the oven at 90° C. for 6 hours, then taken out, washed, and dried. It is examined whether a polymer layer is formed on the surface of the dried aluminum thin film.

Experiment 1164

An aluminum thin film is immersed in the monomer solutions prepared in Experiments 32 to 1156. After being held in the immersed state at 60° C. for 24 hours, the aluminum thin film is taken out of the monomer solution and put into an oven at 120° C. The aluminum thin film is held in the oven at 120° C. for 3 hours, then taken out, washed, and dried. It is examined whether a polymer layer is formed on the surface of the dried aluminum thin film.

Experiment 1165

An aluminum thin film is immersed in the monomer solutions prepared in Experiments 32 to 1156. After being held in the immersed state at 60° C. for 24 hours, the aluminum thin film is taken out of the monomer solution and put into an oven at 120° C. The aluminum thin film is held in the oven at 120° C. for 6 hours, then taken out, washed, and dried. It is examined whether a polymer layer is formed on the surface of the dried aluminum thin film.

Experiments 1166 to 1174

Experiments are carried out in the same manner as in Experiments 1157 to 1165 except that a polyethylene (PE) film is used instead of an aluminum thin film, and it is examined whether a polymer layer is formed on the surface of the dried PE film.

Experiments 1175 to 1183

Experiments are carried out in the same manner as in Experiments 1157 to 1165 except that a polypropylene (PP) film is used instead of an aluminum thin film, and it is examined whether a polymer layer is formed on the surface of the dried PP film.

Experiments 1184 to 1192

Experiments are carried out in the same manner as in Experiments 1157 to 1165 except that a polyimide (PI) film is used instead of an aluminum thin film, and it is examined whether a polymer layer is formed on the surface of the dried PI film.

Experiments 1193 to 1201

Experiments are carried out in the same manner as in Experiments 1157 to 1165 except that a PET non-woven fabric is used instead of an aluminum thin film, and it is examined whether a polymer layer is formed on the surface of the dried PET non-woven fabric.

EXPERIMENTAL EXAMPLES—WATER VAPOR TRANSMISSION RATE OF ALUMINUM FOIL

Experiment 1202

The water vapor transmission rate of an aluminum foil sample having a thickness of 63 µm and an area of 10 cm×10 cm is measured. It is confirmed that the value of water vapor transmission rate is $1\times10^{-2}$ to $1\times10^{-1}$ g/m$^2$/day.

Experiment 1203

A polymer layer is formed on an aluminum foil having the same dimensions as that in Experiment 1202 in the same manner as in Experiments 632 to 639, and then the water vapor transmission rate is measured. It is confirmed that the water vapor transmission rate is $1\times10^{-4}$ to $1\times10^{-3}$ g/m$^2$/day.

EXPERIMENTAL EXAMPLES—OLED PANEL ENCAPSULATION APPARATUS

Experiment 672

An aluminum foil laminate is prepared by pasting an aluminum foil and a polyethylene terephthalate (PET) film, which have a thickness of about 63 µm, together with an adhesive and pressing the pasted body. The defects of the aluminum foil in the prepared aluminum foil laminate are examined, and the water vapor transmission rate is measured.

Experiments 673 to 680

Experiments are carried out in the same manner as in Experiments 632 to 639 except that the aluminum foil laminate of Experiment 672 is used instead of an aluminum thin film, and it is examined whether a polymer layer is formed on the surface of the aluminum foil. It is examined that the defects of the aluminum foil confirmed in Experiment 672 are filled with the polymer layer, and the water vapor transmission rate is measured.

EXPERIMENTAL EXAMPLES—FOOD PACKAGING MATERIAL

Experiment 681

A polypropylene (PP) film having a thickness of about 50 μm is put into a vapor deposition chamber, and aluminum is deposited on the film by a vapor deposition technology to prepare a vapor-deposited aluminum-polypropylene laminate. The defects of the aluminum layer in the vapor-deposited aluminum-polypropylene laminate thus prepared are examined, and the water vapor transmission rate is measured.

Experiments 682 to 689

Experiments are carried out in the same manner as in Experiments 632 to 639 except that the vapor-deposited aluminum-polypropylene laminate of Experiment 681 is used instead of an aluminum thin film, and it is examined whether a polymer layer is formed on the surface of the aluminum layer. It is examined that the defects of the aluminum layer confirmed in Experiment 632 are filled with the polymer layer, and the water vapor transmission rate is measured.

EXPERIMENTAL EXAMPLES—COATED SEPARATOR

Experiment 690

A porous polypropylene (PP) separator having a thickness of about 30 μm is prepared, and the ionic conductivity thereof is examined.

Experiment 691

Experiments are carried out in the same manner as in Experiments 632 to 639 except that the porous polypropylene (PP) separator of Experiment 690 is used instead of an aluminum thin film, and it is examined whether a polymer layer is formed on the surface of the porous polypropylene (PP) separator. The ionic conductivity of the coated separator on which a polymer layer is formed is examined.

What is claimed is:
1. A method of making a laminate device, the method comprising:
providing an intermediate device comprising a plastic film and a metallic material layer, wherein the plastic film comprising a first plastic surface and a second plastic surface, wherein the metallic material layer is formed over the first plastic surface of the plastic film, wherein the metallic material layer comprises a first surface facing the plastic film and a second surface facing away from the plastic film; and
forming a polymer layer on the second surface of the metallic material layer to provide the laminate device in which the metallic material layer is interposed between the plastic film and the polymer layer,
wherein the polymer layer comprises polymer molecules chemically bonding to the second surface of the metallic material layer as a result of polymerization reactions of at least one monomer on the second surface rather than as a result of coating of a pre-polymerized polymer on the second surface,
wherein the polymerization reactions on the second surface do not involve a binder such that the polymer layer formed from the polymerization reactions does not comprise a binder,
wherein the at least one monomer is selected from the group consisting of compounds represented by any one of Chemical Formulae 1, 2, 3, 4, 5, 6, 7, 8, 9, 10 and 11 and Compound Nos. 204-248:

| Compound No. | Compound |
|---|---|
| 204 | 1,3-diaminobenzene |
| 205 | 1,4-diaminobenzene |
| 206 | 4-(prop-2-en-1-yl)-4H-1,2,4-triazol-3-amine |
| 207 | 5-amino-3-chloro-4-(prop-2-en-1-yl)-4H-1,2,4-triazole |
| 208 | 5-amino-3-hydroxy-4-(prop-2-en-1-yl)-4H-1,2,4-triazole |
| 209 | 5-amino-4-(prop-2-en-1-yl)-4H-1,2,4-triazole-3-carbonitrile |
| 210 | 5-amino-4-(prop-2-en-1-yl)-4H-1,2,4-triazole-3-thiol |
| 211 | 4-(prop-2-en-1-yl)-4H-1,2,4-triazol-3,5-diamine |
| 212 | 5-amino-4-(prop-2-en-1-yl)-4H-1,2,4-triazole-3-carbaldehyde |
| 213 | 5-amino-4-(prop-2-en-1-yl)-4H-1,2,4-triazole-3-carboxylic acid |
| 214 | 3-amido-5-amino-4-(prop-2-en-1-yl)-4H-1,2,4-triazole |
| 215 | 5-amino-3-methoxo-4-(prop-2-en-1-yl)-4H-1,2,4-triazole |
| 216 | 5-amino-3-methoxy-4-(prop-2-en-1-yl)-4H-1,2,4-triazole |
| 217 | 5-amino-3-nitro-4-(prop-2-en-1-yl)-4H-1,2,4-triazole |
| 218 | 7-iodopyrazolo[1,5-a]pyrazin-4-amine |
| 219 | 3-(3-iodo-1-methyl-1 H-pyrazol-5-yl)pyrazin-2-amine |
| 220 | 5-(4-iodo-1H-pyrazol-1-yl)-1,3-thiazol-2-amine |
| 221 | 4-iodo-5-(pyridazin-3-yl)-1,2-oxazol-3-amine |
| 222 | 7-iodo-[1,2]oxazolo[4,5-b]pyridin-3-amine |
| 223 | 5-(5-iodo-l1-methyl-1H-pyrazol-4-yl)-1,2-oxazol-3-amine |
| 224 | 9-aminospiro[4.5]dec-8-en-7-one |
| 225 | 2H,3H,4H,5H,6H,7H-furo[2,3-b]pyridin-3-one |
| 226 | 5-(aminomethyl)-3-chlorofuran |
| 227 | 5-(aminomethyl)-3-hydroxofuran |
| 228 | 5-(aminomethyl)-3-cyanofuran |
| 229 | 5-(aminomethyl)-3-sulfhydrofuran |
| 230 | 5-(aminomethyl)-3-aminofuran |
| 231 | 5-(aminomethyl)-3-formylfuran |
| 232 | 5-(aminomethyl)-3-carboxofuran |
| 233 | 5-(aminomethyl)-3-amidofuran |
| 234 | 5-(aminomethyl)-3-methoxofuran |
| 235 | 5-(aminomethyl)-3-methoxyfuran |
| 236 | 5-(aminomethyl)-3-nitrofuran |
| 237 | 1-[4-(prop-2-en-1-yl)furan-2-yl]methanamine |
| 238 | 1-[3-chloro-4-(prop-2-en-1-yl)furan-2-yl]methanamine |
| 239 | 1-[3-hydroxo-4-(prop-2-en-1-yl)furan-2-yl]methanamine |
| 240 | 1-[3-cyano-4-(prop-2-en-1-yl)furan-2-yl]methanamine |
| 241 | 1-[3-sulfhydro-4-(prop-2-en-1-yl)furan-2-yl]methanamine |
| 242 | 1-[3-amino-4-(prop-2-en-1-yl)furan-2-yl]methanamine |
| 243 | 1-[3-formyl-4-(prop-2-en-1-yl)furan-2-yl]methanamine |
| 244 | 1-[3-carboxo-4-(prop-2-en-1-yl)furan-2-yl]methanamine |
| 245 | 1-[3-amido-4-(prop-2-en-1-yl)furan-2-yl]methanamine |
| 246 | 1-[3-methoxo-4-(prop-2-en-1-yl)furan-2-yl]methanamine |
| 247 | 1-[3-methoxy-4-(prop-2-en-1-yl)furan-2-yl]methanamine |
| 248 | 1-[3-nitro-4-(prop-2-en-1-yl)furan-2-yl]methanamine |

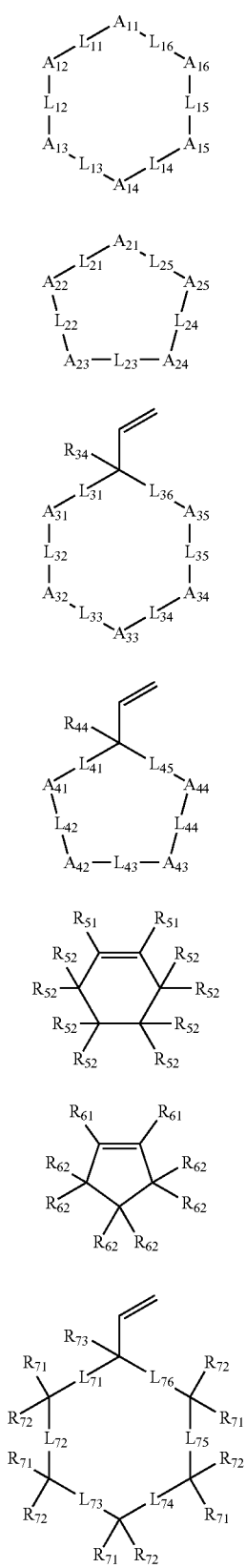

Chemical Formula 1

Chemical Formula 2

Chemical Formula 3

Chemical Formula 4

Chemical Formula 5

Chemical Formula 6

Chemical Formula 7

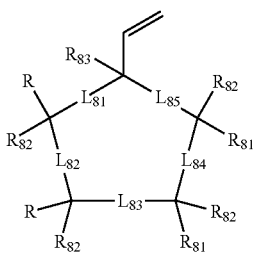

Chemical Formula 8

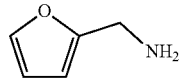

Chemical Formula 9

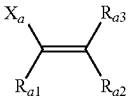

Chemical Formula 10

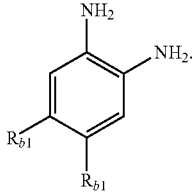

Chemical Formula 11

| | |
|---|---|
| Chemical Formula 1 | each of $L_{11}$ to $L_{16}$ is independently either a single bond or a double bond, at least one of $L_{11}$ to $L_{16}$ is a double bond, each of $A_{11}$ to $A_{16}$ is independently selected from the group consisting of —C($R_{11}R_{12}$)—, —N($R_{13}$)—, —O— and —S—, at least of one of $A_1$ to $A_6$ is selected from the group consisting of —N($R_{13}$)—, —O— and —S—, at least of one of $A_{11}$ to $A_{16}$ is C($R_{11}R_{12}$), each of $R_{11}$ and $R_{12}$ is independently selected from the group consisting of H, $NH_2$, =NH, $C_1$-$C_6$ alkyl, $C_1$-$C_6$ alkoxy, halo-, CN, carboxyl, formyl, OH and SH, or forms a carbonyl or thiocarbonyl group with an adjacent carbon, $R_{13}$ is H or $NH_2$, with the proviso that (a) any of $L_{11}$-$L_{16}$ adjacent a double bond are single bonds, and any of $A_{11}$-$A_{16}$ connected by a double bond are not —O— or —S—, (b) if any one of $A_{11}$-$A_{16}$ connected by a double bond is —C($R_{11}R_{12}$)— or —N($R_{13}$), $R_{12}$ and $R_{13}$ are omitted, (c) at least one of $R_{11}$, $R_{12}$ and $R_{13}$ is $NH_2$, |
| Chemical Formula 2 | each of $L_{21}$ to $L_{25}$ is independently either a single bond or a double bond, at least one of $L_{21}$ to $L_{25}$ is a double bond, each of $A_{21}$ to $A_{25}$ is independently selected from the group consisting of —C($R_{21}R_{22}$)—, —N($R_{23}$)—, —O— and —S—, at least of one of $A_{21}$ to $A_{25}$ is selected from the group consisting of —N($R_{23}$)—, —O— and —S—, at least of one of $A_{21}$ to $A_{25}$ is C($R_{21}R_{22}$), each of $R_{21}$ and $R_{22}$ is independently selected from the group consisting of H, $NH_2$, =NH, $C_1$-$C_6$ alkyl, $C_1$-$C_6$ alkoxy, halo-, CN, carboxyl, formyl, OH and SH, or forms a carbonyl or thiocarbonyl group with an adjacent carbon, $R_{23}$ is H or $NH_2$, with the proviso that (a) any of $L_{21}$-$L_{25}$ adjacent a double bond are single bonds, and any of $A_{21}$-$A_{25}$ connected by a double bond are not —O— or —S—, (b) if any one of $A_{21}$-$A_{25}$ connected by a double bond is —C($R_{21}R_{22}$)— or —N($R_{23}$), $R_{22}$ and $R_{23}$ are omitted, (c) at least one of $R_{21}$, $R_{22}$ and $R_{23}$ is $NH_2$ |
| Chemical Formula 3 | each of $L_{31}$ to $L_{36}$ is independently either a single bond or a double bond, each of $A_{31}$ to $A_{35}$ is selected from the group consisting of —C($R_{31}R_{32}$)—, —N($R_{33}$)—, —O— and —S—, |

-continued

| | |
|---|---|
| Chemical Formula 4 | at least one of $A_{31}$ to $A_{35}$ is selected from the group consisting of —N($R_{33}$)—, —O— and —S—, at least of one of $A_{31}$ to $A_{35}$ is C($R_{31}R_{32}$), each of $R_{31}$ and $R_{32}$ is independently selected from the group consisting of H, $NH_2$, =NH, $C_1$-$C_6$ alkyl, $C_1$-$C_6$ alkoxy, halo-, CN, carboxyl, formyl, OH and SH, or forms a carbonyl or thiocarbonyl group with an adjacent carbon, $R_{33}$ is H or $NH_2$, $R_{34}$ is H, with the proviso that (a) any of $L_{31}$ to $L_{36}$ adjacent a double bond are single bonds, and any of $A_{31}$ to $A_{35}$ connected by a double bond are not —O— or —S—, (b) if any one of $A_{31}$ to $A_{35}$ connected by a double bond is —C($R_{31}R_{32}$)— or —N($R_{33}$)—, $R_{32}$ and $R_{33}$ are omitted, (c) if $L_{31}$ or $L_{36}$ is a double bond, $R_{34}$ is omitted, each of $L_{41}$ to $L_{45}$ is independently either a single bond or a double bond, each of $A_{41}$ to $A_{44}$ is selected from the group consisting of —C($R_{41}R_{42}$)—, —N($R_{43}$)—, —O— and —S—, at least one of $A_{41}$ to $A_{44}$ is selected from the group consisting of —N($R_{43}$)—, —O— and —S—, at least of one of $A_{41}$ to $A_{44}$ is C($R_{41}R_{42}$), each of $R_{41}$ and $R_{42}$ is independently selected from the group consisting of H, $NH_2$, =NH, $C_1$-$C_6$ alkyl, $C_1$-$C_6$ alkoxy, halo-, CN, carboxyl, formyl, OH and SH, or forms a carbonyl or thiocarbonyl group with an adjacent carbon, $R_{43}$ is H or $NH_2$, $R_{44}$ is H, with the proviso that (a) any of $L_{41}$ to $L_{45}$ adjacent a double bond are single bonds, and any of $A_{41}$ to $A_{44}$ connected by a double bond are not —O— or —S—, (b) if any one of $A_{41}$ to $A_{44}$ connected by a double bond is —C($R_{41}R_{42}$)— or —N($R_{43}$)—, $R_{42}$ and $R_{43}$ are omitted, (c) if $L_{41}$ or $L_{45}$ is a double bond, $R_{44}$ is omitted |
| Chemical Formula 5 | each $R_{51}$ is independently selected from the group consisting of H, —$NH_2$, halo, $C_1$-$C_6$ alkyl, C1-C6 alkoxy, CN, carboxyl, formyl, OH and SH, each $R_{52}$ is independently selected from the group consisting of H, —$NH_2$, halo, $C_1$-$C_6$ alkyl, $C_1$-$C_6$ alkoxy, CN, carboxyl, formyl, OH, SH and =NH or forms a carbonyl or thiocarbonyl group with an adjacent carbon to which it is connected, with the proviso that (a) at least one of $R_{51}$ and $R_{52}$ is $NH_2$, (b) if $R_{52}$ is —$NH_2$, halo, $C_1$-$C_6$ alkyl, $C_1$-$C_6$ alkoxy, CN, carboxyl, formyl, OH or SH, the other $R_{52}$ connected to the same carbon is H, (c) if $R_{52}$ is =NH or forms a carbonyl or thiocarbonyl group with an adjacent carbon, the other $R_{52}$ connected to the same carbon is omitted, |
| Chemical Formula 6 | each $R_{61}$ is independently selected from the group consisting of H, —$NH_2$, halo, $C_1$-$C_6$ alkyl, C1-C6 alkoxy, CN, carboxyl, formyl, OH and SH, each $R_{62}$ is independently selected from the group consisting of H, —$NH_2$, halo, $C_1$-$C_6$ alkyl, $C_1$-$C_6$ alkoxy, CN, carboxyl, formyl, OH, SH and =NH or forms a carbonyl or thiocarbonyl group with an adjacent carbon, with the proviso that (a) at least one of $R_{61}$ and $R_{62}$ is $NH_2$, (b) if $R_{62}$ is —$NH_2$, halo, $C_1$-$C_6$ alkyl, $C_1$-$C_6$ alkoxy, CN, carboxyl, formyl, OH or SH, the other $R_{62}$ connected to the same carbon is H, (c) if $R_{62}$ is =NH or forms a carbonyl or thiocarbonyl group with an adjacent carbon, the other $R_{62}$ connected to the same carbon is omitted, |
| Chemical Formula 7 | each of $L_{71}$ to $L_{76}$ is independently a single or double bond, $L_{71}$ to $L_{76}$ have total 0-2 double bonds, each $R_{71}$ and $R_{72}$ is selected from the group consisting of H, —$NH_2$, =NH, $C_1$-$C_6$ alkyl, $C_1$-$C_6$ alkoxy, halo, CN, carboxyl, formyl, OH and SH or forms a carbonyl or thiocarbonyl group with an adjacent carbon, $R_{73}$ is selected from the group consisting of H, —$NH_2$, $C_1$-$C_6$ alkyl, |
| | $C_1$-$C_6$ alkoxy, halo, CN, carboxyl, formyl, —OH and —SH, with the proviso that (a) any of $L_{71}$-$L_{76}$ adjacent a double bond are single bonds, (b) $R_{72}$ connected to a carbon that forms a double bond among $L_{71}$ to $L_{76}$ is omitted, (c) if $L_{71}$ or $L_{76}$ is a double bond, $R_{72}$ is omitted, (d) if either of $R_{71}$ and $R_{72}$ is =NH or forms a carbonyl or thiocarbonyl group with an adjacent carbon, then the other of $R_{71}$ and $R_{72}$ is omitted, (e) at least one of $R_{71}$ to $R_{73}$ is —$NH_2$ |
| Chemical Formula 8 | each of $L_{81}$ to $L_{85}$ is independently a single or double bond, $L_{81}$ to $L_{85}$ have total 0 or 1 double bond, each of $R_{81}$ and $R_{82}$ is independently selected from the group consisting of H, —$NH_2$, =NH, $C_1$-$C_6$ alkyl, $C_1$-$C_6$ alkoxy, halo, CN, carboxyl, formyl, OH and SH or forms a carbonyl or thiocarbonyl group with an adjacent carbon, $R_{83}$ is selected from the group consisting of H, —$NH_2$, $C_1$-$C_6$ alkyl, $C_1$-$C_6$ alkoxy, halo, CN, carboxyl, formyl, —OH and —SH, with the proviso that (a) any of $L_{81}$-$L_{85}$ adjacent a double bond are single bonds, (b) $R_{82}$ connected to a carbon that forms a double bond among $L_{81}$ to $L_{85}$ is omitted, (c) if $L_{81}$ or $L_{85}$ is a double bond, $R_{83}$ is omitted, (d) if either of $R_{81}$ and $R_{82}$ is =NH or forms a carbonyl or thiocarbonyl group with an adjacent carbon, then the other of $R_{81}$ and $R_{82}$ is omitted, (e) at least one of R81 to R83 is —NH2, |
| Chemical Formula 10 | $X_a$ is —$NH_2$, —N=CH—OH, or —N=O, $R_{a1}$ is hydrogen, $C_1$-$C_6$ lkyl, or —CN, $R_{a2}$ and $R_{a3}$ is independently selected from the group consisting of hydrogen, $C_1$-$C_6$ alkyl, —CN, —OH, —$NH_2$, —NH—OH, —C(O)$R_{a4}$, and —C(O)O$R_{a5}$ ($R_{a4}$ and $R_{a5}$ is hydrogen or $C_1$-$C_6$ alkyl), |
| Chemical Formula 11 | $R_{b1}$ is selected from the group consisting of H, $NH_2$, and NH— acyl. |

2. The method of claim 1, wherein forming the polymer layer comprises contacting the second surface of the metallic material layer with a polymerization composition comprising the at least one monomer, which causes the polymerization reactions, wherein the metallic material layer comprises a metal foil having a thickness in a range between about 1 μm and about 200 μm, wherein the intermediate device further comprises an adhesive layer between the metallic material layer and the plastic film.

3. The method of claim 1, wherein providing the intermediate device comprises:
   providing the plastic film and the metallic material layer; and
   laminating the plastic film and the metallic material layer with an adhesive material applied between the plastic film and the metallic material layer to provide an adhesive layer interposed between the plastic film and the metallic material layer.

4. The method of claim 1, wherein the metallic material layer comprises a deposit of a metallic material formed on the plastic film and has a thickness in a range between about 1 nm and about 50 nm, wherein no distinct layer is interposed between the metallic material layer and the plastic film.

5. The method of claim 1, wherein providing the intermediate device comprises:
   providing the plastic film; and
   conducting a vapor deposition of a metallic material to form the metallic material layer on the plastic film.

6. The method of claim 5, wherein providing the intermediate device further comprises subjecting a surface of the plastic film to a plasma treatment before conducting the vapor deposition, wherein the vapor deposition of the metallic material is performed on the surface of the plastic film.

7. The method of claim 1, wherein forming the polymer layer comprises contacting the second surface of the metallic material layer with a polymerization composition comprising the at least one monomer, which causes the polymerization reactions, wherein the metallic material layer comprises one or more selected from the group consisting of holes, pores, and defects therein, wherein at least part of the polymer molecules covers or enters the one or more selected from the group consisting of holes, pores, and defects.

8. The method of claim 1, wherein the polymer layer, as a result of polymerization reactions on the metallic material layer, comprises at least one selected from the group consisting of oligomers, tetramers, trimers, and dimers derived from the at least one monomer in a substantial amount that a commercially available composition of a pre-polymerized polymer having a specific range of polymer molecular weights would not contain.

9. The method of claim 1, wherein the polymer layer, as a result of polymerization reactions on the metallic material layer, comprises at least one selected from the group consisting of oligomers, tetramers, trimers, and dimers chemically bonded to the second surface of the metallic material layer that would not occur when coating a pre-polymerized polymer composition on the metallic material layer.

10. The method of claim 1, wherein the metallic material layer comprises a pinhole extending through a thickness of the metallic material layer, wherein at least one of an oligomer and a polymer occupies at least part of a space of the pinhole and is chemically bonded to an interior surface of the pinhole that would not occur when coating a pre-polymerized polymer composition on the metallic material layer.

11. The method of claim 1, wherein the polymer layer, not as a result of coating of a pre-polymerized polymer composition on the metallic material layer, does not comprise a polymerization inhibitor that a commercially available composition of a pre-polymerized polymer having a specific range of molecular weights would contain to inhibit additional polymerization reactions or cross-linking reactions in the polymer composition.

12. The method of claim 1, wherein the polymer layer does not comprise a surfactant that would be included in the polymer layer, if the polymer layer is formed by coating of a pre-polymerized polymer, for evenly coating a pre-polymerized polymer on the metallic material layer.

13. The method of claim 1, wherein the polymer layer is referred to as a first polymer layer, wherein the method further comprises:
    forming a second polymer layer on the second plastic surface such that the plastic film is interposed between the second polymer layer and the metallic material layer,
    wherein the second polymer layer comprises polymers derived from the at least one monomer as a result of polymerization reactions on the second plastic surface rather than a result of coating a pre-polymerized polymer composition on the second plastic surface, wherein the second polymer layer does not comprise a binder for attaching the second polymer layer to the second plastic surface.

14. The method of claim 13, wherein each of the first and second polymer layers has a thickness in a range between about 1 μm and about 20 μm.

15. The method of claim 13, wherein the second polymer layer, as a result of polymerization reactions on the second plastic surface, comprises at least one selected from the group consisting of oligomers, tetramers, trimers, and dimers derived from the at least one monomer in a substantial amount that a commercially available composition of a pre-polymerized polymer having a specific range of polymer molecular weights would not contain.

16. The method of claim 13, wherein the second polymer layer, as a result of polymerization reactions on the second plastic surface, comprises at least one selected from the group consisting of oligomers, tetramers, trimers, and dimers chemically bonded to the second plastic surface that a commercially available composition of a pre-polymerized polymer having a specific range of polymer molecular weights would not contain.

17. The method of claim 13, wherein the plastic film comprises an engineering polymer layer with pores, wherein at least one of an oligomer and a polymer stays in at least one of the pores and is chemically bonded to an interior surface of at least one pore that would not occur when coating a pre-polymerized polymer composition on the plastic film.

18. The method of claim 13, wherein the metallic material layer comprises a metal oxide.

19. The method of claim 13, wherein the second polymer layer, not as a result of coating of a pre-polymerized polymer composition on the plastic film, does not comprise a polymerization inhibitor that a commercially available composition of a pre-polymerized polymer having a specific range of molecular weights would contain to inhibit additional polymerization reactions or cross-linking reactions in the polymer composition.

20. The method of claim 1, wherein forming the polymer layer comprises contacting the second surface of the metallic material layer with a polymerization reaction composition that comprises the at least one monomer but does not comprise any of a surfactant, a polymerization initiator and a polymerization inhibitor such that the polymer layer does not comprise a surfactant, a polymerization initiator or a polymerization inhibitor.

* * * * *